United States Patent
Knoppert et al.

(10) Patent No.: US 11,347,322 B2
(45) Date of Patent: May 31, 2022

(54) SYSTEM FOR MODIFIED KEY ACTIONS AND HAPTIC FEEDBACK FOR SMART TYPING ASSIST WITH A SOLID-STATE KEYBOARD AND TOUCHPAD

(71) Applicant: Dell Products, LP, Round Rock, TX (US)

(72) Inventors: Michiel Knoppert, Amsterdam (NL); Priyank Gajiwala, Austin, TX (US); Frank van Valkenhoef, Hertogenbosch (NL)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 17/361,132

(22) Filed: Jun. 28, 2021

(65) Prior Publication Data

US 2021/0325973 A1     Oct. 21, 2021

Related U.S. Application Data

(63) Continuation of application No. 16/779,568, filed on Jan. 31, 2020, now Pat. No. 11,093,048.

(51) Int. Cl.
*G09G 5/00* (2006.01)
*G06F 3/02* (2006.01)
(Continued)

(52) U.S. Cl.
CPC ............ *G06F 3/0202* (2013.01); *G06F 3/016* (2013.01); *G06F 3/023* (2013.01);
(Continued)

(58) Field of Classification Search
CPC .......... G06F 3/0202; G06F 3/02; G06F 3/033; H01H 13/06; H01H 13/703; H01H 13/86;
(Continued)

(56) References Cited

U.S. PATENT DOCUMENTS 4,618,797 A   10/1986  Cline
4,857,887 A    8/1989  Iten
(Continued)

FOREIGN PATENT DOCUMENTS

JP     2014164610 A    9/2014
KR     100442116 B1    7/2004
(Continued)

OTHER PUBLICATIONS

Rekimoto, J., et al., "PreSensell: Bi-directional Touch and Pressure Sensing Interactions with Tactile Feedback," Apr. 2006, 6 pages.
(Continued)

*Primary Examiner* — Pegeman Karimi
(74) *Attorney, Agent, or Firm* — Prol Intellectual Property Law, PLLC; H. Kenneth Prol

(57) ABSTRACT

A haptic keyboard of an information handling system comprising a coversheet to identify keys of the haptic keyboard, a contact foil and a piezoelectric element to receive an applied mechanical stress at a first key of the coversheet and generate an electric actuation signal. A processor executing instructions of a haptic smart typing assistance system to detect and anticipate a next letter of a word being typed and a controller to receive an instruction of the anticipated next letter and increasing force required actuate at least one key for a letter adjacent to the anticipated next letter, and to send a response haptic feedback control signal to the piezoelectric element to cause the piezoelectric element to generate a first haptic feedback at the first key if the anticipated next letter is selected and to generate a second haptic feedback if a typographical error is detected.

20 Claims, 15 Drawing Sheets

(51) Int. Cl.
*G06F 3/01* (2006.01)
*G06F 3/023* (2006.01)
*H01H 13/7065* (2006.01)
*H01H 13/85* (2006.01)
*H03K 17/967* (2006.01)
*H01H 13/83* (2006.01)

(52) U.S. Cl.
CPC ........ *H01H 13/7065* (2013.01); *H01H 13/83* (2013.01); *H01H 13/85* (2013.01); *H03K 17/967* (2013.01); *H01H 2215/052* (2013.01); *H01H 2219/028* (2013.01)

(58) Field of Classification Search
CPC ....... H01H 13/88; H03K 17/94; H03M 11/00; G09G 5/00; G09G 5/08
See application file for complete search history.

(56) References Cited

U.S. PATENT DOCUMENTS

| | | | |
|---|---|---|---|
| 5,463,388 A | 10/1995 | Boie | |
| 5,825,352 A | 10/1998 | Bisset | |
| 5,861,583 A | 1/1999 | Schediwy | |
| 5,887,995 A | 3/1999 | Holehan | |
| 6,147,680 A | 11/2000 | Tareev | |
| 6,188,391 B1 | 2/2001 | Seely | |
| 6,239,790 B1 | 5/2001 | Martinelli | |
| 6,532,824 B1 | 3/2003 | Ueno | |
| 6,574,095 B2 | 6/2003 | Suzuki | |
| 6,680,731 B2 | 1/2004 | Gerpheide | |
| 6,703,550 B2 | 3/2004 | Chu | |
| 6,822,635 B2 | 11/2004 | Shahoian | |
| 6,882,337 B2 | 4/2005 | Shetter | |
| 7,336,260 B2* | 2/2008 | Martin | G09B 21/003 345/169 |
| 7,439,962 B2 | 10/2008 | Reynolds | |
| 7,486,279 B2 | 2/2009 | Wong | |
| 7,523,410 B2 | 4/2009 | Rekimoto | |
| 7,535,454 B2 | 5/2009 | Jasso | |
| 7,741,979 B2 | 6/2010 | Schlosser | |
| 7,808,488 B2 | 10/2010 | Martin | |
| 8,144,453 B2 | 3/2012 | Brown | |
| 8,159,461 B2 | 4/2012 | Martin | |
| 8,164,573 B2 | 4/2012 | DaCosta | |
| 8,199,033 B2 | 6/2012 | Peterson | |
| 8,248,277 B2 | 8/2012 | Peterson | |
| 8,248,278 B2 | 8/2012 | Schlosser | |
| 8,279,052 B2 | 10/2012 | Heubel | |
| 8,294,600 B2 | 10/2012 | Peterson | |
| 8,294,677 B2 | 10/2012 | Wu | |
| 8,373,663 B2* | 2/2013 | Skillman | H04M 1/23 345/169 |
| 8,373,664 B2 | 2/2013 | Wright | |
| 8,477,113 B2 | 7/2013 | Wu | |
| 8,508,487 B2 | 8/2013 | Schwesig | |
| 8,542,134 B2 | 9/2013 | Peterson | |
| 8,581,710 B2 | 11/2013 | Heubel | |
| 8,633,916 B2 | 1/2014 | Bernstein | |
| 8,674,941 B2 | 3/2014 | Casparian | |
| 8,749,507 B2 | 6/2014 | DaCosta | |
| 8,773,356 B2 | 7/2014 | Martin | |
| 8,797,295 B2 | 8/2014 | Bernstein | |
| 8,842,091 B2 | 9/2014 | Simmons | |
| 9,178,509 B2 | 11/2015 | Bernstein | |
| 9,274,660 B2 | 3/2016 | Bernstein | |
| 9,280,248 B2 | 3/2016 | Bernstein | |
| 9,318,006 B2 | 4/2016 | Heubel | |
| 9,336,969 B2 | 5/2016 | Takashima | |
| 9,400,582 B2 | 7/2016 | Bernstein | |
| 9,477,342 B2 | 10/2016 | Daverman | |
| 9,535,557 B2 | 1/2017 | Bernstein | |
| 9,829,982 B2 | 11/2017 | Bernstein | |
| 10,089,840 B2 | 10/2018 | Moussette | |
| 10,120,450 B2 | 11/2018 | Bernstein | |
| 10,860,112 B1 | 12/2020 | Knoppert | |
| 2006/0109255 A1 | 5/2006 | Chen | |
| 2007/0063987 A1 | 3/2007 | Sato | |
| 2007/0273671 A1 | 11/2007 | Zadesky | |
| 2008/0098456 A1 | 4/2008 | Alward | |
| 2008/0202824 A1 | 8/2008 | Philipp | |
| 2008/0259046 A1 | 10/2008 | Carsanaro | |
| 2009/0002178 A1 | 1/2009 | Guday | |
| 2009/0243817 A1 | 10/2009 | Son | |
| 2009/0315854 A1 | 12/2009 | Matsuo | |
| 2010/0089735 A1 | 4/2010 | Takeda | |
| 2010/0102830 A1 | 4/2010 | Curtis | |
| 2010/0110018 A1 | 5/2010 | Faubert | |
| 2010/0128002 A1 | 5/2010 | Stacy | |
| 2012/0062491 A1 | 3/2012 | Coni | |
| 2012/0092263 A1 | 4/2012 | Peterson | |
| 2013/0187585 A1 | 7/2013 | Neimann | |
| 2013/0187858 A1* | 7/2013 | Griffin | G06F 3/04886 345/168 |
| 2013/0249802 A1 | 9/2013 | Yasutake | |
| 2015/0185842 A1 | 7/2015 | Picciotto | |
| 2017/0168711 A1* | 6/2017 | Temple | G06F 3/0233 |
| 2017/0269688 A1 | 9/2017 | Chan | |
| 2017/0344170 A1* | 11/2017 | Billerbeck | G06F 3/04886 |
| 2018/0074694 A1 | 3/2018 | Lehmann | |
| 2019/0073036 A1 | 3/2019 | Bernstein | |
| 2019/0102082 A1* | 4/2019 | Kuoch | G06F 3/0482 |

FOREIGN PATENT DOCUMENTS

| | | |
|---|---|---|
| KR | 20040081697 A | 9/2004 |
| WO | 2004/042685 A2 | 5/2004 |
| WO | 2004/042693 A1 | 5/2004 |
| WO | 2005/057546 A1 | 6/2005 |
| WO | 2011/056752 A1 | 5/2011 |
| WO | 2011/071837 A2 | 6/2011 |

OTHER PUBLICATIONS

Rekimoto, J. et al., "PreSense: Interaction Techniques for Finger Sensing Input Devices," UIST '03 Vancouver, BC, Canada, Nov. 2003, pp. 203-212, ACM 1-58113-636-6/03/0010.

Holleis, P. et al., "Studying Applications for Touch-Enabled Mobile Phone Keypads," Proceedings of the Second International Conference on Tangible and Embedded Interaction (TEI'08), Feb. 18-20, 2008, Bonn, Germany, pp. 15-18.

Westerman, W. et al., "Multi-Touch: A New Tactile 2-D Gesture Interface for Human-Computer Interaction," Proceedings of the Human Factors and Ergonomics Society 45th Annual Meeting, Oct. 2001, pp. 632-636.

* cited by examiner

SYSTEM FOR MODIFIED KEY ACTIONS AND HAPTIC FEEDBACK FOR SMART TYPING ASSIST WITH A SOLID-STATE KEYBOARD AND TOUCHPAD

This application is a continuation of prior application Ser. No. 16/779,568 entitled "SYSTEM FOR MODIFIED KEY ACTIONS AND HAPTIC FEEDBACK FOR SMART TYPING ASSIST WITH A SOLID-STATE KEYBOARD AND TOUCHPAD," filed on Jan. 31, 2020, which is assigned to the current assignee hereof and is incorporated herein by reference in its entirety.

FIELD OF THE DISCLOSURE

The present disclosure generally relates to a key switch assembly of, for example, an information handling system. The present disclosure more specifically relates to the use of piezoelectric sensor and haptic generator elements in a keyboard and touchpad of an information handling system with modified key actions.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include a keyboard or other input or output devices such as cursor control devices for manual input of information by the user.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

DETAILED DESCRIPTION OF THE DRAWINGS

Figure 1:
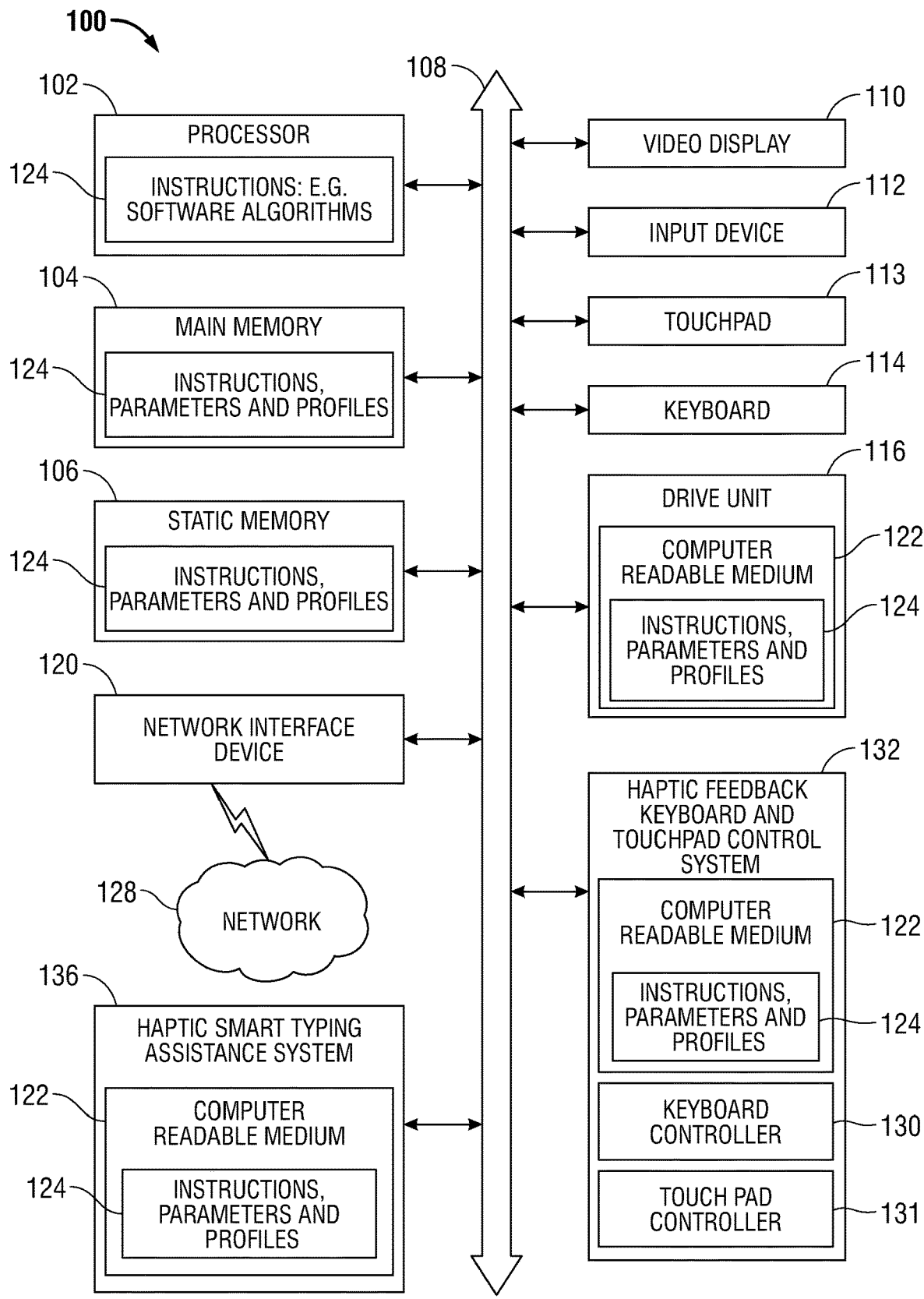
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Embodiments of the present disclosure provide for a keyboard of an information handling system. The keyboard may include, in an embodiment, a coversheet to identify an actuation location of an input actuation device. The actuation location may designate one or more extended action keys in the haptic keyboard of embodiments of the present disclosure. In an embodiment a support layer may be placed underneath the coversheet to support the coversheet and other layers within the keyboard. The keyboard may, in an embodiment, include a contact foil placed between the coversheet and support layer. In the embodiments presented herein, the keyboard may include a piezoelectric element placed between the contact foil and support layer to receive an applied mechanical stress at the actuation location of the input actuation device. The keyboard of the information handling system, in an embodiment, may include a controller of the information handling system operatively coupled to the contact foil to receive an electric charge at a plurality of levels of charge as one or more actuation signals indicating actuation of one or more key locations from the piezoelectric element placed under the mechanical stress. The mechanical stress may be applied to an extended action key at a plurality of levels of downward force to select from a plurality of alphanumeric characters or functions associated with that extended action key in some embodiments. The controller may send one or more electrical haptic feedback control signals in response to the piezoelectric element. The one or more electrical haptic feedback control signals each provide varying in polarity, voltage or current to cause the piezoelectric element to provide haptic feedback at the actuation location (e.g., the extended action key). The one or more electrical haptic feedback control signals may correspond to one or more types of haptic feedback at the actuation location of the extended action key according to some embodiments herein.

The keys on the haptic keyboard of embodiments of the disclosure herein may be utilized to type character strings into software applications or web-based applications. For example, the information handling system may operate a word processing software application, an email or other communication application, or other applications requiring textual input via a keyboard. In embodiments herein, a haptic feedback keyboard and touchpad control system may operate with a haptic smart typing assistance system according to embodiment herein to provide haptic feedback or extended action functionality via the keys of the haptic keyboard of embodiments herein. Typists all make mistakes when typing. Typing requires continuously shifting gaze between the keyboards and on-screen application to verify that no mistakes are being made while typing. Spelling errors and word suggestions are frequently presented visually via the display screen. Other than auto-correct, users are typically required to back space, utilize a mouse or touchpad, or delete characters to correct the mistakes. With the haptic keyboard of the present disclosure, a haptic smart typing assistance system may leverage the available multitude haptic feedback, multilevel actuation such as deep presses, and control over key actuation force requirements, keystrike locations, or other features to allow users to feel mistakes and correct them immediately rather than needed to look for visual cues. The haptic smart typing assistance system may assess the input typed character string and determine an anticipated word being typed or anticipated next word from the context of the typed character string, such as a phrase. Further, the haptic smart typing assistance system may determine from the anticipated word being typed, an anticipated next character may be predicted as well. With this typed text string analysis by the haptic smart typing assistance system, the haptic smart typing assistance system may modify operation of the haptic keyboard to provide correct key actuation haptic feedback versus error key actuation haptic feedback, or to adjust setting of nearby or adjacent keys to an anticipated next character key to make actuation of those key by mistake more difficult. In other embodiments, the haptic smart typing assistance system may detect typographical or grammatical errors in the typed text string to identify those errors and provide haptic feedback to indicate an error or a type of error. Additionally, the extended action keys may be used to correct errors, select suggested words or remaining characters of a word, or the like without requiring a user to use a mouse or touchpad and utilize the keys being used to type the character string. Other embodiments of the haptic smart typing assistance system are described further herein.

According to embodiments herein, a haptic touchpad embodiment may work similarly to a haptic keyboard with a coversheet under which a contact foil with an array of piezoelectric elements are electrically coupled may receive mechanical stress from downward pressure on the coversheet interface surface of the haptic touchpad. The haptic touchpad of present embodiments may further include a capacitive touch layer under the coversheet to detect X-Y locations of touch or gestures across the coversheet of the haptic touchpad in embodiments herein. Pressure down on the coversheet of the haptic touchpad may compress one or more piezoelectric elements in the array of touchpad piezoelectric elements to generate one or more electric charges which may provide one or more levels of electric charge actuation signals to a controller via the contact foil layer. As such, the haptic touchpad may detect plural levels of mechanical stress from levels of downward force applied to an extended action touchpad which may be used to select a function form a plurality of available functions or a continuous change to a function due to selection by actuation by the extended action touchpad.

Thus, each extended action key of the haptic keyboard of the embodiments herein may have multi-level function for plural actuation pressure levels applied to elicit plural electric charge actuation signal levels. These plural electric charge actuation signal levels may correspond to multiple alphanumeric characters or multiple functions of the extended action key associated with the change of actuation pressure level applied reaching plural thresholds. Similarly, the haptic extended action touchpad may have multi-level function for plural actuation pressure levels as well in embodiments herein. The available functions of the multi-level functionality of the haptic extended action touchpad may depend on the X-Y location of actuation on the haptic touchpad in some embodiments. In some example embodiments, the multi-level function capability of the extended action keys of haptic keyboards according to embodiments herein may add functionality for each key to replace shift or alt keys or may add to functionality available with shift and alt keys. The extended action keys of embodiments of disclosures herein may enable streamlining or optimization of keyboard layouts such as with fewer needed keys in a QWERTY-type keyboard for example. Further, the controller system may provide multiple types of haptic feedback to the piezoelectric elements associated with the extended action key or touchpad actuation location. The multiple types of haptic feedback events may correspond to the multiple levels of actuation pressure received and indicate which of the multi-level functions, such as multiple alphanumeric characters, has been selected by the user actuating the extended action key or extended action touchpad in some embodiments. In particular embodiments, the same piezoelectric element or elements actuated may provide multiple levels of actuation signal electric charge and also receive the haptic feedback control signal or signals returned to generate the one or more types of haptic feedback events. As the haptic feedback control signal is modified, so too is the haptic feedback event generated by the piezoelectric elements at the actuated extended action key or extended action touchpad location.

The use of piezoelectric elements within the keyboard may eliminate the use of other devices such as a scissor mechanism that are used to maintain a keycap of a key above an electrical connection or for a dive board type mechanism under a touchpad. Instead, the piezoelectric elements may reduce or eliminate those mechanical elements that may fail after a number of actuations while also reducing the thickness of the keyboard or the touchpad itself. Instead of the keys of the keyboard requiring travel of a scissor mechanism within a C-cover of the information handling system, the relatively thinner keys defined (either physically or visibly) on the solid state keyboard of the presently-described information handling system may reduce the physical thickness of the keyboard within the information handling system. Further, the solid state touchpad may eliminate the dive board mechanism and underlying click switch for selection of items via the mechanically actuated touchpad. This may enable a thinner, more streamlined information handling system. The overall thickness of the information handling system may be reduced to as to decrease the size and weight of the information handling system. In other embodiments, because the keyboard described herein has a reduced thickness, the space within the information handling system used to house other components, such as a battery, of the information handling system may be increased allowing for the increase in size of these components or the inclusion of additional components within the chassis of the information handling system. Additionally, because the solid state keyboard or touchpad described herein does not include the mechanical components (i.e., scissor mechanism and coupled key cap or dive board mechanism) as other keyboards or touchpads, the keyboard may be less susceptible to wear or mechanical strain over time. Instead, with the implementation of the piezoelectric elements, the solid state keyboard or touchpad of embodiments herein uses fewer mechanical parts and may be more robust resulting in longer usable life.

During operation of the solid state keyboard or touchpad of the information handling system described in embodiments herein, a key, such as an extended action key, on the keyboard or the extended action touchpad may be actuated by a user pressing down on a specific location. As described herein, multiple levels of downward pressure thresholds may be used to select among multilevel functions associated with the extended action key or extended action touchpad location. In an embodiment, this specific location may be visually indicated by a plurality of alphanumeric symbols or a function key symbol from which multiple functions may be selected via display of the selected function on the display screen. The visual indicators may be similar to those found on a QWERTY keyboard or may utilize a more optimized keyboard extended action key layout enabled by the multi-level functionality. Visual indicators may include painted or marked locations, a key pedestal or raised location, or another designation such as a tactile frame or depression in a cover sheet. In an embodiment, this specific location may be a position on a touchpad user interface surface and may also have an x-y location detected by a capacitive touchpad interface. The actuations of these specific locations by, for example, a user's finger causes a mechanical stress to be applied to the piezoelectric element resulting in the deformation of the piezoelectric element. Upon application of this mechanical stress and the deformation of the piezoelectric element, the piezoelectric element accumulates an electric charge that is passed to a controller of the information handling system via the contact foil described herein. The level of electric charge in the actuation signal to the controller may reach plural threshold levels which may indicate or cause selection among levels of function associated with the actuation location at the extended action key or extended action touchpad. In other embodiments, key pressure thresholds may indicate continuous multiple levels of function among the plural key thresholds such as selecting gaming acceleration in gaming applications for certain extended action keys of embodiments herein. Each threshold of deformation and resulting electrical charge actuation signal magnitude may correspond to an associated function such as designation of an actuating keystroke with multiple alphanumeric characters or function keys or another level of function within an application such as an increased movement or acceleration in gaming.

In an embodiment, the controller receives the electrical charge actuation signal and sends an electrical haptic feedback control signal back to the piezoelectric element. In further embodiments herein, depending on the selected function among the multilevel functions associated with the actuation location or the continuous level of function changed with increasingly applied pressure of an application function, a corresponding different haptic feedback control signal may be sent. Upon application of the haptic feedback control signal on the piezoelectric element by the controller, the piezoelectric element may be mechanically stretched or compressed so as to create a haptic feedback event by causing the piezoelectric element warping up or down and with varying magnitude, sharpness, or frequency and then returning to its pre-deformed state. This warping of the layers of the piezoelectric element causes the user to feel a haptic sensation at the actuated key or the specific location where the user pressed in order to actuate an extended action key or extended action touchpad. With differing haptic feedback control signals, different haptic sensations may be sent to the actuation location depending on the function selected by the pressure level from among the plurality of functions or continuous change to function level associated with the actuation location. This haptic feedback against the user's finger may cause a sensation of pressing a mechanical key thereby creating a feeling to a user that the extended action key was pressed or that the extended action touchpad has been clicked to select an item such as one displayed on a display screen. A second level of haptic feedback for a second level of selected function may vary this feeling that a key has been pressed by providing a burst of vibration, imitating a pause then deeper press feeling, a bump or click, or multiple clicks in various example embodiments. It is understood that some keys on the haptic keyboard of embodiments herein may be extended action keys while other keys may not have extended actions in some embodiments. Further, some portions of the haptic touchpad of embodiments herein may be an extended action touchpad while other portions may not in embodiments herein. Further, one or both of the haptic keyboard or haptic touchpad may not be extended action devices in some embodiments herein.

Embodiments of the present disclosure employ piezoelectric elements in order to provide haptic feedback at a thin keyboard or touchpad. In the present specification and in the appended claims, the term "actuate" or "actuation" is meant to understood as an action that causes an operation. In the context of the present disclosure, this includes the action by a user such as pressing against a location on a keyboard or touchpad. During actuation of a key or touchpad, a user may press against a visually labeled or tactilely identified key on a keyboard or an unlabeled or labeled location on a touchpad or touchpad area of a C-cover. This actuation, according to the present disclosure, causes a mechanical strain on a piezoelectric element and, consequently, cause a buildup of electric charge in the piezoelectric element. This electric charge is detectable by a controller via a conductive contact foil. The detected electrical charge may be interpreted by the controller as an indication that the key or location on the touchpad was actuated. Thus, in an embodiment, the actuation by a user results in the controller sending a haptic feedback control signal back to the piezoelectric element under the key or one or more of an array of piezoelectric elements under where the touchpad has been actuated. When the activating electrical haptic feedback control signal (with particular polarity, current, or voltage) is received at the piezoelectric element, the piezoelectric material in the piezoelectric element may stretch or compress to warp the piezoelectric element thereby creating the haptic feedback at that key or location on the touchpad described herein.

Turning now to the figures, FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a control system, a camera, a scanner, a printer, a pager, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 may be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system may include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system 100 may include one or more storage devices, one or more communications ports for communicating with external devices, as well as, various input and output (I/O) devices 112, such as a keyboard 114, a touchpad 113, a mouse, a video/graphic display 110, or any combination thereof. The information handling system 100 may also include one or more buses operable to transmit communications between the various hardware components. Portions of an information handling system 100 may themselves be considered information handling systems 100.

Information handling system 100 may include devices or modules that embody one or more of the devices or execute instructions for the one or more systems and modules described herein, and operates to perform one or more of the methods described herein. The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100.

The information handling system 100 may include a processor 102 such as a central processing unit (CPU), control logic or some combination of the same. Any of the processing resources may operate to execute code that is either firmware or software code. Moreover, the information handling system 100 may include memory such as main memory 104, static memory 106, or other memory of computer readable medium 122 storing instructions 124 of the haptic feedback keyboard and touchpad control system 132 and of the haptic smart typing assistance system 136, and drive unit 116 (volatile (e.g. random-access memory, etc.), nonvolatile memory (read-only memory, flash memory etc.) or any combination thereof.

It is to be appreciated that the haptic feedback keyboard and touchpad control system 132 may be either a haptic feedback keyboard control system 132 for only a haptic keyboard or a haptic feedback touchpad control system 132 for only a haptic touchpad 113 in various embodiment herein. In particular, the haptic feedback keyboard and touchpad control system 132 may be separate system for controlling just a haptic keyboard according to embodiments herein, or for controlling just a haptic touchpad 113 according to embodiments herein, or for controlling both. The haptic keyboard 114 and the haptic touchpad 113 may have separate controllers or processors or share a controller or a processor according to embodiments herein. It is understood that reference to the haptic feedback keyboard and touchpad control system 132 does not necessarily require one system control both the haptic keyboard and the haptic touchpad 113 in embodiments herein. Some portions of the haptic feedback keyboard and touchpad control system 132 may operate to enable the extended action haptic keys or extended action haptic touchpad 113 of the various embodiments described herein. The information handling system 100 may also include one or more buses 108 operable to transmit communications between the various hardware components such as any combination of various input and output (I/O) devices. For example, the haptic feedback keyboard and touchpad control system 132 may execute code instructions via one or more keyboard controllers, touchpad controller, other controllers, or the processor 102 to implement embodiments herein and further be operably coupled via bus 108 to the display screen of video display 110, the processor 102 executing drivers for various components, or portions of the haptic feedback keyboard and touchpad control system 132 that may operate on distinct controllers or processors in such embodiments.

It is further appreciated that the haptic smart typing assistance system 136 may be code instructions executable on a processor 102 and operate in connection with the haptic feedback keyboard and touchpad control system 132 to adjust key actuation pressure levels, to modify haptic feedback types generated at haptic keyboard keys, or to receive actuations including deep press actuations above one or more force threshold levels to implement smart typing assistance functions. It is understood that reference to the haptic smart typing assistance system 136 includes a system that works with any software application operating on the information handling system to receive typing inputs for display on a screen and for receiving data input. For example, the haptic smart typing assistance system 136 may work with a word processing program, an email program, a web interface for communication or website generation, a programming software, a text editor, a data field entry of software or website, or other software systems or web-based sites operational on the information handling system. Some portions of the haptic smart typing assistance system 136 work with the haptic feedback keyboard and touchpad control system 132 to enable the extended action haptic keys for some functions of the various embodiments described herein. The information handling system 100 may also include one or more buses 108 operable to transmit communications between the various hardware components such as any combination of various input and output (I/O) devices. For example, the haptic smart typing assistance system 136 may execute code instructions and communicate instructions, parameters, and profiles for execution at the haptic feedback keyboard and touchpad control system 132 at one or more keyboard controllers, touchpad controller, other controllers, or the processor 102 to implement embodiments herein. The haptic smart typing assistance system 136 may further be operably coupled via bus 108 to the display screen of video display 110, the processor 102 executing drivers for various components, or portions of the haptic feedback keyboard and touchpad control system 132 that may operate on distinct controllers or processors in various embodiments The information handling system 100 may include the video display 110. The video display 110 in an embodiment may function as a liquid crystal display (LCD), an organic light emitting diode (OLED), a flat panel display, or a solid-state display. Additionally, the information handling system 100 may include an input device 112, such as a cursor control device (e.g., mouse, touchpad 113, or gesture or touch screen input), and a keyboard 114. Various drivers and control electronics may be operatively coupled to operate input devices 112 such as the haptic keyboard 114 and haptic touchpad 113 according to the embodiments described herein.

The network interface device shown as wireless adapter 120 may provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. The wireless adapter 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some aspects of the present disclosure, one wireless adapter 120 may operate two or more wireless links.

Wireless adapter 120 may connect to any combination of macro-cellular wireless connections including 2G, 2.5G, 3G, 4G, 5G or the like from one or more service providers. Utilization of radiofrequency communication bands according to several example embodiments of the present disclosure may include bands used with the WLAN standards and WWAN standards, which may operate in both licensed and unlicensed spectrums. For example, both WLAN and WWAN may use the Unlicensed National Information Infrastructure (U-NII) band which typically operates in the ~5 MHz frequency band such as 802.11a/h/j/n/ac (e.g., center frequencies between 5.170-5.785 GHz).

In some embodiments, software, firmware, dedicated hardware implementations such as application specific integrated circuits, programmable logic arrays and other hardware devices may be constructed to implement one or more of some systems and methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations may include distributed processing, component/object distributed processing, and parallel processing. Alternatively, virtual computer system processing may be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal, so that a device connected to a network 128 may communicate voice, video or data over the network 128. Further, the instructions 124 may be transmitted or received over the network 128 via the network interface device or wireless adapter 120.

The information handling system 100 may include a set of instructions 124 that may be executed to cause the computer system to perform any one or more of the methods or computer-based functions disclosed herein. For example, instructions 124 may execute a haptic feedback keyboard and touchpad control system 132, a haptic smart typing assistance system 136, a software application receiving typing inputs, software agents, or other aspects or components. Various software modules comprising application instructions 124 may be coordinated by an operating system (OS), and/or via an application programming interface (API). An example operating system may include Windows®, Android®, and other OS types. Example APIs may include Win 32, Core Java API, or Android APIs.

The disk drive unit 116 and the haptic feedback keyboard and touchpad control system 132 and the haptic smart typing assistance system 136 may include a computer-readable medium 122 in which one or more sets of instructions 124 such as software may be embedded. Similarly, main memory 104 and static memory 106 may also contain a computer-readable medium for storage of one or more sets of instructions, parameters, or profiles 124 including haptic feedback modulation instructions that allow for a user to input a desired level of haptic feedback at a key or location on a touchpad 113. The disk drive unit 116 and static memory 106 may also contain space for data storage. Further, the instructions 124 may embody one or more of the methods or logic as described herein. For example, instructions relating to the haptic feedback keyboard and touchpad control system 132 software algorithms, processes, and/or methods may be stored here. In further examples, instructions relating to the haptic smart typing assistance system 136 software algorithms, processes, and/or methods may be stored here. In a particular embodiment, the instructions, parameters, and profiles 124 may reside completely, or at least partially, within the main memory 104, the static memory 106, and/or within the disk drive 116 during execution by the processor 102 of information handling system 100.

Main memory 104 may contain computer-readable medium, such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The haptic feedback keyboard and touchpad control system 132 or the haptic smart typing assistance system 136 may be stored in static memory 106, or the drive unit 116 on a computer-readable medium 122 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random-access memory or other volatile re-writable memory. Additionally, the computer-readable medium may include a magneto-optical or optical medium, such as a disk or tapes or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

The information handling system 100 may also include the haptic feedback keyboard and touchpad control system 132 and the haptic smart typing assistance system 136 that may be operably connected to the bus 108. The haptic feedback keyboard and touchpad control system 132 as well as the haptic smart typing assistance system 136 computer readable medium 122 may also contain space for data storage.

The haptic feedback keyboard and touchpad control system 132 may, according to the present description, perform tasks related to receiving an electric charge as an actuation signal from a piezoelectric element and return a haptic feedback control signal to that piezoelectric element causing a haptic feedback at a key or location on a touchpad 113 associated with that piezoelectric element. In these embodiments, the haptic feedback keyboard and touchpad control system 132 may receive the electric charge from any of a plurality of piezoelectric elements each associated with a key on keyboard (i.e., a QWERTY keyboard), a keypad, or a location on a touchpad 113. The electrical charge actuation signal may vary in magnitude of charge level which may correspond to the amount of mechanical stress applied to the piezoelectric element causing a varied amount of deformation of the piezoelectric element. This may correspond to a "depth" of the keypress or touchpad press based on the actuation force applied. The electric charge actuation signal level may be detected as reaching one or more threshold ranges that may each correspond to one or a plurality of multi-level functions or plurality of alphanumeric characters available at an extended action key of keyboard 114 or extended action touchpad 113. The haptic feedback keyboard and touchpad control system 132 may determine the threshold ranges met by the actuation signal and register a function or alphanumeric character depending on the threshold range detected according to embodiments herein. Further, the haptic feedback keyboard and touchpad control system 132 may assign one or more types of haptic feedback via a response haptic feedback control signal to distinguish the level of function selected or alphanumeric character selected by the applied force to the extended action key of keyboard 114 or extended action touchpad 113 in some embodiments herein. Further, visual feedback of the selection may be viewed via display screen 110 in some embodiments. Input may be received by the haptic feedback keyboard and touchpad control system 132 either simultaneously or concurrently so as to provide a return haptic feedback control signal to the corresponding piezoelectric elements as described herein. The haptic feedback keyboard and touchpad control system 132, in embodiments herein, may be a control system for either a haptic feedback keyboard 114 or for a haptic feedback touchpad system 113, or for both as shown in FIG. 1. For example, haptic feedback keyboard and touchpad control system 132 may include only a keyboard controller 130 for a haptic keyboard system or only a touchpad controller 131 for a haptic touchpad system in some embodiments that do not implement a haptic system for both the keyboard and touchpad. In other embodiments, both the keyboard controller 130 and touchpad controller 131 may be implemented for haptic input output systems as described herein.

The haptic smart typing assistance system 136 may, according to the present description, perform tasks related to tracking typed text input strings and determining a prediction of anticipated words being typed and anticipated next letters in those words. The haptic smart typing assistance system 136 may send an instruction to make other keys with letters that are not anticipated next letters harder to actuate via an instruction to a controller executing the haptic feedback keyboard and touchpad control system 132 to set the required force to actuate the other keys higher than the force required to actuate the anticipated next letter in some embodiments to reduce mistyping or disallow incorrect keystrokes. In other embodiments, the haptic smart typing assistance system 136 detect typographical or grammatical errors that have been typed and send an instruction to modify the haptic feedback control signals to the piezoelectric elements of the keys to indicate a correct typing actuation or that a typographical or grammatical error has occurred. In some embodiments, the haptic smart typing assistance system 136 may send an instruction to the haptic keyboard controller to accept extended action key inputs at a key associated with a correct anticipated next letter to correct a typographical error, or select a remainder of a correct word or to select among suggested words to assist the user in typing characters into the operating software application. The extended actions of the haptic smart typing assistance system 136 may also cause haptic feedback types at a key on a haptic keyboard 114 associated with that piezoelectric element to indicate a deep press action has been selected. In these embodiments, haptic feedback keyboard and touchpad control system 132 may receive the electric charge from any of a plurality of piezoelectric elements each associated with various keys on the haptic keyboard 114 (i.e., a QWERTY keyboard) and provide corresponding key codes for characters selected by the key actuation for comparison to an anticipated next letter or for analysis for anticipated words being typed or next words in a phrase.

In an embodiment, the haptic feedback keyboard and touchpad control system 132 and the haptic smart typing assistance system 136 may communicate with the main memory 104, the processor 102, the video display 110, the alpha-numeric input device 112, and the network interface device 120 via bus 108, and several forms of communication may be used, including ACPI, SMBus, a 24 MHZ BFSK-coded transmission channel, or shared memory. Keyboard driver software, firmware, controllers and the like may communicate with applications on the information handling system 100.

In other embodiments, dedicated hardware implementations such as application specific integrated circuits, programmable logic arrays and other hardware devices may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device). The system, device, controller, or module may include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module may also include a combination of the foregoing examples of hardware or software. In an embodiment an information handling system 100 may include an integrated circuit or a board-level product having portions thereof that may also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another may communicate directly or indirectly through one or more intermediaries.

Figure 2:
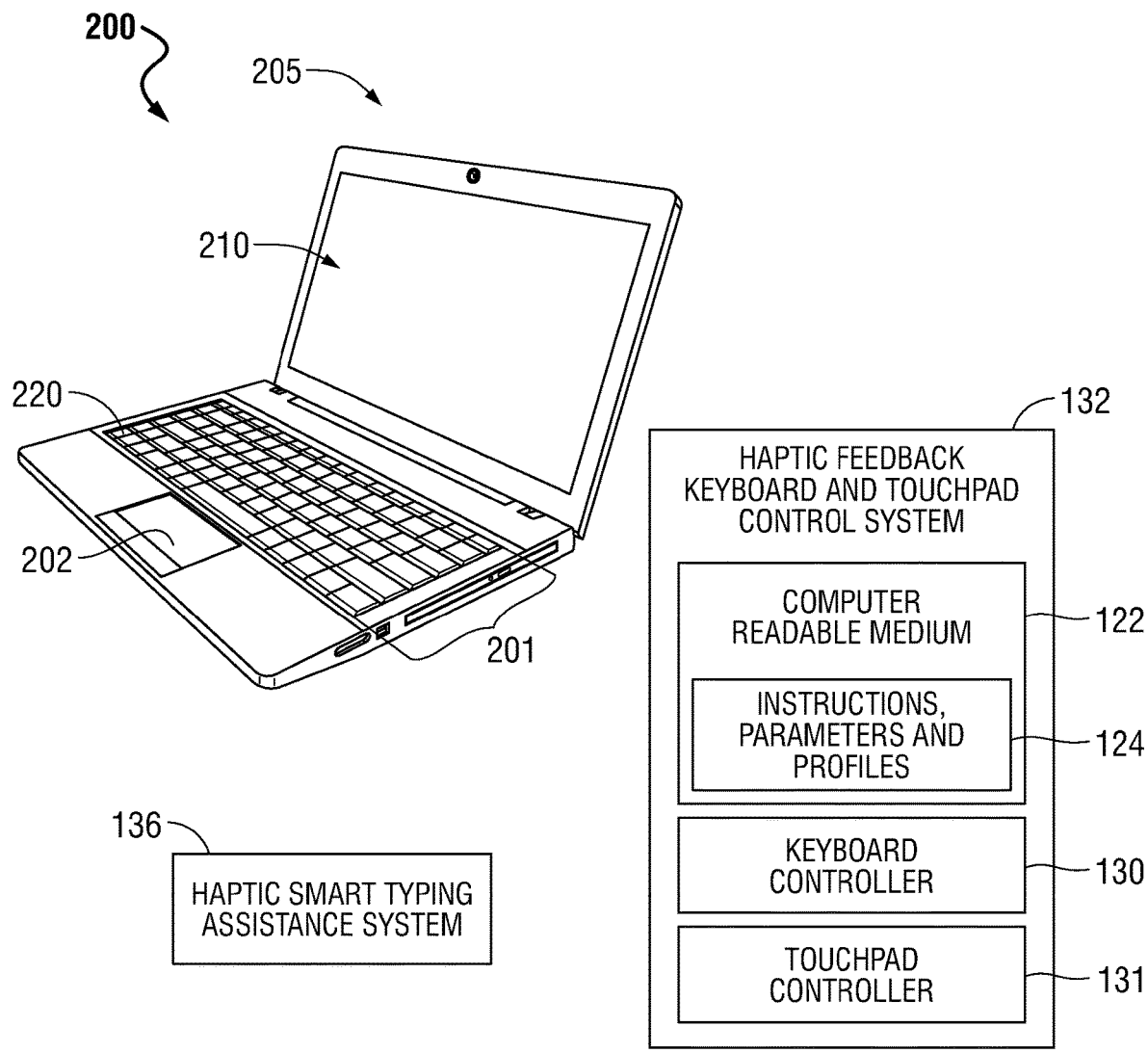
FIG. 2 is a perspective graphical diagram of an information handling system with a haptic feedback control system for a keyboard or touchpad with a haptic smart typing assistance system according to an embodiment of the present disclosure.

FIG. 2 is a perspective graphical diagram of an information handling system 200 with a haptic feedback keyboard and touchpad control system 132 and a haptic feedback keyboard and touchpad control system 132 according to an embodiment of the present disclosure. Although FIG. 2 depicts the information handling system 200 as being implemented in a laptop computing device, FIG. 2 is not meant to be limiting and the present specification contemplates that the use of other types of information handling system as described herein. In the example, the information handling system may include a screen portion 210 and a keyboard portion 201 and touchpad portion 202. The screen portion 210 may include any device that may present to a user any visual data as output to a user in response to input and execution of the instructions, parameters, and profiles 124 by the processor 102 described in connection with FIG. 1. In an example embodiment, a graphical user interface may be presented to a user to input any number of parameters descriptive of the actuation force used to actuate any number of keys 220 including extended action keys on the keyboard portion 201 of the information handling system, an actuation force at a location on an extended action touchpad 202, or both. The graphical user interface (GUI) may also be used to receive other settings including actuation of a "click" when selecting items on display 210 via a cursor using touchpad 202, setting the force required for actuation, setting multiple-levels of force and operations associated with those levels, and selection of magnitude, pattern, or other characteristics of the haptic response by a key 220 or touchpad 202 of the keyboard 201.

The keyboard portion 201 may include any number of keys 220, such as extended action keys, arranged in any manner so as to receive input from a user via selective actuation of those keys 220 including varying levels of applied force to select among levels of functions or alpha-numeric characters associated with extended action keys 220. In an embodiment, the keys 220 may be arranged similar to a QWERTY-type keyboard layout or any other alphabetic, symbolic, or numeric layout. In embodiments herein as described further with respect to FIG. 10, one or more extended action keys may be used to streamline the number or layout of keys 220. In such embodiments, an optimized keyboard layout may be utilized to increase available space on a C-cover for a touchpad 202 or provide for smaller information handling systems to have fuller function keyboards. In an embodiment, the keys 220 may be any number of keys from 1 to infinity.

In an embodiment of the present description, each of the keys 220 may be associated with a piezoelectric element. The piezoelectric element may be used to, as described herein, create an electrical charge relative to a key 220 on the keyboard portion 215 and send that electrical charge to a controller. As described, the piezoelectric elements may be capable of detected several levels of applied force and send those levels as electric charge actuation signals to a keyboard controller. In an embodiment, the controller may receive the electrical actuation signal and send one or more types haptic feedback control signals to the piezoelectric element. Upon application of the haptic feedback control signal at the piezoelectric element (i.e., having a specific current and voltage) associated with the actuated key 220 causes the piezoelectric element to convert that haptic feedback control signal into a mechanical stress by, for example, warping the piezoelectric element to generate one or more types of haptic feedback to the user including sound feedback in some embodiments. The types of haptic feedback provided to a piezoelectric element may correspond to the level of force applied and selection from among a plurality of functions or characters associated with an actuated extended action key 220 or actuated location on extended action touchpad 202. The mechanical stress of the piezoelectric element due to the application of the electrical charge to the piezoelectric element may be felt by a user who actuated the key 220 or location on the touchpad 202.

In an embodiment, the touchpad portion 202 includes a touch surface and a capacitive touch layer that indicates a touch location using x- and y-coordinates across the touch surface. In an embodiment, an array of piezoelectric elements may be placed under the touch surface. Each of the piezoelectric elements among the array may detect and respond by providing haptic feedback depending on the piezoelectric elements' proximity to an actuation location across the surface of the touch layer. The array of piezoelectric elements activates the touch surface and is a detect/response by one or more nearby piezoelectric elements. The piezoelectric elements create a "click" haptic feedback such as when a user selects an item displayed with the haptic touchpad 202.

The information handling system 200 may include a haptic feedback keyboard and touchpad control system 132 as described herein. In an embodiment the keyboard controller 130 and the touchpad controller 131 may be the same controller that executes instructions, parameter, and profiles 124 to enact the functions of the keyboard 114 and touchpad as described herein. In an embodiment the keyboard controller 130 and the touchpad controller 131 may be the different controllers that each executes instructions, parameter, and profiles 124 to enact the functions of the keyboard 201 and touchpad 202 as described herein. In an embodiment, the haptic feedback keyboard and touchpad control system 132 may include one or more sets of instructions that, when executed by a keyboard controller 130, causes one or more types haptic feedback control signals of varying voltage and polarity levels to be applied to a piezoelectric element upon detection of one or more threshold levels of electrical charge actuation signals from the piezoelectric element. The one or more sets of instructions of the haptic feedback keyboard and touchpad control system 132 may also include one or more sets of instructions that, when executed by the keyboard controller 130, determines which of any plurality of keys 220 on a keyboard portion 201 or locations on a touchpad 202 were activated. The present embodiments contemplate that only a haptic feedback keyboard 201 or only a haptic feedback touchpad 202 may be deployed into the information handling system with the other of the haptic feedback keyboard 201 or haptic feedback touchpad 202 being embodied as a conventional touchpad or keyboard. In an example, the keyboard controller 130 may receive, from a piezoelectric element, an electric charge and produce an electric charge to the piezoelectric element. The haptic feedback and touchpad control system 132 may also include a touchpad controller 131. In an embodiment, the touchpad controller 131 of the control system 132 may include one or more sets of instructions that, when executed by a touchpad controller 131, causes a current, at a voltage, to be applied to a piezoelectric element upon detection of an electrical charge from the piezoelectric element.

In an embodiment, the one or more sets of instructions of the haptic feedback keyboard and touchpad control system 132 may also include, in an embodiment, one or more sets of instructions that, when executed by a processor, adjusts the polarity, voltage, or current of haptic response signals applied to any piezoelectric element. This adjustment may be completed based on the desired haptic responses from the piezoelectric elements, the lifespan of the piezoelectric element, the electrical characteristics of the piezoelectric element, the mechanical characteristics of the piezoelectric element, or combinations thereof. Because these characteristics may be different from one piezoelectric element to the other, the electrical charge applied any given piezoelectric element by the keyboard controller 130 may be customized to produce a specific level of haptic feedback at any given key. In an embodiment, the keyboard controller 130 of the information handling system 200 may include a look-up table. In various embodiments, the keyboard controller 130 of the information handling system 200 may access the look-up table in order to determine how a current pulse is to be applied to any given piezoelectric element and at what polarity or voltage of the haptic response signal to the piezoelectric elements depending on user selection or depending on the received threshold level of electric charge actuation signal. For example, the received threshold level of electrical charge actuation signal may indicate via a look up table the corresponding function or character selected based on the applied "depth" or actuation force applied to the piezoelectric element as well as the look-up table may have differing functions and characters depending on which extended action key or location on extended action touchpad is actuated in various embodiments. Moreover, a lookup table may further associate the threshold of force applied to a corresponding type of haptic feedback or haptic feedback control signal in other embodiments.

The one or more sets of instructions of the haptic feedback keyboard and touchpad control system 132 may also include one or more sets of instructions that, when executed by the keyboard controller 130, causes any number of subsequent current pulses to be applied to any piezoelectric element. In this embodiment, the subsequent electrical pulses may cause a haptic feedback event to a user who actuated a key 220 on a keyboard portion 201 of the information handling system or changes in magnitude or pulses of haptic feedback to emulate the feel of a mechanical keystroke including adjustment of the feel of depth of the haptic-emulated keystroke. In other embodiments, the haptic feedback of the keyboard 201 may not need to emulate a keystroke of a mechanically actuated keyboard but instead provide a distinct haptic feel to indicate that a keystroke has occurred on the solid state keyboard 201 to the user.

The haptic smart typing assistance system 136 may, according to the embodiments herein, perform tasks related to tracking typed text input strings and determining a prediction of anticipated words being typed and anticipated next letters in those words. The haptic feedback keyboard and touchpad control system 132 may receive instructions from the haptic smart typing assistance system 136 to set the haptic feedback control signals used and the types of haptic feedback provided to keys of the haptic keyboard depending on selection of a correct key actuation or selection of a key actuation that may be a typographical or grammatical error. A look-up table may provide the type of haptic feedback to piezoelectric elements of the keys 220 on the haptic keyboard 201 to indicate to a user feeling the tactile haptic feedback, a correct (or not known to be incorrect) keystroke, a typographical error, a grammatical error, a deep press extended action selection, or other type of haptic feedback that may be provided to the actuated keys 220. The haptic smart typing assistance system 136 may also send an instruction to make other keys with letters that are not anticipated next letters of an anticipated word being typed or next word in a phrase harder to actuate via an instruction to a controller executing the haptic feedback keyboard and touchpad control system 132 to set the required force to actuate the other keys higher than the force required to actuate the anticipated next letter in some embodiments to reduce mistyping or disallow incorrect keystrokes. Thus, a deep press of a key that is not an anticipated next letter may be required to actuate that character and may generate a different haptic feedback type to indicate the selection (which may be an error).

In some other embodiments, the haptic smart typing assistance system 136 may send an instruction to the haptic keyboard controller to accept extended action key inputs. These extended action key inputs, such as various levels of deep press at an actuated key, may be associated with a plurality of smart typing assistance functions. For example, a deep press may be received at a correct key of an anticipated next letter and may be used to select a suggested word to be typed in an embodiment. The level of force applied to meet one of a plurality of force thresholds of an extended action haptic key may be used as various levels of deep press to select among a plurality of suggested words in other embodiments. The haptic smart typing assistance system 136 displaying the suggested words and suggested next letters on a display screen via the operating software application receiving typing or via a separate graphical user interface in embodiments herein. Selection of a suggested word or toggling among levels for selection among suggested words may be associated with types of haptic feedback that may be tactile or audio feedback via the piezoelectric elements in the haptic keyboard 201. In yet other embodiments, the haptic smart typing assistance system 136 may receive a deep press as an extended action key input to a correct key corresponding to an anticipated next character to correct a typographical error. In such as case, this may eliminate a need to delete the previously selected character that is a typographical or grammatical error. The haptic smart typing assistance system 136 may instruct the haptic keyboard controller to provide a type of haptic feedback to the correctly selected key to indicate that the deep press correction of the typographical error has occurred. In yet other example embodiments, haptic smart typing assistance system 136 may receive a deep press as an extended action key input to select a remainder of a correct word or to select among suggested correct words to assist the user in typing words into the operating software application. Again, the haptic smart typing assistance system 136 may instruct the haptic keyboard controller to provide a type of haptic feedback to the correctly selected key that may particularly indicate that the deep press selection has occurred and that the remainder of the suggested word has been selected. The extended actions of the haptic smart typing assistance system 136 may cause a plurality of haptic feedback types at one or more keys on a haptic keyboard 201 associated with corresponding piezoelectric elements to indicate correct or errant keystrokes, or a deep press action of a variety of types has been selected. In these embodiments, haptic feedback keyboard and touchpad control system 132 may receive the electric charge from any of a plurality of piezoelectric elements each associated with various keys on the haptic keyboard 201 and provide corresponding key codes for characters selected by the key actuation for comparison to an anticipated next letter or for analysis for anticipated words being typed or next words in a phrase.

In an embodiment, the one or more sets of instructions of the haptic feedback keyboard and touchpad control system 132 may also include, in an embodiment, one or more sets of instructions that, when executed by a processor, adjusts the voltage and current applied to any piezoelectric element at a touchpad portion 202. This adjustment may be completed based on the desired haptic responses from the piezoelectric elements, the lifespan of the piezoelectric element, the electrical characteristics of the piezoelectric element, the mechanical characteristics of the piezoelectric element, or combinations thereof. Because these characteristics may be different from one piezoelectric element to the other, the electrical charge applied any given piezoelectric element by the touchpad controller 131 may be customized to produce a specific level of haptic feedback at any given location across the touchpad. In an embodiment, the touchpad controller 131 of the information handling system 200 may include a look-up table. In this embodiment, the touchpad controller 131 of the information handling system 200 may access the look-up table in order to determine how a current pulse is to be applied to any given piezoelectric element and at what polarity or voltage of the haptic response signal to the piezoelectric elements.

The one or more sets of instructions of the haptic feedback keyboard and touchpad control system 132 may also include one or more sets of instructions that, when executed by the touchpad controller 131, causes any number of subsequent current pulses to be applied to any piezoelectric element. In this embodiment, the subsequent electrical pulses may cause a haptic feedback event to a user who actuated a location across a touchpad portion 202 of the information handling system or changes in magnitude or pulses of haptic feedback to emulate the feel of a mechanical actuation of a touchpad portion 202 including adjustment of the feel of depth or click response of the haptic-emulated actuation of the touchpad portion 202. In other embodiments, the haptic feedback of the touchpad 202 may not need to emulate a click of a mechanically actuated touchpad but instead provide a distinct haptic feel to indicate that a touchpad selection has occurred on the solid state touchpad 202 to the user.

In an embodiment, the application of any current and voltage applied to any of the piezoelectric elements associated with any of the keys 220 or a location on a touchpad portion 202 may be dependent on an application being executed on the laptop computing device 205. By way of example, a user may be engaged in providing input, via the keys 220 of the keyboard portion 215, to a processor of the laptop computing device 205 in order to cause output to be provided. In a specific embodiment, the laptop computing device 205 may execute a basic input/output system (BIOS). Upon execution of the BIOS, the haptic feedback keyboard and touchpad control system 132 may begin to detect electrical signals or charges emitted from a piezoelectric element being placed in a strain by the actuation of a corresponding key 220 on the keyboard portion 215 or location on a touchpad portion 202. This may allow the haptic feedback keyboard and touchpad control system 132 to receive input at times when the laptop computing device 205 is in an on states. In an alternative embodiment, the execution of other application programs by a processor of the laptop computing device 205 such as word processing application program may trigger the haptic feedback keyboard and touchpad control system 132 to begin to detect the electrical charges produced at any given piezoelectric element. By deferring input received from the piezoelectric element at the keyboard controller 130 or any other controller or processor, accidental input may be prevented by any errant touch of the keyboard portion 215.

Figure 3A:
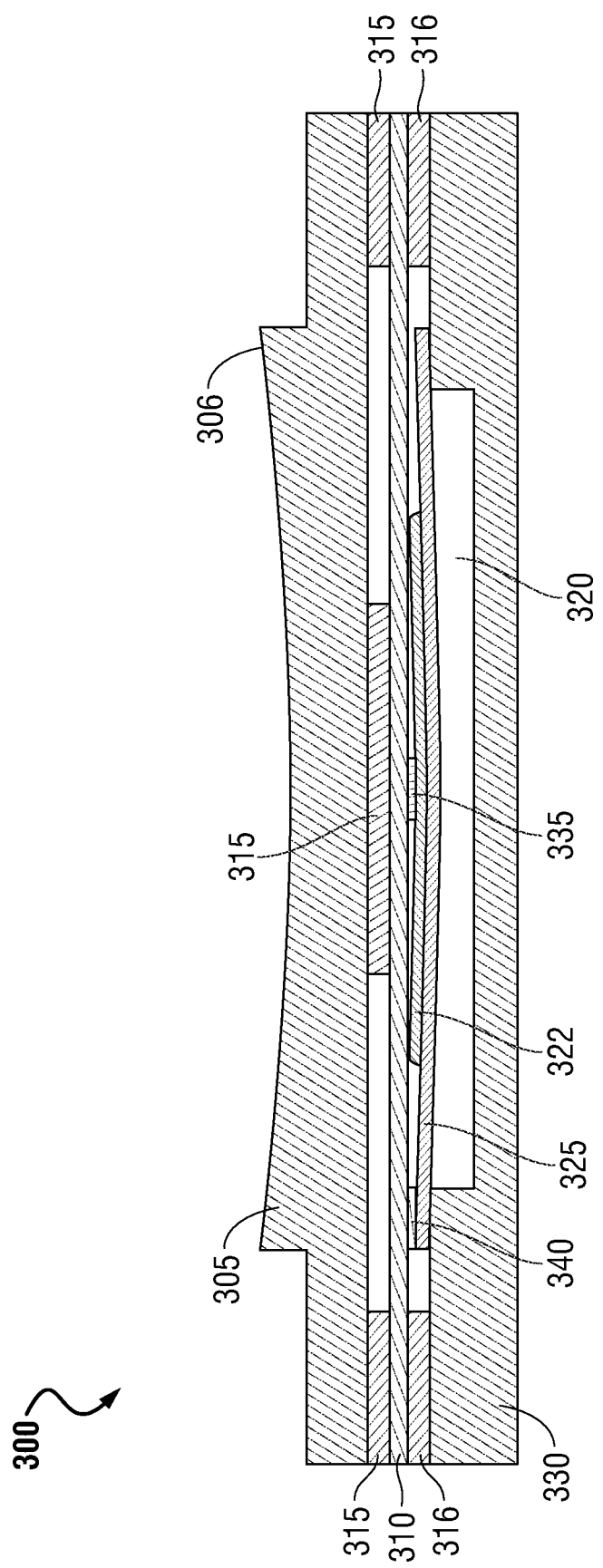
FIG. 3A is a side cut-out view of a key of a keyboard implementing a piezoelectric element in an unactuated state according to an embodiment of the present disclosure.

FIG. 3A is a side cut-out view of a key 300 of a keyboard implementing a piezoelectric element 320 in an unactuated state according to an embodiment of the present disclosure. According to an embodiment, the key 300 may be formed of a plurality of layers, one layer of which is a piezoelectric element 320. Although FIG. 3A shows a cross-sectional view of a single key 300, the present specification contemplates that a keyboard may also include a plurality of these similar keys 300 arranged as, for example, a QWERTY-type keyboard. The present specification also contemplates that, in addition to a keyboard, an information handling system described herein may also include a touchpad including a piezoelectric element 320 as described herein. Consequently, FIG. 3A is not intended to be limiting but merely intended as a description of operation of any type of input device contemplated by the present disclosure.

The key 300 includes a coversheet 305. The coversheet 305 may be made of any type of elastically resilient material. The elastically resilient material may allow, at least, a portion of the key 300 to be deformed upon application of a pressure from a user's finger. Upon withdraw of the pressure from the user's finger, the material the coversheet 305 is made of allows the coversheet 305 of the key 300 to bend back to its pre-deformed state. In an embodiment, the resilient material may allow the coversheet 305 to travel a minimal distance and still deform a piezoelectric element 320. For example, a distance of between 0.01 mm and 2 mm may be compressed in the stackup including the coversheet 305 and piezoelectric element. In an embodiment, the distance is between 0.05 mm and 0.15 mm. In an embodiment, the distance is 0.1 mm. The piezoelectric element 320 may deform between 5 microns and 30 microns in some embodiments. Varying levels of piezoelectric element deformation may be detected as levels of accumulated electrical charge since further deformation of piezoelectric element 320 may correspond to a higher level of mechanical stress from greater applied force according to embodiments herein.

In an embodiment, the shape of the coversheet 305 may have a selection of key pedestals 306 of various sizes and shaped so as to conform to a user's finger. In an embodiment, in order to shape the coversheet 305, the material used to form the coversheet 305 may be subjected to an injection molding process. As such, a top portion of the coversheet 305 may be formed to be ergonomically beneficial to a user's actuation such as by conforming to the user's fingers and including a pedestal 306 to highlight the key location, for example. In other embodiments, no key pedestals may be formed and a key location may be described in coversheet 305 via markings, depressions, key framing, or other methods. The injection molding process may be completed prior to the installation of the coversheet 305 into the remaining layers within the keyboard 300 as described herein. Any number of processes may be included with the injection molding process. In an embodiment, the injection molding process used to form the coversheet 305 may include forming a number of holes within a sheet of acrylonitrile butadiene styrene (ABS). These holes may correlate with a number of keys on a keyboard. The formation of the coversheet 305 may continue with injection molding a translucent ABS through the holes to form a raised portion correlating with each of the number of keys on the keyboard. Opposite the raised portions a number of runners may be machined away to accommodate for receipt of other layers of the keyboard such as each of the piezoelectric elements. The surface of the coversheet on which the raised portions are formed may be painted and any number or type of graphics may be laser etched on each raised portion indicating a specific key of the keyboard.

In yet other embodiments, coversheet of the C-cover may include a plurality of vias for keys 300 having a cover sheet 305 or cap for each key. A key pedestal 306 for each key 300 in a solid state keyboard of the present embodiments may be disposed through the vias in the C-cover in such embodiments. Keys 300 may include small gaps that may be available for base chassis ventilation, or for allowing backlight framing of keys in some embodiments. Similarly, in some embodiments a via for touchpad interface surface may be provided in a C-cover coversheet for access to the top cover sheet of the solid state touchpad in some embodiments.

The key 300 may further include a number of adhesive layers 315 that physically couple the various layers of the key 300 together. In an embodiment, a first adhesive layer 315 may be formed on the coversheet 305 to adhere the coversheet 305 to a contact foil 310. The first adhesive layer 315 may include the placement of the adhesive at locations that may enhance the movement and prevent the hinderance of the actuation of the coversheet 305. In a specific embodiment, the first adhesive layer 315 may include placing the adhesive along borders of the key 300 as well as placing the adhesive at a central location of the key 300.

The contact foil 310 adhered to the coversheet 305 via the first layer of adhesive 315 may be made of any elastically resilient material that, when the coversheet 305 of key 300 is actuated or the contact foil 310 is bent towards a lower portion of the key 300, returns to its original state when the key 300 is no longer being actuated. The contact foil is a flexible material, such as polyethylene terephthalate (PET) serving as a polyester printed circuit board or other type of flexible printed circuit board, in several example embodiments. The contact foil 310 may include a number of metal traces formed thereon that electrically and communicatively couple each of the corresponding piezoelectric element 320 of key 300 to a controller such as a processor of an information handling system that includes a haptic feedback keyboard control system such as described herein. Formation of metal traces may be made according to a variety of methods including photolithographic techniques for applying metal or lamination of copper strips or other metal layers. During operation of the key 300, the contact foil 310 may receive an electrical charge from the piezoelectric element 320 at the metal traces that conduct the electrical charge to the processor or other controller associated with the key 300. The metal traces formed on the contact foil 310 may further be used to conduct a return haptic feedback control signal from the controller to the piezoelectric element 320 so that the voltage and current of the return haptic feedback control signal may cause the piezoelectric element 320 to return to a planer and rigid piezoelectric element 320 as required to cause a specified haptic response to the user via coversheet 305. This stiffening of the piezoelectric element 320 may cause a haptic feedback presented at the key 300 via the contact foil 310, adhesive 315, and coversheet 305 that the user may feel. This haptic feedback may be relayed to the user within microseconds of the user actuating the key 300 such that the user physically detects a sensation that the key 300 was pressed. This sensation felt by the user may be present despite no actual mechanical devices such as a scissor mechanism or other types of keyboard mechanical devices being present among the layers of the key 300. The signal to the piezoelectric element 320 may vary magnitude and pulsing to create the desired haptic response at key 300.

In an embodiment, portions of the contact foil 310 may be physically coupled to a support plate 330 via a second layer of adhesive 316. The location of the placement of the second adhesive layer 316 may include placing the adhesive along borders of the key 300.

In an embodiment presented herein, the piezoelectric element 320 may include a first portion 322 that may be any solid piezoelectric material that accumulates an electric charge when a mechanical stress is applied to it or specifically, in the embodiments presented herein, when the solid material is deformed. Solid materials used to form the piezoelectric element 320 may include crystals, ceramics, or protein layers, among other types of materials. For ease of explanation, the piezoelectric element 320 may be made of a type of ceramic although the present specification contemplates the use of other types of piezoelectric materials.

The piezoelectric element 320 may be housed over a cavity 331 formed in the support plate 330. The piezoelectric element 320 may comprise two portions 322 and 325 each electrically coupled via electric contact points such as soldering points 335 and 340, respectively, to a different electrical trace on a contact foil 310. The first portion 322 may be a ceramic disc in an embodiment. Second portion 325 of the piezoelectric element 320 may be a metal plate or ring, such as a brass plate, that extends beyond the edges of cavity 331. The first portion 322 and the second portion 325 may be operatively coupled via adhesive including conductive adhesives. The soldering points 335 and 340 may be silver solder contact points for operative electrical coupling to metal traces on contact foil 310. The brass plate 325 supports deflection of the piezoelectric element 320 into the cavity 331 to detect mechanical actuation of the key 300. In an embodiment, the support plate 330 may have cavity 330 formed therein such that the piezoelectric element 320 may be allowed to be deflected therein when the key 300 is actuated by a user and cavity 331 may be an aperture or hole through support plate 330 or may be a depression or hole in support plate 330 that does not pass through 330.

The piezoelectric element 320 may be electrically and communicatively coupled to the metal traces formed on the contact foil 310 via a metallic connection points 335 and 340 such as a solder dot. In a specific embodiment, the piezoelectric element 320 may be electrically and communicatively coupled at a first portion 322 to a metallic trace formed on the contact foil 310 by a first soldering point 335 and at a second portion 325 to a metallic trace in contact foil 310 via a second soldering point 340. The soldering points 335 and 340 may be silver contact points for making electrical contact to first portion 322 and second portion 325 of the piezoelectric element 320. As so oriented, the first soldering point 335 and second soldering point 340 may be formed to receive an electrical charge upon deflection of the piezoelectric element 320 as a user actuates the key 300. As described herein, the electrical charge may be detected by the controller as received from the electrically-conductive metal traces and portions 322 and 325.

Upon receiving an actuation signal, the controller sends a haptic feedback control signal back to the piezoelectric element 320 via the metal traces formed on the contact foil 310, through the soldering points 335 and 340 and to a conductive layer of metallic plate or ring 325 formed below the piezoelectric disk material 322. The conductive layer of metallic plate or ring 325 may apply the haptic feedback control signal to the piezoelectric disk material 322 so as to cause the piezoelectric disk material 322 to stretch or shrink depending on the polarity of the signal applied. For example, a negative signal applied to piezoelectric disk material element 322 relative to the charge at adhesively attached metallic plate 325 may cause piezoelectric disk 322 to expand or stretch in embodiments herein. This may cause metallic plate 325 to warp downward. Reversing polarity to the piezoelectric disk 322 may cause the piezoelectric disk 322 to compress or shrink and metallic plate 325 may warp upwards. The principle of haptics applied to the piezoelectric disk 322 includes an input voltage is applied through the two electrodes (voltage change as sine wave, square wave etc.) to generate movement on piezoelectric material 322 of the piezoelectric element 320 and a warping of the metallic layer or disk 325. This haptic response signal is used to cause a haptic tactile feedback such as a depression and return of the key 300 or a haptic "click" of a touchpad and which may be accompanied by a sound. Such a haptic feedback control signal, such as a sine wave signal, or other haptic response signals with varying polarities or voltage and current may be used by the controller to create the haptic feedback felt by the user as described herein. In these embodiments, the electric charge sent from the piezoelectric element 320 to the controller and the haptic feedback control signal sent from the controller to the piezoelectric element 320 may propagate along the two metal traces formed on the contact foil 310. The contact foil 310 may therefore, in an embodiment, include double the number of metal traces as that of the number of piezoelectric elements 320 used to form a keyboard that includes multiple keys 300.

FIG. 3A shows an image of a single key 300. The present specification contemplates that a plurality of keys 300 may be formed alongside each other in order to form, for example, a number pad, a keyboard, or a combination thereof. Consequently, although the features of the key 300 depicted in FIG. 3A apply to a single key 300, the present specification contemplates that any number of keys 300 may be formed on the keyboard so as to allow for the formation of an input device such as a keyboard. The keys 300 may be of any size (e.g., spacebar, tab key, or the like) and depending on size may include more than one piezoelectric element 320 associated with it. As the user actuates each of the keys 300, a haptic feedback may be felt by the user so as to present to the user a sensation that the key was pressed.

The formation of the key 300 may, in the embodiments presented herein, provides for a keyboard that has a relatively shorter distance of key travel as compared to those keyboards that implement mechanical devices such as a scissor mechanisms and key caps. Further, as described in embodiments herein, levels of piezoelectric deformation may be detected at the piezoelectric element to provide for an extended action key as seen in more detail below. In an embodiment, the distance of travel of the key 300 may be smaller than 0.1 mm. With the shorter distance of key travel, the overall thickness of the keyboard placed within an information handling system may be reduced. This increases the available footprint within a base chassis of, for example, a notebook-type information handling system that may be used for more or larger components (e.g., batteries) to be placed within the base chassis. Additionally, or alternatively, the reduction in thickness of the keyboard may reduce the overall thickness of the information handling system improving the aesthetics of the design of the information handling system. This reduction in size of the information handling system may also result in the reduction of the weight of the information handling system thereby increasing the portability of the information handling system by the user.

The keys 300 of the present embodiments also include no moving mechanical parts. With the absence of mechanical moving parts, the key 300 of the presently described embodiments may be relatively more robust thereby increasing the useful life of the key 300. This may increase user satisfaction over the useful lifetime of the information handling system.

Figure 3B:
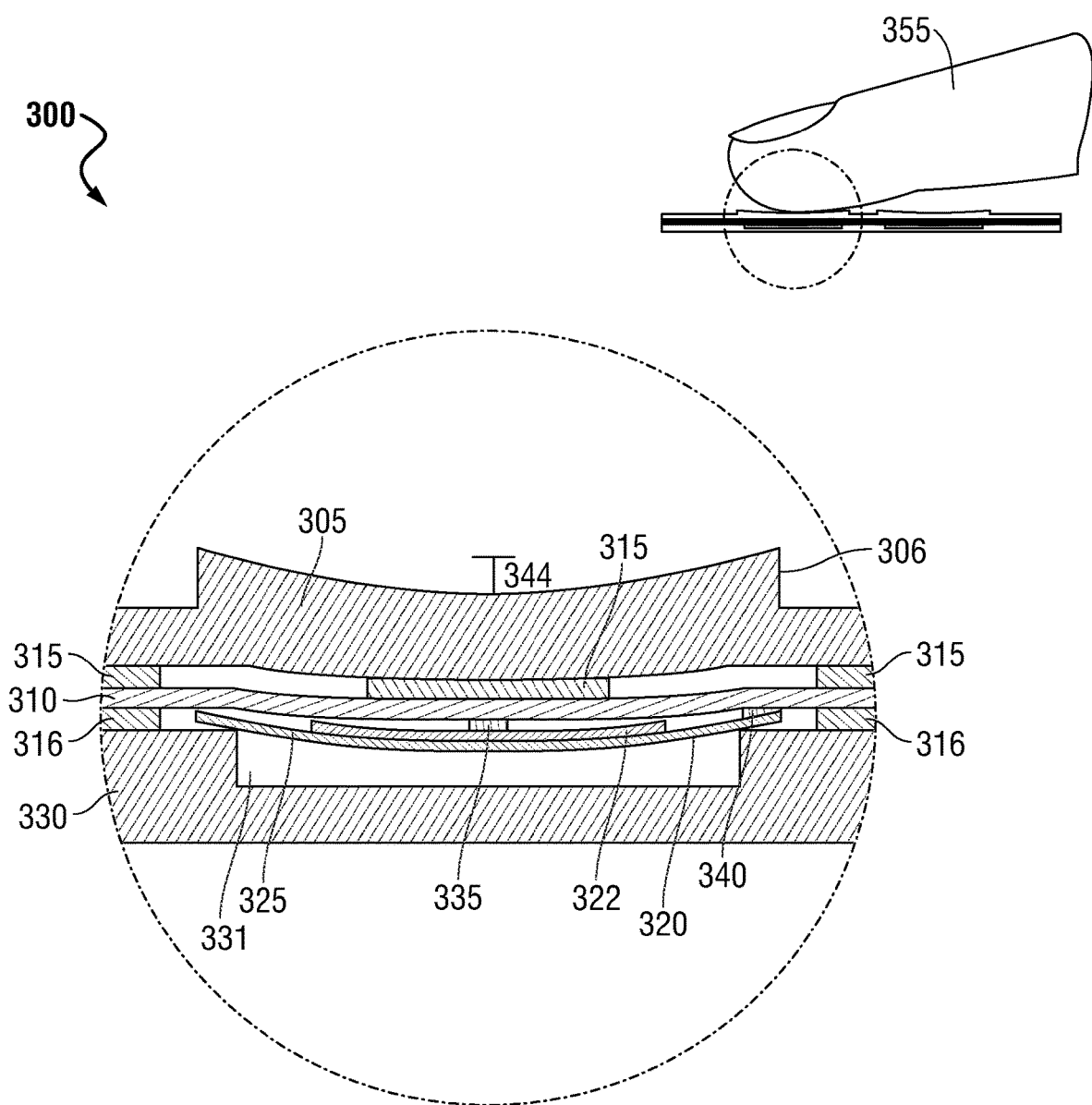
FIG. 3B is an enlarged side cut-out view of a key of a keyboard implementing a piezoelectric element in an actuated state according to an embodiment of the present disclosure.
Figure 3C:
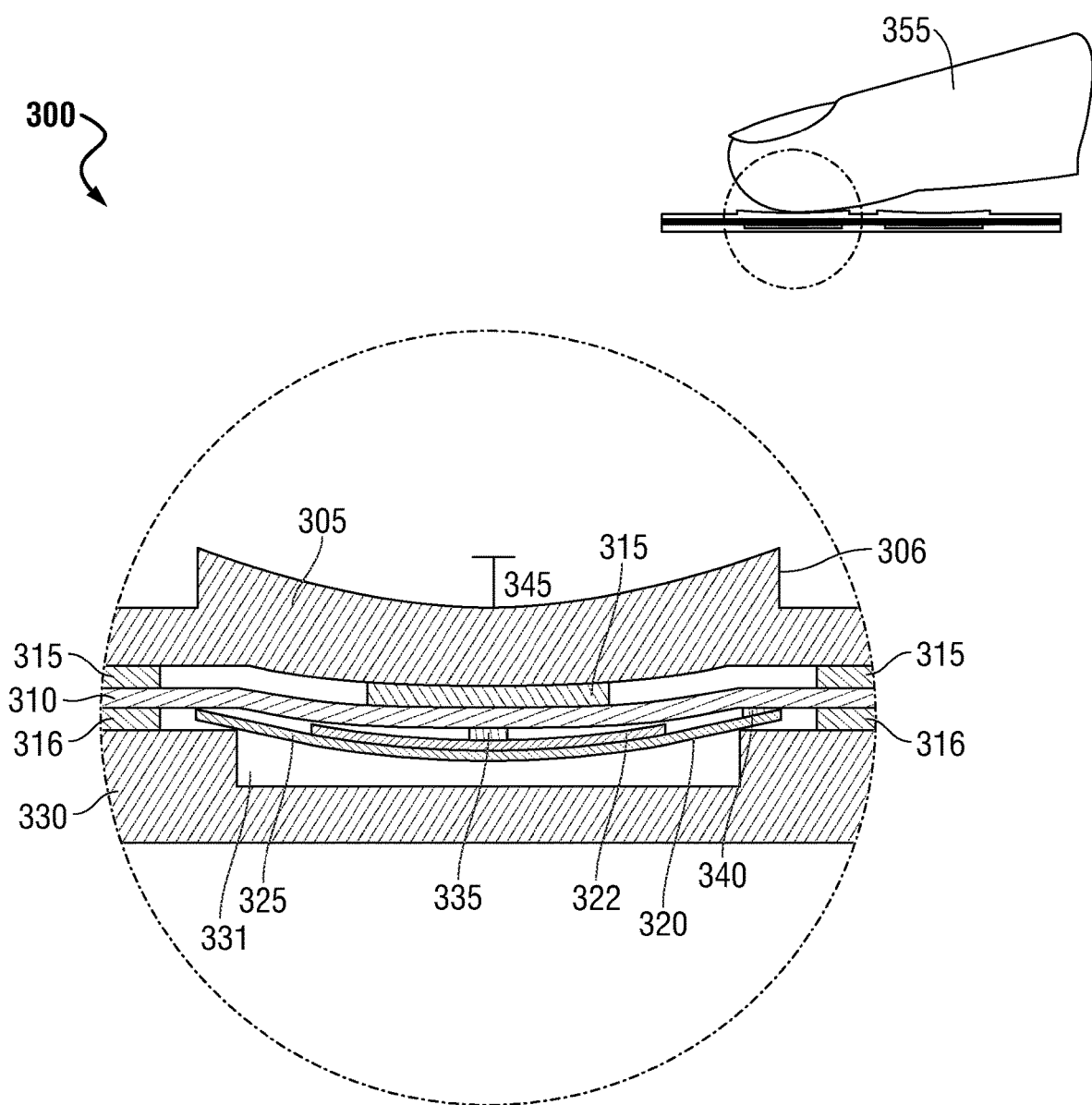
FIG. 3C is an enlarged side cut-out view of a key of a keyboard implementing a piezoelectric element in another extended actuated state according to an embodiment of the present disclosure.

FIG. 3B is an enlarged side cut-out view of an extended action key 300 of a keyboard implementing a piezoelectric element 320 in a first actuated state by a finger 355 according to an embodiment of the present disclosure. This may be compared to FIG. 3C also showing an enlarged side cut-out view of an extended action key 300 of a keyboard implementing a piezoelectric element 320 in a second actuated state by a finger 355 where additional mechanical deformation has been applied with greater actuation force on the extended action key 300 according to an embodiment of the present disclosure. According to an embodiments of FIG. 3B and FIG. 3C described herein, the extended action key 300 may be formed of a plurality of layers, one layer of which is a piezoelectric element 320 made of a piezoelectric material, such as piezoelectric disk 322, and a of metallic plate or ring 325. Although FIG. 3B and FIG. 3C show a cross-sectional view of a single extended action key 300, the present specification contemplates that a keyboard may include a plurality of these keys 300 with or without extended action functionality. Also, a C-cover layer may further include a touchpad including a piezoelectric element 320 as described herein. Consequently, FIG. 3B and FIG. 3C are not intended to be limiting but merely intended as a description of operation of any portion of the input device contemplated by the present disclosure.

The extended action key 300 includes a coversheet 305. The coversheet 305 may be made of any type of elastically resilient material. The coversheet 305 may cover a plurality of keys but also be continuous and cover any touchpad on the C-cover in some embodiments described herein. In other embodiments, one or both of a keyboard or touchpad may be separately disposed at vias in the coversheet of the C-cover as described herein. The elastically resilient material may allow, at least, a portion of the extended action key 300 to be deformed upon application of a pressure from a user's finger to multiple levels as shown in FIG. 3B and FIG. 3C. Upon withdraw of the pressure from the user's finger, the material the coversheet 305 is made of allows the coversheet 305 of the extended action key 300 to bend back to its pre-deformed form. In an embodiment, the resilient material may allow the coversheet 305 to travel a distance of between 0.01 mm and 2 mm. FIG. 3B shows, in contrast to FIG. 3A, the deformation of the coversheet 305 piezoelectric element 320, and conductive layer 325. The deformation is shown at 344 in FIG. 3B. FIG. 3C shows, in contrast to FIG. 3B, a greater level of deformation 345 of the coversheet 305 piezoelectric element 320, and conductive layer 325 as compared to the deformation level 344 of FIG. 3B.

In some embodiments of FIG. 3B and FIG. 3C, portions of a first adhesive layer 316 and second adhesive layer 315 placed between the remaining layers of the key 300 may also be compressed when the finger 355 of a user deforms the remaining layers of the key 300.

In an embodiment, the shape of the coversheet 305 may include key pedestal 306 and may be concave so as to conform to a user's finger. In an embodiment, in order to shape the coversheet 305, the material used to form the coversheet 305 may be subjected to an injection molding process. As described herein, this may include multiple keys of a keyboard as well as other portions of the C-cover including any piezoelectric touchpads as described herein. A top portion of the coversheet 305 may be formed to be ergonomically beneficial to a user's actuation such as providing key or touchpad location identification such as key pedestal or framing or by conforming to the user's fingers, for example. The injection molding process may be completed prior to the installation of the coversheet 305 into the remaining layers within the keyboard or touchpad as described herein. Any number of processes may be included with the injection molding process. In an embodiment, the injection molding process used to form the coversheet 305 may include forming a number of holes within a sheet of acrylonitrile butadiene styrene (ABS). These holes may correlate with a number of keys on a keyboard. The formation of the coversheet 305 may continue with injection molding a translucent ABS through the holes to form a raised portion as a key pedestal correlating with each of the number of keys on the keyboard. Opposite the raised portions a number of runners may be machined away to accommodate for receipt of other layers of the keyboard such as each of the piezoelectric elements. The surface of the coversheet on which the raised portions are formed may be painted and any number or type of graphics may be laser etched on each raised portion indicating a specific key of the keyboard.

In other embodiments, each extended action key 300 may be formed such that it has a coversheet 305 with key pedestals 306 disposed through key vias in the C-cover coversheet (not shown). In such embodiments, the extended action key 300 shown in FIG. 3B and FIG. 3C may be a structure for one or more keys of a solid state keyboard with any of the layers being independent or shared among the plurality of keys 300 in the keyboard.

In other embodiments, the coversheet 305 may include number holes for key vias and for a touchpad via. Each haptic key of the haptic keyboard may include a cover layer that protrudes through the key vias in the coversheet 305. Layering under the coversheet may include material layers that are hydrophobic or have other properties. Though gaps between haptic keys and key vias may be minimized, such gaps may be useful for cooling ventilation of the base chassis or for allowing backlighting to frame the haptic keys. Similarly, a touchpad top touch interface layer may be attached under the coversheet 305 to seamlessly provide a designated touchpad area in the C-cover coversheet 305. Any combination of continuous coversheet for haptic keys or the haptic touchpad and vias in the coversheet for placement of haptic keys of a keyboard or a touchpad top touch interface layer are contemplated in various embodiments. Further, it is contemplated that in some embodiments one or the other of a haptic keyboard or haptic touchpad may be used with a keyboard having mechanically actuated keys or a touchpad with a mechanically actuate diving board mechanism.

The extended action key 300 of FIG. 3B and FIG. 3C may further include a number of adhesive layers 315 such as the first adhesive layer 315 and second adhesive layer 316 described herein that physically couples the various layers of the key 300 together. In an embodiment, the first adhesive layer 315 may be formed on the coversheet 305 to adhere the coversheet 305 to a contact foil 310. The first adhesive layer 315 may be include the placement of the adhesive at locations that may enhance the movement or prevent the hinderance of the actuation of the coversheet 305. In a specific embodiment, the first adhesive layer 315 may include placing the adhesive along borders of the key 300 as well as placing the adhesive at a central location of the key 300.

The contact foil 310 adhered to the coversheet 305 via the first layer of adhesive 315 may be made of any elastically resilient material that, when the key 300 is actuated by a user's finger 355 or the contact foil 310 is bent towards a lower portion of the key 300, returns to its original state when the key 300 is no longer being actuated. The contact foil 310 may include a number of metal traces formed thereon that electrically and communicatively couple each of the keys 300 and a corresponding piezoelectric element 320 to a controller such as a processor of an information handling system that includes a haptic feedback keyboard control system such as described in connection with FIG. 1. During operation of the extended action key 300, the contact foil 310 may receive an electrical charge at varying levels from the piezoelectric element 320 at the metal traces that conduct the electrical charge to the processor or other controller associated with the key 300. As the piezoelectric disk material 322 is compressed by deflection and the metal plate or ring 325 warped downward, a change in voltage may be detected and may correspond to the amount of compression applied to 322 due to applied force on the extended action key 300. The electrical charge of varying levels is created when the user actuates the extended action key 300 with the user's finger 355 and the piezoelectric element 320 is subjected to a mechanical stress may be detected between soldering points 335 and 340. The electrical charge is communicated down metal traces formed on the contact foil 310 to a controller (not shown) as an actuation signal. As described, one or more functions or characters may be selected via the extended action key 300 of FIG. 3B and FIG. 3C depending on the level of deflection received at piezo electric element 320.

The metal traces formed on the contact foil 310 may further be used to conduct one or more return haptic feedback control signals from the controller to the piezoelectric element 320 so that the voltage and current of the return haptic feedback control signal may cause the piezoelectric element 320 compress further and then contract to return to a planer and rigid piezoelectric element 320 in one or more types of haptic feedback. This actuation of the piezoelectric element 320 may cause one or more types of haptic feedback presented at the extended action key 300 that the user may feel at the user's finger 355. This haptic feedback may be relayed to the user within microseconds of the user actuating the extended action key 300 with the user's finger 355 such that the user physically detects a sensation, at that finger 355, that the extended action key 300 was pressed. Further, the one or more types of haptic feedback presented at the extended action key 300 that the user may feel at the user's finger 355 may indicate the level of deflection applied and thus the function or character selected. This sensation felt by the user may be present despite no actual mechanical devices such as a scissor mechanism of other types of keyboard mechanical devices being present among the layers of the extended action key 300.

In an embodiment, portions of the contact foil 310 may be physically coupled to a support plate 330 via a second layer of adhesive 316. The location of the placement of the second adhesive layer 316 may include placing the adhesive along borders of the key 300.

In an embodiment presented herein, the piezoelectric element 320 may be any solid material that accumulates an electric charge when a mechanical stress is applied to it or specifically, in the embodiments presented herein, the solid material is deformed. Solid materials used to form the piezoelectric disk 322 or other piezoelectric material as part of a first portion 322 of the piezoelectric element 320 may include crystals, ceramics, biological matter, protein layers, among other types of materials. For ease of explanation, the piezoelectric disk material 322 may be made of a type of ceramic although the present specification contemplates the use of these other types of materials.

The piezoelectric element 320 may be housed over a cavity 331 formed under a bottom surface of the contact foil 310. The cavity 331 may be formed into or through a top surface of the support plate 330, and the second layer of adhesive 315. In an embodiment, the support plate 330 may have the cavity 331 formed therein such that the piezoelectric element 320 may be allowed to be deflected therein when the extended action key 300 is actuated by application of one or more levels of force of the user's finger 355.

The piezoelectric element 320 may be electrically and communicatively coupled to the metal traces formed on the contact foil 310 via a metallic connection point such as a solder dot 335, 340. The soldering points 335 and 340 may be silver contact points for making electrical contact to first portion 322 and second portion 325 of piezoelectric element 320. In a specific embodiment, the piezoelectric element 320 may be electrically and communicatively coupled to a metallic trace formed on the contact foil 310 by a first soldering point 335 and a second soldering point 340. The first portion 322 of piezoelectric element 320, such as a piezoelectric disk, may be coupled to the contact foil 310 via the first soldering point 335. The second portion 325 of piezoelectric element 320, such as a metal plate or ring, may be coupled to the contact foil 310 via the second soldering point 340. As so oriented, the first soldering point 335 and second soldering point 340 may be formed to receive an electrical charge upon deflection and mechanical stress of the piezoelectric disk 322 as a user's finger 355 actuates the extended action key 300. As described herein, the electrical charge may be detected by the controller as received from the electrically-conductive metal traces and portions 322 and 325.

Upon receiving an actuation signal, the controller sends a haptic feedback control signal back to the piezoelectric element 320 via the metal traces formed on the contact foil 310, through the soldering points 335 and 340 and to a conductive layer of metal plate or ring 325 formed below the piezoelectric disk material 322. The conductive layer of metal plate or ring 325 and contact point 335 may apply one or more haptic feedback control signals to the piezoelectric disk material 322 so as to cause the piezoelectric disk material 322 to stretch or shrink depending on the polarity of the signal applied. For example, a negative signal applied to piezoelectric disk material 322 relative to the charge at adhesively attached metallic plate 325 may cause piezoelectric disk 322 to contract or shrink in embodiments herein. This may cause metallic plate 325 to warp downward. Reversing polarity to the piezoelectric disk 322 may cause the piezoelectric disk 322 to stretch and metallic plate 325 may warp upwards. The principle of haptics involves an input voltage applied through the two electrodes (with a responsive voltage change signal such as a sine wave, a square wave, or other wave form that changes in polarity, voltage, or current) to generate movement on piezoelectric material of the piezoelectric element 320 which causes a haptic feedback event in coordination with warping the metallic plate 325 based on the movement of the piezoelectric material layer 322. A tactile haptic sensation, such as a mimicked keystroke or "click," may be generated in some example embodiments of haptic feedback events and multiple levels of "depth" or repeated clicks may indicate to a user that an additional level of pressure has been reached and selection of a next level of function or character has occurred. The haptic feedback event may also be accompanied by a generated sound in some embodiments. Such an electrical haptic feedback signal, such as a sine wave signal, square wave signal, pulsed signals, or other signals varying polarities, voltages, or currents may be used by the controller to create the haptic feedback felt by the user at the user's finger 355 as described herein. In these embodiments, the electric charge sent from the piezoelectric element 320 to the controller and the haptic feedback control signal sent from the controller to the piezoelectric element 320 may propagate along the two metal traces formed on the contact foil 310. The contact foil 310 may therefore, in an embodiment, include double the number of metal traces as that of the number of piezoelectric elements 320 used to form a keyboard that includes multiple keys 300.

FIG. 3B and FIG. 3C show images of a single extended action key 300. The present specification contemplates that a plurality of extended action keys 300 or haptic feedback keys such as 300 not implementing extended action which may be formed alongside each other in order to form, for example, a number pad, a keyboard, or a combination thereof. Consequently, although the features of the extended action key 300 depicted in FIG. 3B and FIG. 3C apply to a single extended action key 300, the present specification contemplates that any number of keys extended action 300 may be formed on the keyboard so as to allow for the formation of an input device such as a keyboard. The extended action keys 300 may be of any size (e.g., spacebar or a tab key) and in some embodiments more than one piezoelectric element may be associated with larger keys. As the user actuates each of the extended action keys 300, a haptic feedback may be felt by at the user's finger 355 so as to present to the user a sensation that the key was pressed and at what level a multi-level function or character option has been selected by the actuation press.

The formation of the extended action key 300 may, in the embodiments presented herein, provides for a keyboard that has a relatively shorter distance of key travel, while still accommodating multiple force application levels which may be perceived as differing "depths," as compared to those keyboards that implement mechanical devices such as a scissor mechanisms and key caps. In an embodiment, the distance of travel of the extended action key 300 may be smaller than 0.1 mm. With the shorter distance of key travel, the overall thickness of the keyboard placed within an information handling system may be reduced. This increases the available footprint within a base chassis of, for example, a notebook-type information handling system that may be used for more or larger components (e.g., batteries) to be placed within the base chassis. Additionally, or alternatively, the reduction in thickness of the keyboard may reduce the overall thickness of the information handling system improving the aesthetics of the design of the information handling system. Moreover, with the use of extended action keys 300, a more optimized key layout of a haptic keyboard may be utilized to allow an even more streamline space usage in a base chassis as well over the surface of the C-cover of the base chassis. Additionally, the optimized key layout utilizing extended action keys 300 may also permit more full function keyboards to be used with smaller information handling system. This reduction in size of the information handling system may result in the reduction of the weight of the information handling system thereby increasing the portability of the information handling system by the user.

Figure 3D:
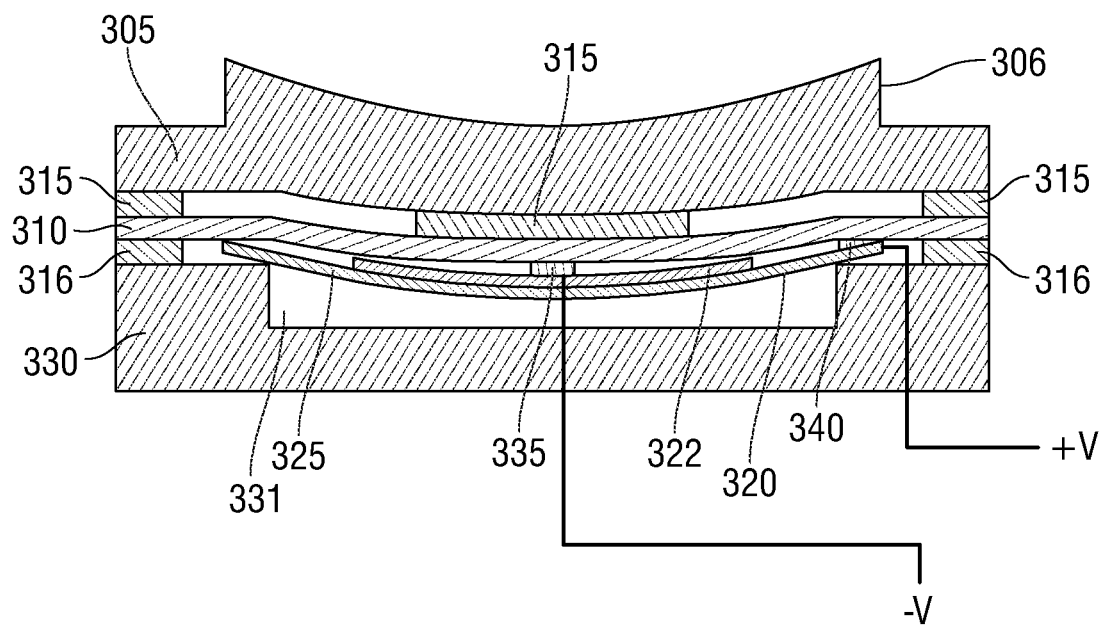
FIG. 3D is a side cut-out view of a key of a keyboard implementing a piezoelectric element in a downward warped position according to an embodiment of the present disclosure.

FIG. 3D is a side cut-out view of a key 300 of a haptic feedback keyboard implementing a piezoelectric element in a downward warped position according to an embodiment of the present disclosure. As described herein, a haptic feedback control signal may be transmitted from the controller to the piezoelectric element to a piezoelectric element of a haptic keyboard to cause a haptic movement or sound. For example, upon receiving a haptic actuation indicator signal indicating a haptic tactile feedback movement or sound is needed, the controller (not shown) in an embodiment may send a haptic feedback control signal to the piezoelectric element 320 via the metal traces formed on the contact foil 310, through the soldering points 335 and 340 and to a conductive layer of metallic plate or ring 325 formed below the piezoelectric disk material 322. Such a haptic actuation indicator signal in an embodiment may be one or more piezo actuation signal levels received at the controller or processor, indicating a key situated above the piezoelectric element 320 has been actuated by a user at one or more levels of applied force, as described in greater detail in embodiments herein. In other embodiments, a haptic actuation indicator signal may comprise a notification or code instructions received at the processor or controller from a software application currently operating on the information handling system. For example, some applications may include alarms or notifications that may be set to make an audible sound via the haptic keyboard, rather than through the main speaker system of the information handling system. As another example, some applications may cause the haptic keyboard, in lieu of or in combination with the main speakers of the information handling system to emit sound in accordance with an audio signal having one or more channels for one or more speakers. Such notifications or audio signals in an embodiment may comprise a haptic actuation indicator signal.

The conductive layer of metallic plate or ring 325 may apply the haptic feedback control signal to the piezoelectric disk material 322 so as to cause the piezoelectric disk material 322 to stretch or shrink depending on the polarity of the signal applied. For example, a negative voltage haptic feedback control signal applied to piezoelectric disk material element 322 at soldering point 335 relative to a positive voltage haptic feedback control signal applied at soldering point 340 may cause piezoelectric disk 322 to compress or shrink in embodiments herein. This may, in turn, cause the metallic layer or disk 325 adhered to the ceramic piezoelectric disk 322 to warp downward as shown in FIG. 3D. Further in the example shown in FIG. 3E, a positive voltage haptic feedback control signal applied to piezoelectric disk material element 322 at soldering point 335 relative to a negative voltage haptic feedback control signal applied at soldering point 340 may cause piezoelectric disk 322 to expand or stretch in embodiments herein. This may, in turn, cause the metallic layer or disk 325 adhered to the ceramic piezoelectric disk 322 to warp upward. The principle of haptics applied to the piezoelectric disk 322 includes an input voltage that is applied through the two electrodes (voltage change as sine wave, square wave etc.) to generate movement on piezoelectric material 322 of the piezoelectric element 320 and a warping of the metallic layer or disk 325. One or more haptic feedback control signal in an embodiment may comprise a haptic tactile movement feedback control signal for causing haptic movement feedback at the piezoelectric element 322, a haptic sound feedback control signal for causing haptic sound feedback at the piezoelectric element 322 through one or more frequencies of upward and downward movement, or a single haptic feedback control signal for causing both haptic movement feedback and haptic sound feedback, simultaneously, at the piezoelectric element 322.

In example embodiments herein, one or more haptic movement feedback control signals may be used to cause a haptic movement feedback such as a depression and return of the key 300 or a tactile "click" or movement of a touchpad according to a plurality of types of haptic feedback to indicate which level of force has been applied to extended action keys or an extended action touchpad. The type of haptic feedback sent to an actuated piezoelectric element in example embodiments may indicate which function of a selection of multi-level functions or which character from a selection of characters has been selected with the applied force level to the extended action key 300 or extended action touchpad.

Further, the haptic sound feedback control signal may be used to cause one or more types of haptic sound feedback such as an audible clicking or buzzing sound in some embodiments. For example, movement of the piezoelectric element 320 from a planar or neutral position to an upward or downward position, or between an upward warped position and downward warped position may generate audible sound waves. The pitch and volume of such sound waves in an embodiment may depend, at least partially, on various adjustable aspects (e.g., frequency, magnitude, polarity of voltage) of the haptic feedback control signal. Such a haptic sound feedback control signal, such as a sine wave signal, or other haptic feedback control signals with varying polarities or voltage and current may be used by the keyboard controller to create the haptic feedback (e.g., haptic movement feedback or haptic sound feedback) felt or heard by the user as described herein.

Figure 3E:
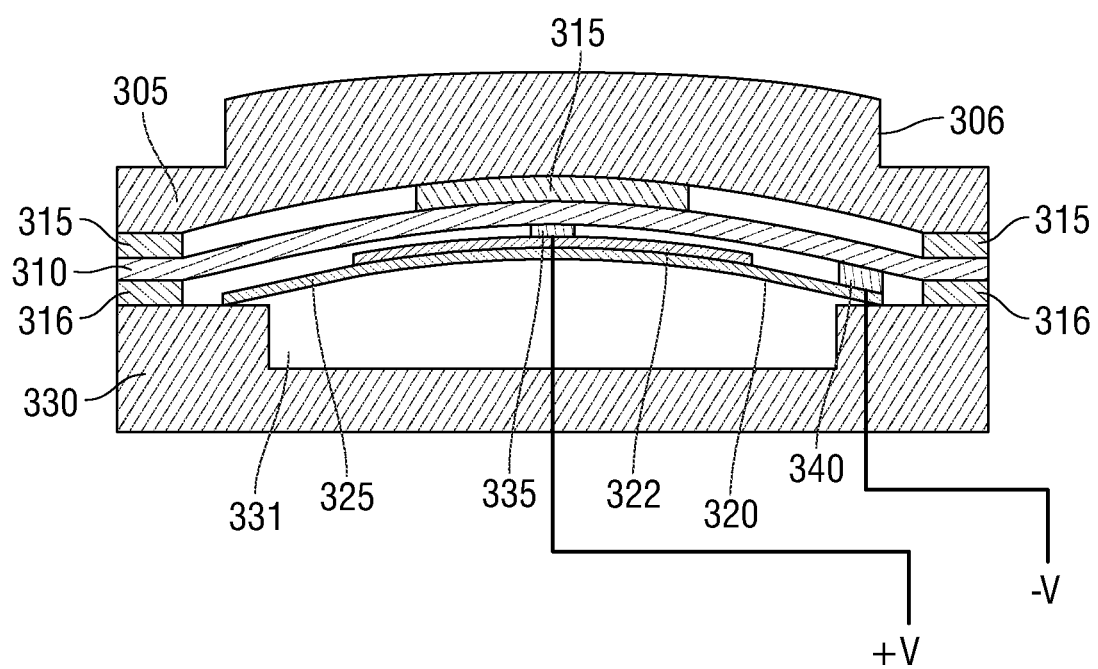
FIG. 3E is a side cut-out view of a key of a keyboard implementing a piezoelectric element in an upward warped position according to an embodiment of the present disclosure.

FIG. 3E is a side cut-out view of an extended action key 300 of a haptic feedback keyboard implementing a piezoelectric element in an upward warped position according to an embodiment of the present disclosure. As described herein, upon receiving one or more piezo actuation signal levels or other haptic actuation indicator signal, the controller (not shown) in an embodiment may send one or more corresponding haptic feedback control signals to the piezoelectric element 320 via the metal traces formed on the contact foil 310, through the soldering points 335 and 340 and to a conductive layer of metallic plate or ring 325 formed below the piezoelectric disk material 322 to cause a haptic movement feedback or haptic sound feedback. As described herein, the type of haptic movement feedback or haptic sound feedback sent to the extended action key 300 or extended action touchpad may indicate the level of actuation press and selection of one function or character from a plurality of available functions or characters associated with the extended action key 300 or extended action touchpad. The conductive layer of metallic plate or ring 325 may apply the haptic feedback control signal to the piezoelectric disk material 322 so as to cause the piezoelectric disk material 322 to stretch or shrink depending on the polarity of the signal applied. For example, reversing polarity of voltage applied by a haptic feedback control signal to the piezoelectric disk 322 as described with reference to FIG. 3E may cause the piezoelectric disk 322 to compress or shrink and metallic plate 325 may warp upwards. More specifically, a positive voltage haptic feedback control signal applied to piezoelectric disk material element 322 at soldering point 335 relative to a negative voltage haptic feedback control signal applied at soldering point 340 may cause piezoelectric disk 322 to stretch or expand in embodiments herein. This may, in turn, cause the metallic layer or disk 325 adhered to the ceramic piezoelectric disk 322 to warp upward. By oscillating the voltage (e.g., reversing polarity) of the haptic feedback control signals applied to the soldering points 335 and 340 in such a way, the controller in an embodiment may cause the piezoelectric element 320 to move between its upward warped position and downward warped positions as shown in FIGS. 3D and 3E. Such a movement of the metallic plate or disc 325 in an embodiment may generate various types of tactile movement haptic feedback or audible sound waves depending on various frequencies and magnitude of the haptic feedback control signal to the piezoelectric elements. Thus, the warping of the piezoelectric elements associated with the extended action key 300 or an extended action touchpad as described may be used to generate tactile haptic feedback events as well via haptic feedback control signals in embodiments herein.

Figure 4:
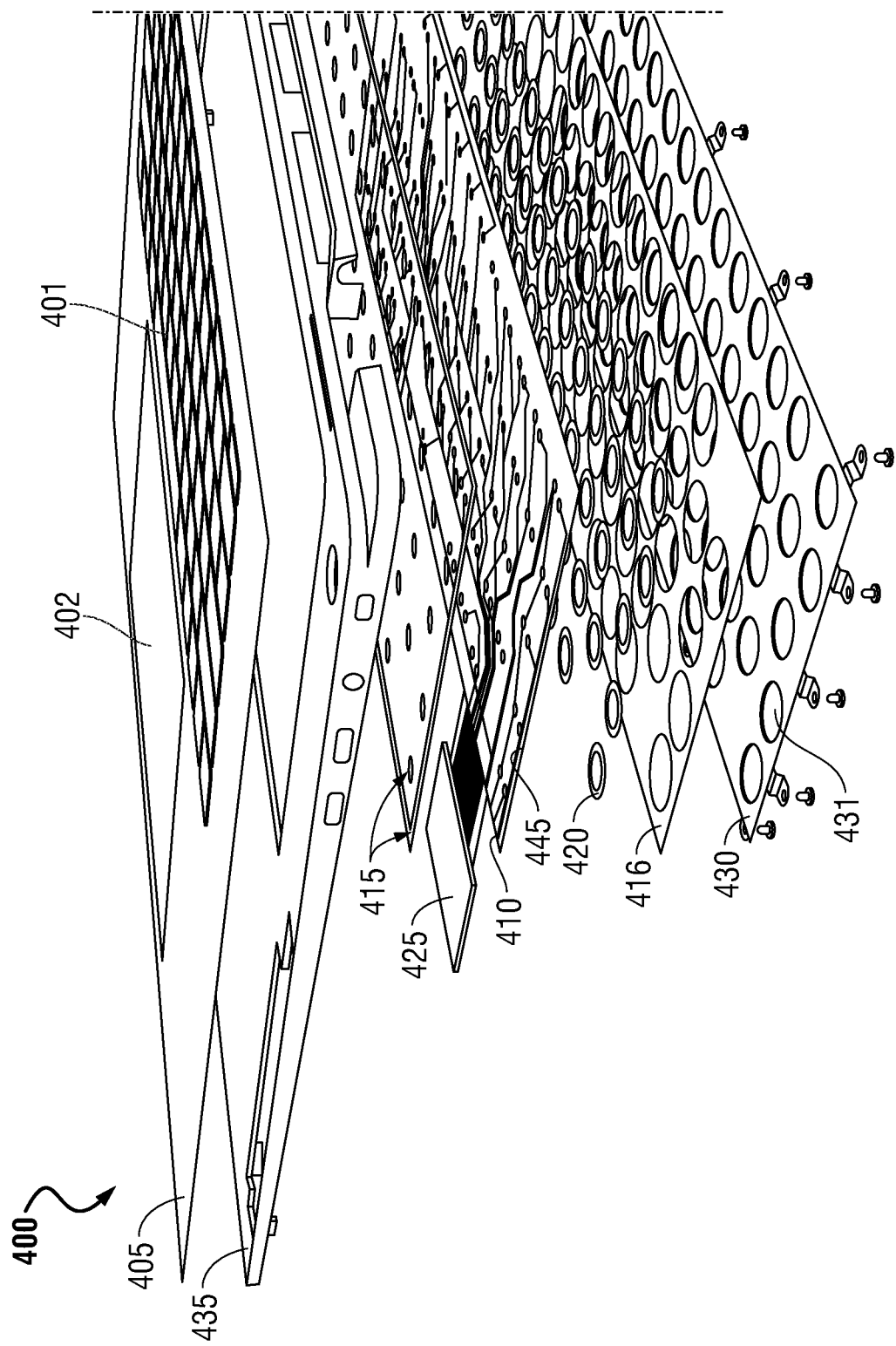
FIG. 4 is an exploded perspective view of a keyboard stack up for of an information handling system according to an embodiment of the present disclosure.

FIG. 4 is an exploded perspective view of a keyboard stack up 400 of an information handling system according to an embodiment of the present disclosure. The keyboard stack up 400 shows a plurality of keys, similar to those described in connection with FIGS. 3A-3E above, arranged so as to receive input from a user at multiple keys. FIG. 4 also shows a top coversheet 405 having both a keyboard 401 and a touchpad 402. Either or both of the keyboard 401 and touchpad 402 may be haptic systems as described in embodiments herein and either or both may include use of including extended action keys in the haptic keyboard 401 or an extended action haptic touchpad 402 of embodiments herein. In an embodiment, the keys may be arranged similar to a QWERTY design of a keyboard 401. However, other arrangements of any alphabetic, numeric, or symbolic keys is contemplated by the present description. In the extended action key haptic feedback keyboard and touchpad control system of the haptic keyboard and touchpad control system, more than one alphanumeric character may be available and associated with a particular extended action key even without requiring a simultaneous press of a shift key or an alt key. Thus, the number of keys in the layout design of the keyboard 401 may be streamlined or reduced in size in various embodiments herein using one or more extended action keys to optimize the keyboard space formed on the information handling system. An example optimized keyboard layout is depicted and described with respect to FIG. 10 below. Fewer keys may be utilized with equal or greater functionality leaving more space on a C-cover for a touchpad or other functionality. Further, fewer keys may also allow for fewer piezo key stackups needed allowing for more space in the base chassis or for a thinner, more streamlined information handling system.

The keyboard stack up 400 may include several layers similar to those described in connection with FIGS. 3A-3E. In an embodiment, the keyboard stack up 400 includes a coversheet layer 405. The coversheet layer 405 may be made of any type of elastically resilient material. Coversheet layer 405 may include a plurality of key designations, such as key pedestals as shown in keyboard 401 and a touchpad 402 area designation. In an example embodiment, the key designations may provide an indication of a plurality of available alphanumeric characters or functions selectable by an extended action key. In other embodiments, the key designations may also provide an indication of a plurality of available alphanumeric characters or functions selectable by via any shift or function key in addition to those available via various press levels for the extended action key. The elastically resilient material may allow, at least, a portion of the coversheet layer 405 to be deformed upon application of a pressure from a user's finger. Upon withdraw of the pressure from the user's finger, the material the coversheet layer 405 is made of allows the coversheet layer 405 of the key to bend back to its pre-deformed form. In an embodiment, the resilient material may allow the coversheet layer 405 to travel a distance of between 0.01 mm and 2 mm. The range of available travel distance of the coversheet layer may accommodate actuation at two or more downward force actuation levels on an extended action key in some embodiments.

In an embodiment, the shape of the coversheet layer 405 may be such so as to conform to the user's fingers. In an embodiment, in order to shape the coversheet layer 405, the material used to form the coversheet layer 405 may be subjected to an injection molding process. As such, a top portion of the coversheet layer 405 may be formed to be ergonomically beneficial to a user's actuation such as by providing a tactile key location designation and conforming to the user's fingers, for example. The injection molding process may be completed prior to the installation of the coversheet layer 405 into the remaining layers within the keyboard as described herein. Any number of processes may be included with the injection molding process. In an embodiment, the injection molding process used to form the coversheet layer 405 may include forming a number of holes within a sheet of, for example, ABS. These holes may correlate with each actuatable key to be formed on the keyboard 401. The formation of the coversheet layer 405 may continue with injection molding a translucent ABS through the holes to form a raised portion for key pedestals correlating with each of the number of keys on the keyboard 401. The raised portion for the key pedestals may include different and various materials used to form the raised portions. In an embodiment, the raised portions may be made of a fabric, silicone, or polycarbonate or combinations thereof. In an embodiment, the raised portion may include a fabric top layer with a polycarbonate insert bonded below the fabric top layer. In an embodiment, the raised portion may include a silicone or polycarbonate top layer with a polycarbonate insert bonded below the silicone or polycarbonate top layer. In an embodiment, the raised portion may include a polycarbonate top layer with a metal insert bonded below the polycarbonate top layer. In an embodiment, the raised portion includes a polycarbonate top layer with a silicone core bonded to the polycarbonate top layer. In each of these embodiments, the raised portion may be formed using an injection molding process, a compression molding process an insertion molding process, and a liquid silicone rubber (LSR) injection molding process, among other types of processes.

Opposite the raised portions a number of runners may be machined away to accommodate for receipt of other layers of the keyboard such as each of the piezoelectric elements 420. The surface of the coversheet layer 405 on which the raised portions of key pedestals are formed may be painted and any number or type of graphics may be laser etched on each raised portion indicating a specific key of the keyboard 401. As described, it is also contemplated that coversheet layer 405 may include a plurality of key vias for keys of the static keyboard of the present embodiments to be disposed through in some example embodiments. Similarly, it is contemplated that coversheet layer 405 may include a touchpad via as a window for a touchpad interface surface of a solid-state touchpad according to embodiments herein to be accessible in some aspects. Any combination of the above coversheet 405 layouts described is contemplated in embodiments described herein.

The keyboard stack up 400 may further include a C-cover substructure 435 forming part of the base chassis with a cutout for keyboard 401 and touchpad 402. In an embodiment, the touchpad 402 and coversheet layer 405 may form a monolithic piece that, for example, includes different polycarbonate-acrylonitrile butadiene styrene (PC-ABS) resins used to cosmetically differentiate the touchpad 402 from a remaining portion of the coversheet layer 405. In an embodiment, the different PC-ABS may include chemical properties that differentiates the touchpad 402 portion to the coversheet layer 405 via other properties such as stiffness. In an embodiment, the coversheet layer 405 may be expanded to extend over an area where a user may rest the user's palms against the information handling system often referred to as a palm rest. In an embodiment, the coversheet layer 405 may be expanded over the area of the palm rest through a material such as a glass. In this embodiment, the glass may be attached to a remaining portion of the C-cover substructure 435 through a bonding process or via metal inserts attached to glass and connected to the C-cover substructure 435 through a number of fastening devices.

In an embodiment, the C-cover substructure 435 may be made of a rigid material that prevents little or no movement. The rigidity of the C-cover substructure 435 allows the other layers within the keyboard 401 to be maintained within the information handling system. In an embodiment, the C-cover substructure 435 may be made to a metal.

The keyboard stack up 400, in an embodiment, may further include any number of adhesive layers 415. In an embodiment, a first adhesive layer 415 may mechanically couple the coversheet layer 405 to a contact foil layer 410. The first adhesive layer 415 may be include the placement of the adhesive at locations that may enhance the movement and prevent the hinderance of the actuation of the coversheet layer 405 at those locations across the coversheet layer 405 where keys are present. In a specific embodiment, the first adhesive layer 415 may include placing the adhesive along borders of each of the keys as well as placing the adhesive at a central location of each of the keys.

The contact foil layer 410 is adhered to the coversheet layer 405 via the first adhesive layer 415 may be made of any elastically resilient material that, when any given key is actuated or the contact foil layer 410 is bent towards a lower portion of the respective key, returns to its original state when the respective key is no longer being actuated. The contact foil layer 410 may include a number of metal traces 445 formed thereon that electrically and communicatively couples each of the keys and a corresponding piezoelectric element 420 to a controller 425 of an information handling system that includes a haptic feedback keyboard control system such as described in connection with FIG. 1. In an embodiment, the controller 425 may be a dedicated controller 425 communicatively coupled to the contact foil layer 410 so as to detect one or more levels of electrical charges from each of the piezoelectric elements 420 and provide one or more types of haptic feedback control signals back to the respective piezoelectric elements 420 according to various embodiments herein. In an alternative embodiment, the controller 425 may be a processor of the information handling system that, among other computations and execution of other computer readable program code, also executes computer readable program code associated with the haptic feedback keyboard control system as described in FIG. 1.

During operation of each key on the keyboard 401, the contact foil layer 410 may receive an electrical charge from the respective piezoelectric elements 420 as they are compressed upon actuation at the metal traces 445 that conduct the electrical charge to the controller 425 associated with the keyboard 400. The charge magnitude levels of the actuation signal may vary depending on the level of mechanical stress applied to the extended action key in some embodiments herein and these levels or magnitudes may be received by the metal traces 445. The metal traces 445 formed on the contact foil layer 410 may further be used to conduct a return electrical haptic response signal from the controller 425 to the piezoelectric elements 420 so that the voltage and current of the return haptic feedback control signal may cause the piezoelectric elements 420 to stretch or contract in response to a control haptic feedback signal and at varying polarities, voltages, or currents. This electrical response haptic feedback control signal to each of the actuated piezoelectric elements 420 may cause a haptic feedback presented at each of the keys that the user may feel. In some embodiments herein, selection from among several types of haptic feedback may be provided via return haptic feedback control signals depending upon the level of mechanical stress applied to the piezoelectric element during actuation. Plural electric charge threshold levels for actuations of an extended action key and the piezoelectric element associated with it may be used to determine the type of haptic feedback provided to the actuated extended action key corresponding to the level selected in some embodiments herein. This haptic feedback may be relayed to the user within microseconds of the user actuating any of the keys on the keyboard 401 such that the user physically detects a sensation that the extended action key was pressed and what level was selected. This sensation felt by the user may be present despite no actual mechanical devices such as a scissor mechanism or other types of keyboard mechanical devices being present among the layers of the keyboard 401.

The keyboard stack up 400 may further include a second adhesive layer 416 that mechanically couples the contact foil layer 410 to a support plate 430. In an embodiment, the second adhesive layer 416 may include the placement of an adhesive along borders of each piezoelectric element 420 of the keyboard stack up 400. As shown in FIG. 4, the second adhesive layer 416 includes circular voids that conform to a shape of each piezoelectric element 420 within the keyboard stack up 400.

The support plate 430 may be made of rigid material such as a metal. The support plate 430 prevents deformation of the keyboard stack up 400 except for, in some embodiments, the contact foil layer 410, piezoelectric element 420, first adhesive layer 415, and second adhesive layer 416 as for operation of the haptic keys. As such, the contact foil layer 410 may be allowed to detect the deformation of the piezoelectric elements 420 to the various mechanical stress levels described for selecting multi-level functions or characters available at the extended action key. Additionally, a user using the keyboard 401 may feel a level of rigidity in the keyboard 401 except that at the locations of the keys where the user has expected that some level of deformation occurs when pressure is applied to provide for key actuation of the piezoelectric element 420.

In an embodiment, the support plate 430 may include a number of cavities 431 formed therein. The cavities 431 may be sized to have a relatively smaller diameter than the diameter of each of the respective piezoelectric elements 420. By including these cavities 431, the piezoelectric elements 420 may be allowed to be deformed into the cavities 431 so that the deformation of the piezoelectric element 420 creates the electrical charge described herein. The metal plate of the piezoelectric elements 420 may have a diameter greater than cavities 431. Upon compression or contraction of the piezoelectric material portions, such as a ceramic disk of the piezoelectric element 420, the metal plate may warp into or away from the cavity 431. The depth of the cavities 431 may also be selected to allow for at least a central portion of each piezoelectric element 420 to be deflected into the cavities 440 some distance. This distance of deflection, in an embodiment, may be 0.1 mm or smaller or may be greater. In embodiments herein, the deflection may accommodate two or more levels of deflection due to mechanical stress for use with extended action keys according to embodiments herein. In an embodiment, the cavities 431 may also be holes punched or machined through the support plate 430.

In an embodiment, the support plate 430 may be secured to other rigid elements of the information handling system. In an embodiment, the support plate 430 may be secured to the C-cover substrate 435 via a number of bolts, screws, or other mechanical or chemical coupling device. In some embodiments, the support plate 430 may be operatively coupled to the D-cover of the information handling system.

Each of the piezoelectric elements 420 may include a first portion layer of piezoelectric material and a second portion conductive layer as described herein in connection with the larger figures describing the keys in FIGS. 3A and 3B. Additionally, each piezoelectric element 420 of the keyboard 401 may be operatively coupled to at least one metal trace 445 formed on the contact foil layer 410 via a contact point such as a solder point. In this embodiment, the conductive layer associated with each of the piezoelectric materials of the piezoelectric elements 420 may be operatively coupled to at least one metal trace 445 formed on the contact foil layer 410 via a contact point such as a solder point. The contact foil layer 410 may, in a particular embodiment, include two metal traces 445 for each piezoelectric element 420 at a first portion and a second portion formed in the keyboard 401.

During operation of the keyboard 401, a user may actuate a key formed on the coversheet layer 405 of the keyboard 401 by pressing down on that key. As a result of the mechanical stress placed on the piezoelectric material of the piezoelectric element 420 associated with the actuated key, an electric charge is created at the piezoelectric element 420. The electric charge is an actuation signal and may have varying magnitude of electric charge or levels of charge relative to mechanical stress at the piezoelectric element 420 due to actuation force on an extended action key in example embodiments. The electrical charge is carried to one or more metal traces 445 coupled to the piezoelectric material and the metal plate of the piezoelectric element 420 via a contact point such as a solder point. The electric charge received at the one or more metal traces 445 may be conducted to a controller 425 by the metal trace 445 as described herein. In this embodiment, the controller 425 may detect that electrical charge produced by the mechanical stress of the piezoelectric material of the piezoelectric element 420 and may determine a threshold level range of the applied mechanical stress as signaled in the electric charge actuation signal. Then the controller may send a corresponding haptic feedback control signal back to the piezoelectric material of the piezoelectric element 420 that is associated with the received threshold range. This haptic feedback control signal may have a certain voltage, current, and polarity (−, +) sufficient to render the piezoelectric material of the piezoelectric element 420 to cause a one of a selection of a plurality of types of haptic feedback event or sound. The haptic feedback control signal from the controller 425 may follow the same or a different metal trace 445 back to the piezoelectric element 420. The haptic feedback control signal may be received at the piezoelectric material and metal plate of the piezoelectric element 420 via, for example, a contact point such as a solder point. Because the piezoelectric material of the piezoelectric element 420 receives the haptic feedback control signal from the controller 425 this causes the piezoelectric material to be generate one of the types of haptic feedback event. A response signal may be a sine wave, a square wave, a pulsed signal, or other waveform of changing current, voltage, or polarity applied to the piezoelectric element 420. As a result of the piezoelectric material stretching or contracting during the haptic event, the piezoelectric element 420 warp downward or upward with respect to the cavity 431 and may return back to a non-deformed state thereby creating haptic feedback felt by the user's finger. In an embodiment, the relay of the electrical charge to the controller 425, the detection of the controller 425 of the electrical charge, and the return of the haptic feedback control signal by the controller 425 to the piezoelectric element 420 may be sufficiently quick enough for the user to feel the haptic feedback in a manner that the user does not detect any temporal delay between the actuation of the key and the detection of the haptic feedback created at the piezoelectric element 420. Further, the type of haptic feedback event provided through an extended action key may indicate to the user what level has been selected via the extended action key and, accordingly, what function or character may be selected from a plurality of the same available through the extended action key. In an embodiment, the relay of the electrical charge to the controller 425, the detection of the controller 425 of the electrical charge, and the return of the haptic feedback control signal by the controller 425 to the piezoelectric element 420 may be on the order of microseconds. This operation of each of the keys of the keyboard 401 may be conducted every time the user actuates any key or extended action key on the keyboard 401.

Figure 5:
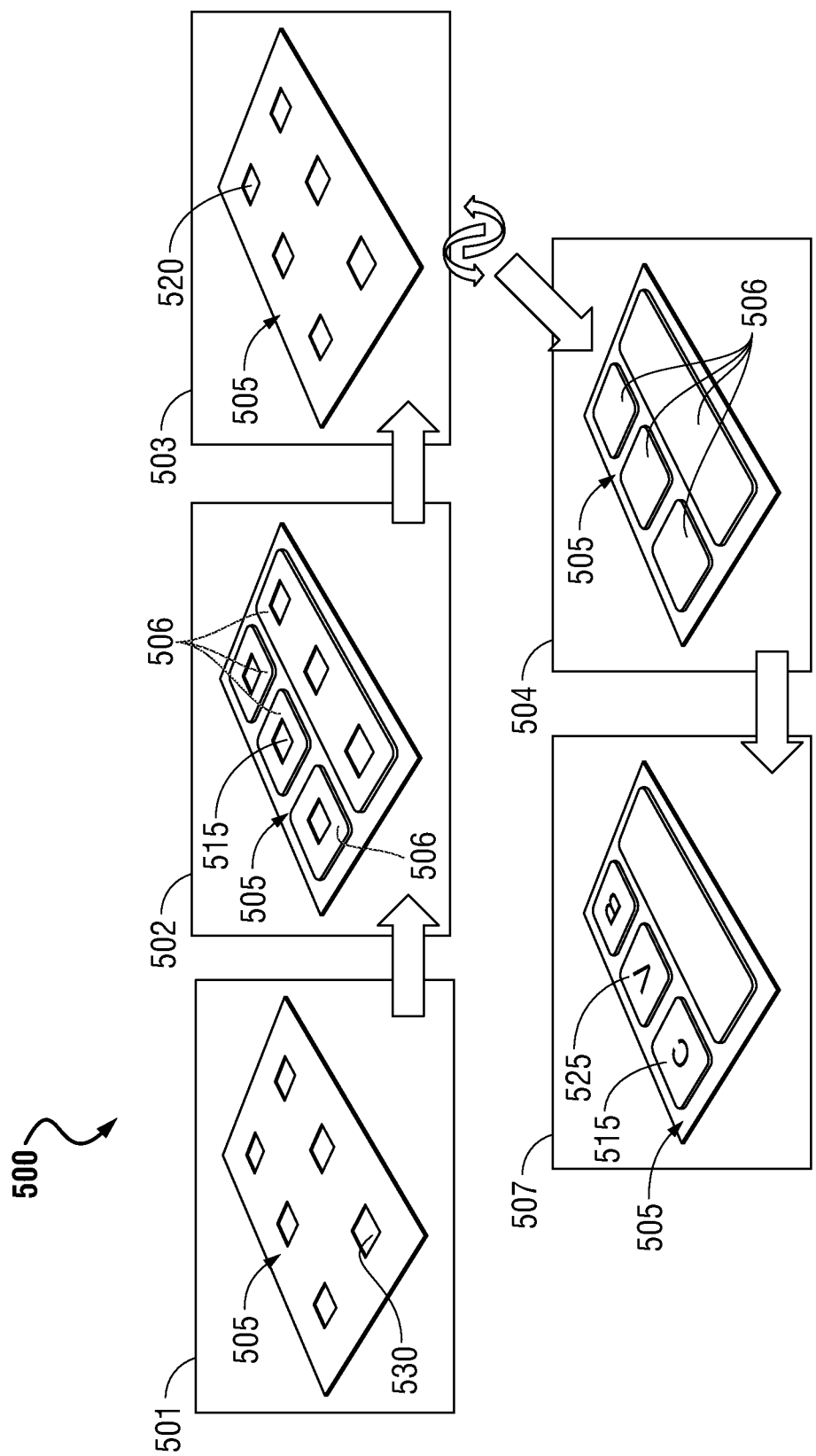
FIG. 5 is a series of sequential graphical views depicting a manufacture process of a coversheet of a keyboard according to an embodiment of the present disclosure.

FIG. 5 is a series of sequential graphical views 501, 502, 503, 504, and 507 depicting manufacture process 500 of a coversheet of a keyboard according to an embodiment of the present disclosure. The manufacture process 500 of the coversheet may be done so as to produce a layer that a user may come in contact with during use of the keyboard. In an embodiment, the shape of the coversheet may be such so as to conform to a user's finger.

The manufacture process 500 may begin at 501 with forming a number of holes 530 within a sheet of ABS 505. These holes may correlate with a number of keys on a keyboard. Although specific embodiments describe that the holes 530 are formed into a sheet of ABS 505, the present specification contemplates the use of other types of materials that are elastically resilient material that allows for deformation of the keyboard upon application of a force but provides for the return of the material to a pre-deformed state after that force is removed.

The manufacture process 500 may continue at 502 with injection molding a translucent ABS 515 through the holes 530 to form a raised portion as key pedestals 506 correlating with each of the number of keys on the keyboard. In a backside view of coversheet 505 shown in 503, the raised portions formed by the translucent ABS 515 may be machined away to form a number of runners 520 to accommodate for receipt of other layers of the keyboard. The manufacture process 500 may then include, on the top side of the coversheet 505 of ABS shown at 504, painting the coversheet 505 and key pedestals 506 a selected color. At 507, any number or type of graphics 525 may be painted or etched onto the surface of the coversheet on which the raised portions of the translucent ABS are formed into key pedestals 506. In an embodiment, the keyboard may be formed out of a plurality of sheets of ABS 505 subjected to the manufacture process 500 described herein. In an embodiment, a single sheet of ABS 505 may be subjected to the manufacture process 500 described herein to form all of the keys of the keyboard of a coversheet 505 a user is to interact with.

Figure 6:
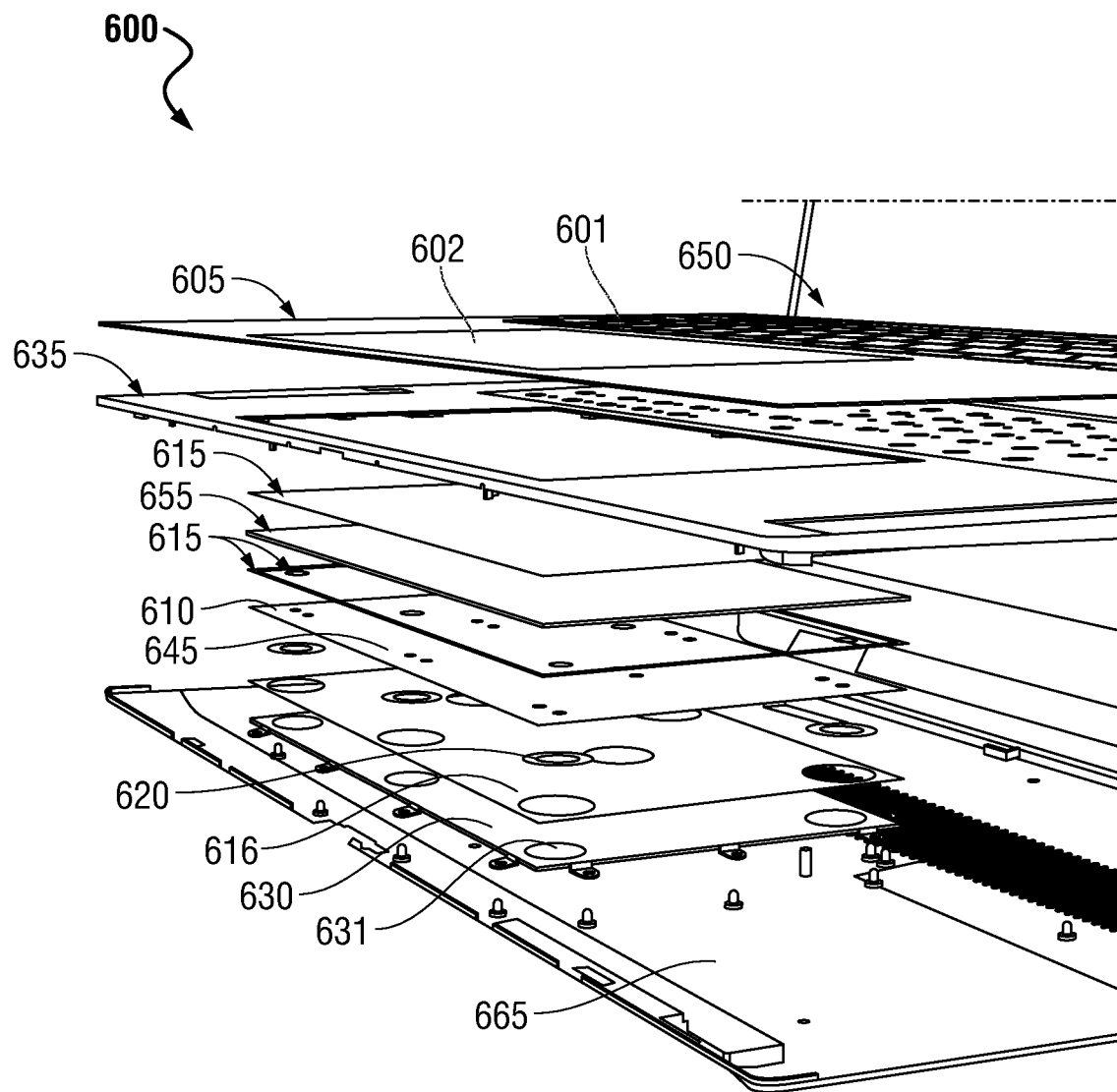
FIG. 6 is an exploded perspective view of a touchpad stack up for an information handling system according to another embodiment of the present disclosure.

FIG. 6 is an exploded perspective view of a touchpad stack up 600 of an information handling system according to another embodiment of the present disclosure. As described herein, the touchpad stack up 600 may also have a touchpad that implements the piezoelectric elements 620 described herein. The touchpad stack up 600 may represent an extended action touchpad according to embodiments herein. In other embodiments, the touchpad stack up 600 may have some portions of the touchpad interface area designated to operate at an extended action touchpad while other portions are not. The touchpad may be formed, in some embodiments, into a touchpad cover area 602 in coversheet layer 605. Coversheet 605 may also have a number of keys of a keyboard 601. Coversheet 605 may have one or both the haptic touchpad 602 and haptic keyboard 601 in some embodiments. In other embodiments, either the haptic touchpad 602 or keyboard 601 may be a conventional system. For example, a mechanical keyboard 601 may be implemented with a haptic touchpad 602. In another embodiment, the touchpad coversheet layer 605 may be separate from any other coversheet layer such as for the keyboard 601 or other portions of a C-cover.

The touchpad coversheet layer 605 with designated haptic touchpad area 602 may be made of any type of elastically resilient material. The elastically resilient material may allow, at least, a portion of the touchpad coversheet layer 605 to be deformed upon application of a pressure from a user's finger. Upon withdraw of the pressure from the user's finger, the material of the touchpad coversheet layer 605 is made of allows the touchpad coversheet layer 605 of the touchpad to bend back to its pre-deformed state. In an embodiment, the resilient material may allow the touchpad coversheet layer 605 at haptic touchpad 602 to travel a distance of between 0.01 mm and 2 mm.

The arrangement of the piezoelectric elements 620 for haptic touchpad 602 described herein is also shown in FIG. 6. In the embodiment shown in FIG. 6, piezoelectric elements 620 are placed in an array under the touchpad of the touchpad coversheet layer 605. The placement of the piezoelectric elements 620 in the array under the touchpad surface 602 of the touchpad coversheet layer 605 may include more or less than the number of piezoelectric elements 620 shown. As described herein, the operation of the touchpad may be dependent on the location and number of piezoelectric elements 620. During operation, a controller (not shown) similar to the controller described in connection with FIG. 4 may receive an electric charge from one or a plurality of piezoelectric elements 620 formed below and across the touchpad area 620 of coversheet layer 605 so that the controller may detect one or more piezoelectric elements 620 providing a signal depending on proximity underneath an x- and y-coordinate location of the actuation location on the touchpad by the user. The receipt of one or a plurality of electrical charges from these piezoelectric elements 620 may allow the controller to appropriately send a return haptic feedback control signal to any of the piezoelectric elements 620 so that the user may detect a haptic feedback at the location where the user has actuated the haptic touchpad 602 of the coversheet layer 605. In embodiments herein, the one or more piezoelectric elements 620 under an extended action touchpad area may generate an electrical charge actuation signal of varying magnitude depending on the magnitude of charge which may correspond to mechanical stress applied to deflect the one or more piezoelectric elements. The controller may receive the electrical charge actuation signal and determine whether the actuation signal falls within any of two or more threshold ranges similar to embodiments described herein. In some embodiments, the threshold range reached may correspond to a function or a character designated for that level. Further, the threshold range reached may also determine the type of haptic feedback returned to the haptic touchpad actuation location via the actuated piezoelectric element or elements. This type of haptic feedback may indicate which level of function or character selected by the downward force applied to actuate the extended action touchpad in embodiments herein.

The coversheet 605 with haptic touchpad 602 may further include a C-cover substructure 635. The C-cover substructure 635 may be made of a rigid material that prevents little or no movement. The rigidity of the C-cover substructure 635 allows the other layers within the touchpad stack up 600 to be maintained within the information handling system. In an embodiment, the C-cover substructure 635 may be made to a metal.

The touchpad stack up 600, in an embodiment, may further include any number of adhesive layers 615. In an embodiment, a first adhesive layer 615 may mechanically couple the touchpad coversheet layer 605 to a capacitive touch layer 655. The capacitive touch layer 655 may be made of a rigid material such as a glass, biaxially-oriented polyethylene terephthalate (BoPET) such as Mylar® produced by DUPONT®, or a glass-reinforced epoxy such as FR4 to serve a purpose as a stiffening layer as well. The capacitive touch layer 655 includes a grid of drive and sense lines to determine x- and y-touch locations on haptic touchpad 602 by a user. The capacitive touch layer 655 may be placed within the layers of the touchpad to distribute forces from a user's finger across the surface of the touchpad coversheet layer 605 and to the nearest or a plurality of nearest piezoelectric elements 620 in the array formed below and across the bottom surface of the haptic touchpad 602 of the coversheet layer 605 and capacitive touch layer 655. The stiffening function of the capacitive touch stiffening layer 655 is an optional embodiment as a rigidity of the haptic touchpad 602 may be provided by other layers as well in other embodiments.

The first adhesive layer 615 may be include the placement of the adhesive at locations that may enhance the movement and prevent the hinderance of the actuation of the touchpad coversheet layer 605 at those locations across the touchpad coversheet layer 605 where piezoelectric elements 620 are present. In a specific embodiment, the first adhesive layer 615 may include placing the adhesive along borders of each of the piezoelectric elements 620 as well as placing the adhesive at a central location of each of the piezoelectric elements 620.

The contact foil layer 610 adhered to the touchpad coversheet layer 605 via the first adhesive layer 615 may be made of any elastically resilient material that, when any given location at the touchpad coversheet layer 605 is actuated or the contact foil layer 610 is bent towards a lower portion of the respective location, returns to its original state when the respective location is no longer being actuated.

In an embodiment, the contact foil layer 610 or the capacitive touch layer 655 may include a capacitive touch layer x and y grid that detects and measures anything that is conductive such as a user's finger. The drive lines and sense lines may be a grid of indium tin oxide (ITO) or other conductive materials arranged to detect capacitive changes at x and y locations across the capacitive touch layer that correspond to the touch interface cover layer of the haptic touchpad 602. The capacitive touch layer 655 may be a printed circuit board (PCB) layer for the detection of the user's finger at an x- and y-coordinate location across the surface of the area of the haptic touchpad 602 of the coversheet layer 605. The capacitive touch layer 655 may be an array of drive lines and sense lines of ITO formed on the capacitive touch stiffening layer 655 or on the contact foil 610 in an embodiment. Drive lines and sense lines may be operatively coupled to a capacitive touch controller for determining x- and y-location of touches on the haptic touchpad 602. The capacitive touch layer can be part of the contact foil layer 610, or the its own contact touch layer 655, or part of a stiffener layer in various embodiments.

The contact foil layer 610 may include a number of metal traces 645 formed thereon that electrically and communicatively couples each of the locations and corresponding piezoelectric elements 620 to a controller (not shown) of an information handling system that includes a haptic feedback touchpad 602 control system such as described in connection with FIG. 1. Traces may be opposite the capacitive touch layer on contact foil layer 610 in an embodiment. In an embodiment, the controller may be a dedicated controller communicatively coupled to the contact foil layer 610 so as to detect a variety of levels of electrical charges from the piezoelectric elements 620 and provide one of a plurality of types of haptic feedback control signals back to the respective piezoelectric elements 620. In an alternative embodiment, the controller may be a processor of the information handling system that, among other computations and execution of other computer readable program code, also executes computer readable program code associated with the haptic feedback keyboard control system as described in FIG. 1.

During operation of the touchpad, the contact foil layer 610 may receive an electrical charge from one or a plurality of piezoelectric elements 620 operatively coupled underneath the metal traces 645 that conduct the electrical charge at a varying magnitude level to the controller associated with the keyboard 600. The metal traces 645 formed on the contact foil layer 610 may further be used to conduct a return haptic feedback control signal associated with a corresponding type of haptic feedback to the level selected from the controller to the piezoelectric elements 620 so that the voltage and current of the return haptic feedback control signal may cause the piezoelectric elements 620 to return to a type of haptic feedback event to the touchpad actuation area 602 that corresponds to the level selected by the actuation. This haptic feedback event of the actuated piezoelectric elements 620 may cause a haptic feedback presented at the actuation location along the touchpad coversheet layer 605 that the user may feel. As described, the response haptic feedback control signal may be a sine wave, a square wave, a pulsed signal or other variations of voltage or polarity changes to generate a warping of a metal plate for the haptic feedback event. This haptic feedback may be relayed to the user within microseconds of the user actuating a location on the touchpad area 602 of the coversheet layer 605 such that the user physically detects a sensation that the touchpad coversheet layer 605 was pressed. This sensation felt by the user may be present, despite no actual mechanical devices, such as a click switch mechanism, a touchpad trigger, or other types of touchpad mechanical devices being present among the layers of the touchpad stack up 600. The haptic event in particular may feel like a click, a deeper click, or multiple clicks similar to a mechanical switch click upon a press for selection by a user in some various embodiments of types of haptic feedback.

The touchpad stack up 600 may further include a second adhesive layer 616 that mechanically couples the contact foil layer 610 to a support plate 630. In an embodiment, the second adhesive layer 616 may include an adhesive that includes the placement of an adhesive along borders of each piezoelectric element 620. As shown in FIG. 6, the second adhesive layer 616 includes circular voids that conform to a shape of each piezoelectric element 620 placed below the touchpad area 602 of the coversheet layer 605.

The support plate 630 may be made of rigid material such as a metal. The support plate 630 prevents deformation of the touchpad stack up 600 except for, in some embodiments, actuation levels of deformation at the contact foil layer 610, piezoelectric elements 620, the first adhesive layer 615, second adhesive layer 616, and other relevant layers as described. As such, the contact foil layer 610 may be allowed to detect the deformation of the piezoelectric elements 620. Additionally, a user using the touchpad stack up 600 may feel a level of rigidity in the area of the haptic touchpad 602 that the user actuates with the piezoelectric elements 620 providing a haptic event to mimic the deformation to occur when pressure is applied.

In an embodiment, the support plate 630 may include a number of cavities 631 formed therein. The cavities 631 may be sized to have a relatively smaller diameter than the diameter of each of the respective piezoelectric elements 620. By including these cavities 631, the piezoelectric elements 620 may be allowed to be deformed into the cavities 631 so that the deformation of the piezoelectric elements 620 creates the electrical charge described herein to detect actuation. The depth of the cavities 631 may also be selected to allow for at least a central portion of each piezoelectric elements 620 to be deflected into the cavities 631 some distance. This distance of deflection, in an embodiment, may be 0.1 mm or smaller or greater according to embodiments herein.

In an embodiment, the support plate 630 may be secured to other rigid elements of the information handling system. In an embodiment, the support plate 630 may be secured to the C-cover substructure 635 via a number of bolts, screws, or other mechanical or chemical coupling device. In some embodiments, the support plate 630 may be a part of the D-cover of the information handling system.

Figure 8:
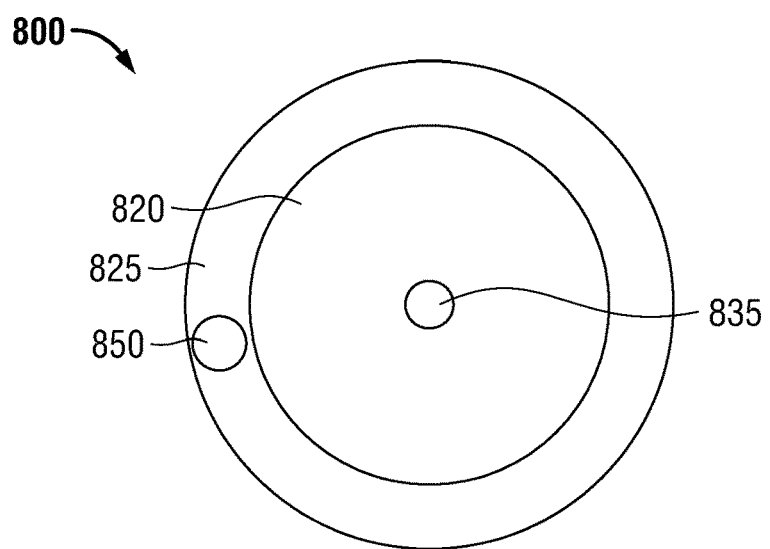
FIG. 8 is a top view of a piezoelectric element according to an embodiment of the present disclosure.

Each of the piezoelectric elements 620 may include a layer of piezoelectric material and a conductive metal plate layer as described herein in connection with the larger figures describing the keys in FIGS. 3A and 3B, in FIG. 8, and in other embodiments herein. Additionally, each piezoelectric element 620 of the touchpad stack up 600 may be operatively coupled to at least one metal trace 645 formed on the contact foil layer 610 via a contact point such as a solder point. In this embodiment, the conductive metal plate and the piezoelectric materials of the piezoelectric elements 620 may each be operatively coupled to at least one metal trace 645 formed on the contact foil layer 610 via a contact point such as a solder point. Thus, the contact foil layer 610 may, in an embodiment, include two metal traces 645 for each piezoelectric element 620 formed in the keyboard 600.

During operation of the touchpad of the keyboard 600, a user may actuate a location across the touchpad area 602 of the coversheet layer 605 by pressing down on that location of the touchpad coversheet layer 605. As a result of the mechanical stress placed on the location of the touchpad area 602 of the coversheet layer 605, one or more piezoelectric materials of the piezoelectric elements 620 associated with a location or neighboring locations of the actuation location may be compressed. This compression of the piezoelectric element 620 may create an electric charge indicating actuation. In some embodiments, this electrical charge actuation signal may have varying magnitude or multiple levels corresponding to the level of compression applied to the one or more piezoelectric elements. The electrical charge is carried to one or more metal traces 645 coupled to the piezoelectric elements 620 via contact points such as solder points. The electric charge received at the metal trace 645 may be conducted to a controller (not shown) by the metal traces 645 as described herein. In this embodiment, the controller may detect that electrical charge produced by the mechanical stress of the piezoelectric material of the piezoelectric element 620 indicating actuation and where the actuation occurred. Further, the level or magnitude of the electrical charge received may be interpreted to determine a level of function or alphanumeric character associated with an interface area of an extended action touchpad area in some embodiments. Then the controller may send a haptic feedback control signal back to the piezoelectric material of the piezoelectric element 620. This electrical response signal may have a certain voltage, current, and polarity sufficient to cause a stretching or contraction response to generate a haptic feedback event as described in various embodiments herein. Further, in some embodiments, several types of haptic feedback events may be generated at an actuation location of an extended action touchpad area to indicate a level of function or character selection selected by the pressure applied to the extended action touchpad. The haptic feedback control signal from the controller may follow the same metal traces 645 back to the given piezoelectric element 620. The haptic feedback control signal may be received at a conductive layer of the piezoelectric element 620 via, for example, the contact points such as the solder points. As a result of the piezoelectric material may be made rigid and the piezoelectric element 620 may return back to a non-deformed state thereby creating haptic feedback felt by the user's finger. This haptic feedback effect may be a click mimicking a mechanical click switch. At a second level of pressure applied to correspond to a second function or character selection, a deeper click, a double click or more clicks, or a vibration or tone accompanying the click may be the second level type of haptic feedback effect in some embodiments. In an embodiment, the relay of the electrical charge to the controller, the detection of the controller of the electrical charge, and the return of the haptic feedback control signal by the controller to the piezoelectric element 620 may be sufficiently quick enough for the user to feel the haptic feedback in a manner that the user does not detect any temporal delay between the actuation touchpad coversheet layer 605 and the detection of the haptic feedback created at the or a plurality of piezoelectric elements 620. In an embodiment, the relay of the electrical charge to the controller, the detection of the controller of the electrical charge, and the return of the haptic feedback control signal by the controller to the piezoelectric element 620 may be on the order of microseconds.

Unlike the individual keys of described in connection with the haptic keyboard of FIGS. 3A and 3B, however, the individual piezoelectric elements 620 may cooperate within the array to create the haptic feedback felt by the user at the touchpad coversheet layer 605. In some specific embodiments, the location of actuation by the user may be detected by the capacitive touch layer (either integrated into the contact foil layer 610, a separate capacitive touch layer 655, or with a stiffening layer) to indicate to the controller which piezoelectric elements 620 should receive a return haptic feedback control signal. Along with the receipt of an electrical charge from the piezoelectric elements 620, the controller may cause that all or a portion of the touchpad area forming the coversheet layer 605 receive haptic feedback. In some embodiments, the haptic touchpad area 602 may be divided up and marked or designated as extended action touchpad areas of different sets of functions or character for auxiliary keys that may be designated with the right level of actuation, and some touchpad areas that are not extended action touchpad areas in various embodiments. This may allow the haptic feedback to be felt by the user across the entire surface of the touchpad area 602 of the coversheet layer 605, across a left side of the touchpad area 602 of the coversheet layer 605, across a right side of the touchpad area 602 of the coversheet layer 605, across a top portion of the touchpad area 602 of the coversheet layer 605, across a bottom portion of the touchpad area 602 of the coversheet layer 605, or any specific area across the surface of the touchpad area 602 of the coversheet layer 605. In some embodiments, only a piezoelectric element 620 directly under the touch location or only piezoelectric elements 620 next to the nearest piezoelectric element 620 under the touch location may provide a haptic feedback event. Along with the capacitive touch layer, the piezoelectric elements 620 may allow a user to have the user's touch be detected at the touchpad while actuation, at any location across the surface of the touchpad coversheet layer 605 provides haptic feedback to the user so that the user can engage in a "click" action at the touchpad such as when selecting an item on a graphical user interface or a second level haptic feedback type when invoking a second level function or character.

In an embodiment, the keyboard 600 may, once the layers described herein are coupled together, may be placed within the C-cover 635 with a D-cover 665 coupled thereto. The assembly of the coversheet 605, C-cover substructure 635, and the D-cover 665 forms a base chassis of the information handling system. In an embodiment, the base chassis may be coupled to a display chassis 650 that may include a display device. The touchpad stack up 600 described herein may allow the user to provide input to the display device of the display chassis using the capacitive touch layer, the piezoelectric elements 620 determining actuation, and the haptic feedback capabilities associated with the piezoelectric elements 620. By way of example, the capacitive touch layer may allow a user to move a cursor across the screen. In these examples, actuation of the touchpad coversheet layer 605 at a location across the touchpad coversheet layer 605 causes an item to be selected that is represented on the display device. This "click" action may provide similar input to the processor of the information handling system similar to that of a mouse click.

Figure 7:
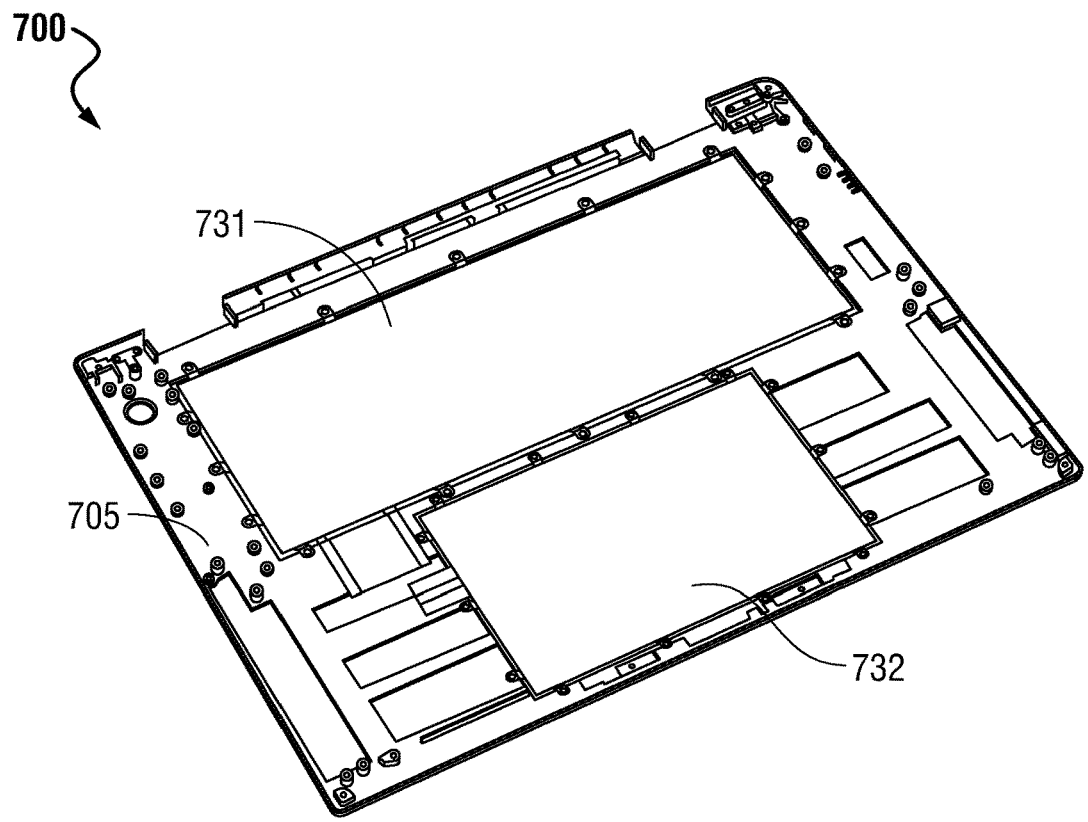
FIG. 7 is back perspective view of a C-cover of an information handling system according to an embodiment of the present disclosure.

FIG. 7 is back perspective view of a C-cover 705 of an information handling system 700 according to an embodiment of the present disclosure. The C-cover 705 may be used to house a keyboard and touchpad as described herein. As also described, each of the keyboard and touchpad may include a support plate 731 and 732, respectively. In an embodiment, a single support plate may be used to support one or more of the keyboard piezoelectric assemblies described in connection with FIGS. 3A-3E and FIG. 4 or the touchpad piezoelectric assembly described in connection with FIG. 6. In an alternative embodiment, the keyboard piezoelectric assemblies and the touchpad piezoelectric assembly may each include their own support plate 731 and 732, respectively. The support plates of the C-cover 705 shown may increase the stiffness of the haptic keyboard and touchpad described herein because the support plates 731 and 732 may be firmly fixed to the C-cover 705. This may enhance the perceived quality of the information handling system while still having a haptic feedback method and system that allows the user to feel as if an actuation of a key or touchpad has occurred. Still further, the haptic feedback systems described herein creates a keyboard or touchpad that feels like a mechanical keyboard vastly reduces physical key travel. Additionally, the construction of the haptic feedback systems described herein results in a much thinner and simpler keyboard and touchpad than that of a mechanical keyboard or touchpad enabling a thinner information handling system in some embodiments. With the reduction in space occupied by the haptic feedback keyboard and touchpad, space within the information handling system base chassis may be increased for use by other, additional, or larger components within the information handling system. In a specific example embodiment, the additional space provided within the information handling system due to the use of a haptic feedback keyboard and touchpad results in the ability to increase the size of a battery used to power the information handling system.

As shown in FIG. 7, the C-cover 705 may include both a piezoelectric keyboard portion secured to the C-cover 705 by a first support plate 731 and a touchpad portion being secured to the C-cover 705 by a second support plate 732. In an embodiment, it is contemplated that the touchpad and keyboard as described herein may be secured to the C-cover 705 by a single support plate that combines 731 and 732. In these embodiments, the keyboard and touchpad may both be operated using the piezoelectric elements as described herein.

FIG. 8 is a top view of a piezoelectric element 800 according to an embodiment of the present disclosure. As described, the piezoelectric element 800 may be incorporated into a key of the keyboard or a touchpad. In the embodiments described herein, any number of piezoelectric elements 800 may be incorporated into the information handling system so as to provide haptic feedback to a user.

In an embodiment, the piezoelectric element 800 includes a layer of piezoelectric material 820. This layer of piezoelectric material 820 may be made of any piezoelectric material including crystals, ceramics, biological matter, protein layers, among other types of materials. For ease of explanation, the layer of piezoelectric material 820 may be made of a ceramic or a crystal material although the present specification contemplates the use of other types of materials in different embodiments.

As described herein, the layer of piezoelectric material 820 may be operatively, and more specifically, electrically coupled to both a contact foil layer and the metal conductive layer 825. In an embodiment, the layer of piezoelectric material 820 may be electrically coupled to the contact foil layer via a first electrical contact point 835. The first electrical contact point 835 may, in an embodiment, be a soldering point that couples the layer of piezoelectric material 820 to a metal trace formed on the contact foil layer. The metal conductive layer 825 may be a brass metal plate or ring. Metal conductive layer 825 may be electrically coupled to a trace on the contact foil layer via a second electrical contact point 850. First and second electrical contact points 835 and 850 may be a solder point in an example embodiment. Under application of a mechanical stress on the layer of piezoelectric material 820 resulting from a user actuating a coversheet layer above the piezoelectric element 800, the layer of piezoelectric material 820 may create an electrical charge on metal conductor layer as it is deformed or compressed, for example, into a cavity disposed below the piezoelectric element 800. The electrical charge may be of varying magnitude or levels and correspond to an amount of mechanical stress causing deformation of the piezoelectric element depicted. This electrical charge may be passed to the metal traces via the first electrical contact point 835 and second electrical contact point 850 and may be conducted to a controller as described herein.

Upon detection of the electrical charge from the layer of piezoelectric material 820, the controller may send a haptic feedback control signal to the piezoelectric material layer 820 and the conductive layer 825 via metal traces formed on the contact foil layer. The haptic feedback control signal from the controller may be a variety of electrical response signals as described herein to cause the layer of piezoelectric material 820 to return a haptic feedback event. The haptic feedback event may be felt by a user who caused the deformation of the layer of piezoelectric material 820 of the piezoelectric element 800 during the actuation of a key on a keyboard or a location on the touchpad.

Although FIG. 8 shows a specific shape and size of the piezoelectric element 800 and conductive layer 825, the present specification contemplates that the piezoelectric element 800 may take on other forms and shapes as would serve a specific purpose in the operation of a keyboard or touchpad described herein.

Figure 9:
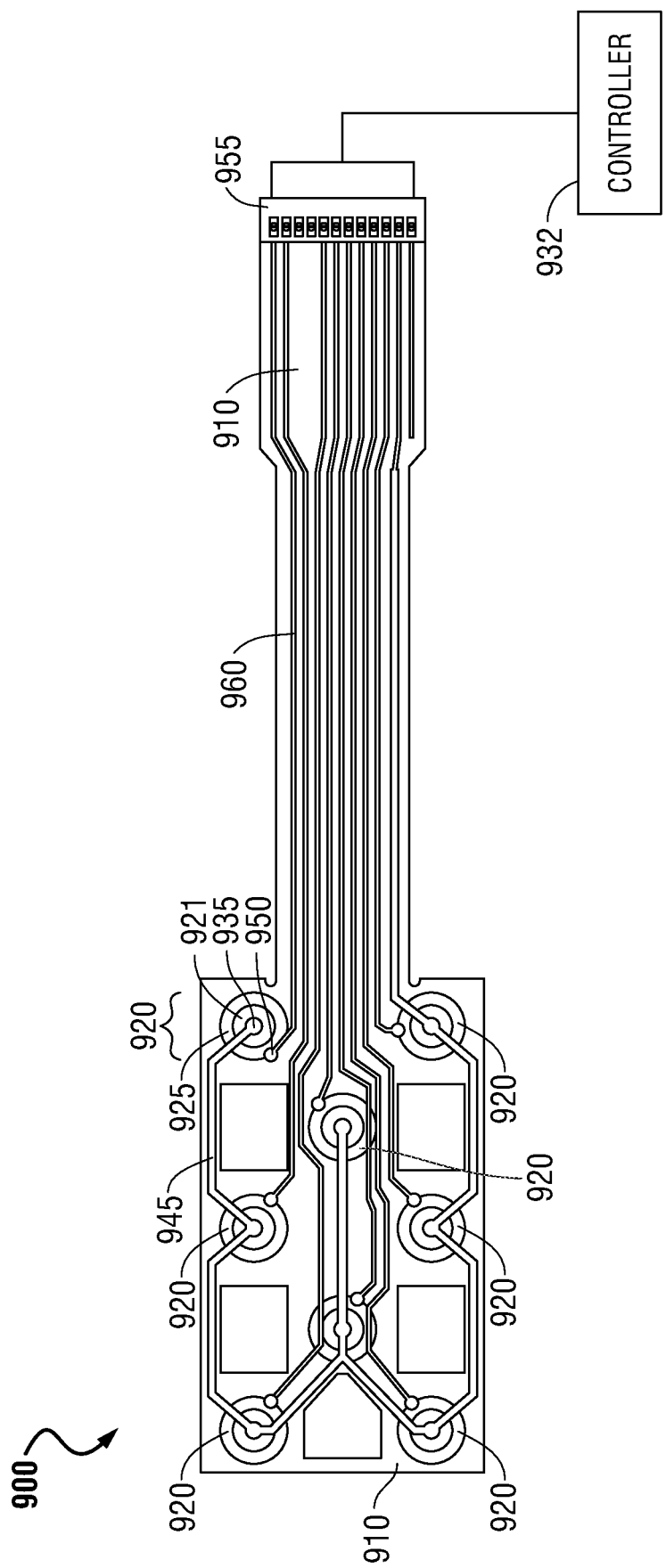
FIG. 9 is a top view of a contact foil of a touchpad for an information handling system embodiment of the present disclosure.

FIG. 9 is a top view of a contact foil layer 900 of a keyboard of an information handling system embodiment of the present disclosure. As described herein, the contact foil layer 900 may include a contact foil 910 may be made of any elastically resilient material that, when any given key or location on the touchpad is actuated or the contact foil 910 is bent, the contact foil 910 returns to its original state when the contact foil 910 is no longer subjected to a force used to bend the contact foil 910. Contact foil layer 900 may be a flexible printed circuit layer in an example embodiment.

The contact foil 910 of the contact foil layer 900 may be used to communicatively and electrically couple one or more piezoelectric elements 920 to a processor or other controller. As described herein, the piezoelectric elements 920 may be electrically coupled to a number of metal traces via a first metal trace 945 and a second metal trace 960. In a specific embodiment, a piezoelectric layer 921 of the piezoelectric elements 920 may be electrically coupled to the first metal trace 945 via a first electrical contact point 935. Similarly, a conductive metal plate layer 925 of the piezoelectric elements 920 may be electrically coupled to the second metal trace 960 via a second electrical contact point 950. The first electrical contact point 935 and second electrical contact point 950 may be, in an embodiment, a solder point.

The contact foil layer 900 may further include a serial communication coupling device 955. The serial communication coupling device 955 may communicatively couple the first metal trace 945 and second metal trace 960, among other metal traces associated with each piezoelectric elements 920, to a processor or controller 932 for processing of electrical charges received from the piezoelectric layer 921 according to the embodiments described herein.

Figure 10:
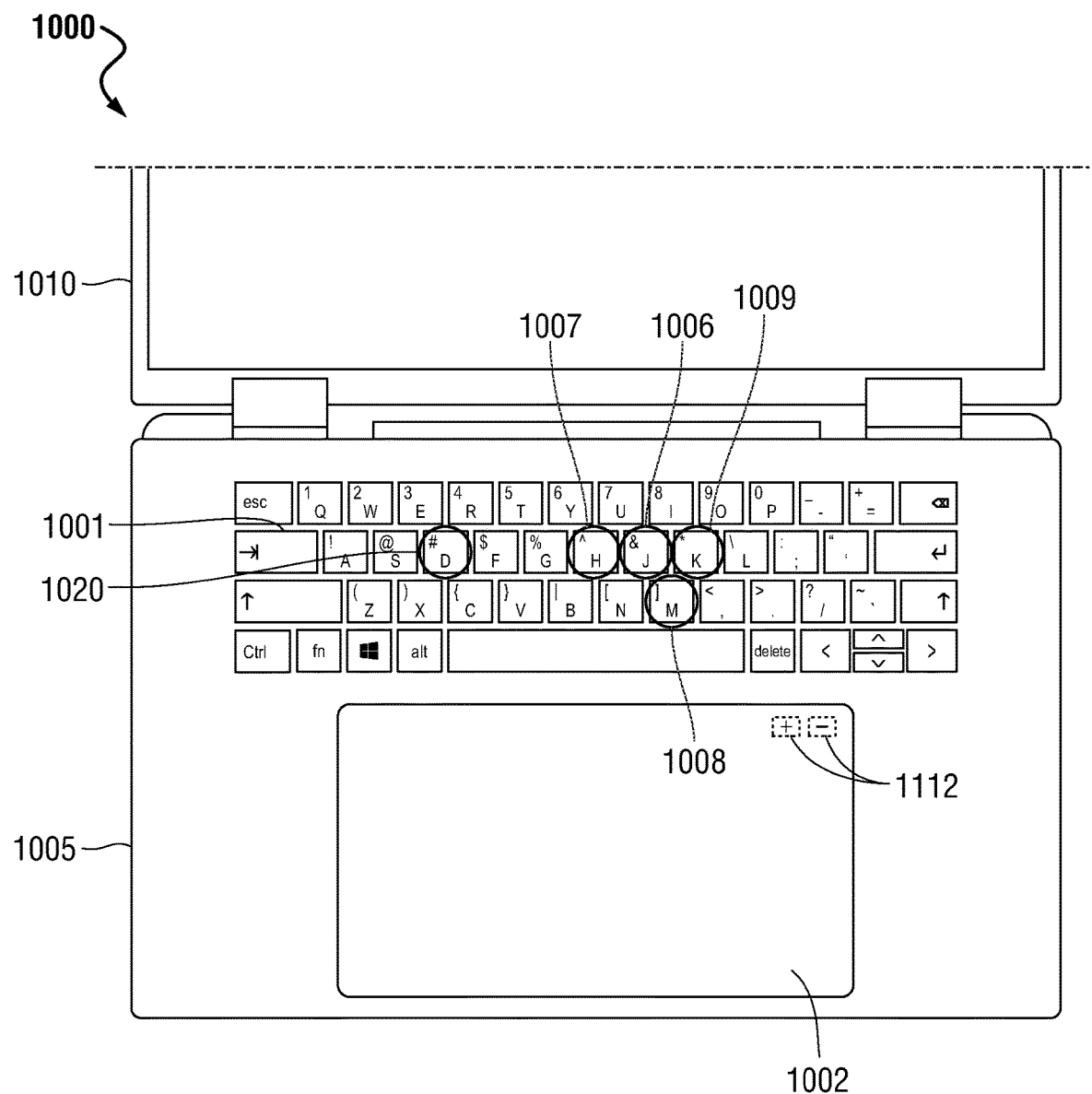
FIG. 10 is a perspective graphical diagram of an information handling system illustrating an optional keyboard layout with extended key actions or modified key function according to an embodiment of the present disclosure.

FIG. 10 is a perspective graphical diagram of an information handling system 1000 with a haptic feedback keyboard 1001 and a haptic touchpad interface 1002 depicting an optional, optimized key layout according to an example embodiment of the present disclosure. Although FIG. 10 depicts the information handling system 1000 as being implemented in a laptop computing device, FIG. 10 is not meant to be limiting and the present specification contemplates that the use of optional key layouts of a haptic keyboard 1001, such as the one shown, with other types of information handling system as described. Other types of information handling systems may include smaller form factor information handling systems that may benefit from a more efficient layout of keys while still providing a full keyboard functionality or implementation of a haptic typing assistance system according to embodiments herein by utilizing extended action keys or extended action touchpad which may provide auxiliary keys 1012 at a designated extended action touchpad area of touchpad 1002 in some embodiments.

In the example of FIG. 10, the information handling system may include a screen portion 1010 and a keyboard portion 1001 and touchpad portion 1002 on a base chassis 1005. The screen portion 1010 may include any device that may present to a user any visual data as output to a user in response to input and execution of the instructions, parameters, and profiles 124 by the processor 102 described in connection with FIG. 1 which may reside in the base chassis 1005. In an example embodiment, a graphical user interface may be presented to a user to input any number of parameters descriptive of the actuation force level used to actuate any number of extended action keys 1020 including extended action keys such as 1006, 1007, 1008 and 1020 on the keyboard portion 1001 of the information handling system, an actuation force at a location on an extended action touchpad 202, or both. The graphical user interface (GUI) may also be used to receive other settings including actuation of any type of haptic feedback, for example a "click," when selecting items on display such as selecting a suggested word or letter anticipated by the haptic typing assistance system or such as selectin via a cursor using haptic touchpad 1002. The graphical user interface (GUI) may further be used to set the force required for actuation, setting multiple-levels of force and operations associated with those levels, and selection of magnitude, pattern, or other characteristics of the haptic response by any key of the keyboard 1001, or touchpad 1002.

The keyboard portion 1001 may include any number of keys, such as extended action keys, arranged in any manner so as to receive input from a user via selective actuation of those keys including varying levels of applied force to select among levels of functions or alphanumeric characters associated with extended action keys. In one example embodiment, the keys 1020 may be arranged in a more optimized key layout due to the use of one or more extended action keys. For example, the keyboard 1001 may be an optimized a QWERTY-type keyboard layout or any other alphabetic, symbolic, or numeric layout. As compared to the QWERTY-type keyboard depicted in FIG. 2, the layout of keyboard 1001 of FIG. 10, the one or more extended action keys may be used to streamline the number or layout of the keys may be more streamline including eliminating the row of function keys, eliminating the row of number keys, and eliminating volume up, volume down, page up, page down keys, caps lock keys, or other keys whose function may be rolled into one or more extended action keys 1020 or into auxiliary keys 1012 in designated extended action touchpad areas. In such embodiments, an optimized keyboard layout may be utilized to increase available space on a C-cover for the touchpad 1002 or provide for smaller information handling systems to have fuller function keyboards.

In other embodiments, the extended action keys may be utilized for haptic smart typing assistance functions with coordination with the haptic smart typing assistance system of embodiments described herein. For example, extended action key 1006 may include the letter j as well as extended action at a second level of actuation to select "&". However, the extended action at the second level or even a third level of hard press may generate a selection of the remainder of an anticipated word determined by the haptic smart typing assistance system in an embodiment. In another example embodiment, if the "j" of key 1007 is correct, a hard press to a second level or a deeper level may correct a typographical error made from selecting a different letter such as an "h" with key 1007, an "m" with key 1008, or a "k" with key 1009. The correction with the deep press of the "j" key 1007 may occur without needing to delete the errant letter selection or backspace. For example, the haptic smart typing assistance system may detect that the user is typing a character string "ad_". The haptic smart typing assistance system may determine one or more letters may be an anticipated next character "_". For example, the haptic smart typing assistance system may anticipate a "j" and may determine an anticipated word being typed to be "adjust" or "adjustment" in an example embodiment. The letter "j" may have a higher likelihood than selection of the letter "m" at key 1008 or the letter "h" at key 1007. In example embodiments, although those letters at keys 1008 and 1007 may be used in words such as "admonish" or "adhere," those words may be substantially less frequently used than words beginning with "adj_." Additionally, the "k" key 1009 may not have a known word or is very unlikely to be used with a word starting with "adk."

In another embodiment, more than one anticipated next character and anticipated words being typed may be designated by the haptic smart typing assistance system. For example, the letter "d" at key 1020 may be an alternative anticipated next character. The haptic smart typing assistance system may associate the character "d" with an anticipated word to be typed such as "add", "additive," "addicted" or other in an example embodiment. Thus, the user may select either key 1006 or 1020 as correct options in an embodiment. If other keys are selected, at some point the haptic smart typing assistance system may generate a different type of haptic feedback indicating that a typographical error has occurred or is occurring. In the context of the phrase of the typed character string, the haptic smart typing assistance system may determine that a "j" and that key 1007 is likely the correct key over other keys adjacent to key 1007. This may be especially true if another letter such as a "u" is selected after "j". In embodiments herein, the haptic smart typing assistance system may determine that if an "h" or an "m" is selected that a typographical error has occurred or is about to occur if keys 1007, 1008, or 1009 are actuated.

In some embodiments, the haptic smart typing assistance system may determine that a typographical error has occurred after keys 1007, 1008, or 1009 have been actuated and provide a haptic feedback response to the errant key actuated that indicates an error is determined to have occurred. In other embodiments, the haptic smart typing assistance system may anticipate that an errant keystrike may occur at keys 1007, 1008, or 1009. The haptic smart typing assistance system may anticipate the word being typed or one or more likely words being typed. In addition, the haptic smart typing assistance system may determine, accordingly, what is the anticipated next character. This may be done via autofill algorithms or typographical or grammatical error detection algorithms for various languages that may be typed as input to a software application at the information handling system.

In embodiments where the haptic smart typing assistance system anticipate that an errant keystrike may occur at keys 1007, 1008, or 1009, a determination of an anticipated next word being typed and anticipated next character may be determined for the currently typed text string. In some embodiments herein, the haptic smart typing assistance system may assess that keys nearby the anticipated next character haptic key are likely candidates for a typographical error to occur. In such embodiments, the haptic smart typing assistance system may send instructions to make those nearby keys more difficult to actuate and thereby guide or increase the likelihood that the next keystrike is the correct key for the anticipated next character of the word being typed. In an example embodiment, the typed character string "ad_" may yield anticipated next characters "j" or "d" by the haptic smart typing assistance system. Since, characters "h" at key 1007, the "m" at key 1008, and the "k" key at 1009 are less likely, the haptic smart typing assistance system may determine that required force to actuate keys 1007, 1008, or 1009 may be increased. The haptic smart typing assistance system may send an instruction to the haptic keyboard controller to increase the force required for actuation at keys 1007, 1008, or 1009. Similarly, the haptic smart typing assistance system may also send an instruction to the haptic keyboard controller to increase the force required at "n," "i," and "u" keys as well. In some embodiments, the haptic smart typing assistance system may also instruct that a type of error sound or tactile haptic feedback be generated at some or all of the keys nearby to key 1006. In other embodiments, since key 1007 and key 1008 may be actuated with intention and lead to words such as "adhere" or "admonish," actuation may be available at a higher force level but an error haptic feedback type may not be generated. On the other hand, in some embodiments an adjacent key 1009 for the letter "k" may both require more force to actuate as well as generate an error haptic feedback type since words with "adk_" are much less likely to be typed. Thus, the haptic keyboard 1001 of the present embodiments may be leveraged in increase communication of haptic tactile or sound feedback signals to a user from a haptic smart typing assistance system. Thus, the haptic smart typing assistance system may provide smart typing assistance through the haptic keyboard 1001 to increase ease and efficiency of typing with the haptic keyboard 1001 that may not be available with traditional mechanical actuation keyboards.

In yet other embodiments, the haptic smart typing assistance system may utilize the extended key action of the keys to achieve smart haptic typing assistance functions. For example, if a typographical or grammatical error is detected and a correct anticipated next character is determined, a deep press of the correct key may be utilized to correct the typographical or grammatical error without requiring a delete action or any backspacing requirements. In other embodiments, a deep press of an extended action key may be used to select a suggested remainder of a word being typed or a correct anticipated next word that is next in a phrase being typed. In some example embodiments, there may be a plurality of suggested anticipated words being typed or next words in a typed phrase. In such embodiments, a deep press of an extended action key to one or multiple threshold levels may be used to select among the remaining anticipated words being typed or anticipated next words in a phrase being typed. In this way, the haptic smart typing assistance system may leverage the extended action key functionality of the haptic keyboard 1001 to enable a plurality of haptic smart typing assistance functions that may be available through multilevel actuation of an extended action key of the haptic keyboard 1001 of embodiments herein.

In an embodiment, the keys 1020 may be any number of keys from 1 to infinity. The extended action keys 1020 of haptic keyboard 1001 and extended action touchpad 1002 including any auxiliary keys 1012 at designated extended action touchpad locations may operate according to the embodiments of operation described with respect to any of the figures or as described included herein.

Figure 11:
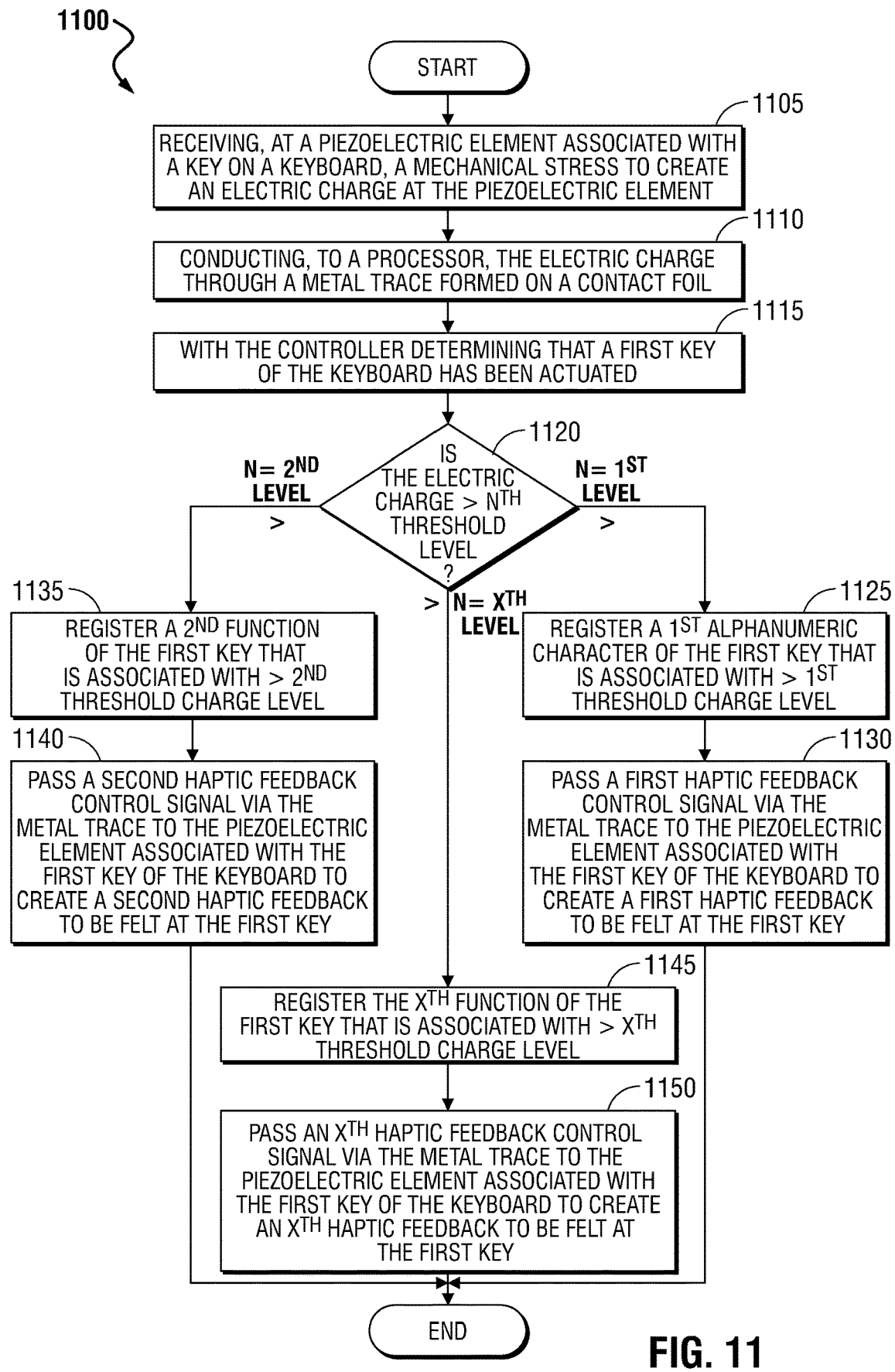
FIG. 11 is a flow diagram illustrating a method of operating a keyboard of an information handling system with extended key actions according to an embodiment of the present disclosure.

FIG. 11 is a flow diagram illustrating a method 1100 of operating a haptic keyboard of an information handling system according to an embodiment of the present disclosure. The method of operating a haptic keyboard of FIG. 11 may include operation of extended action keys of the haptic keyboard according to various embodiments herein. The operation of the extended action keys as described in FIG. 11 may be used to determine a key actuation for selection of one or more characters on a first level, and to determine a deep press at one or more levels to execute a haptic typing assistance function of the haptic smart typing assistance system of various embodiments described herein. The method 1100 describes the extended key actuation embodiments of one or more levels of a deep press of a key of a haptic keyboard. The deep press of the haptic keys may be used with the embodiments of the haptic smart typing assistance system as described in the present disclosure. The method 1100 may begin by receiving, at a piezoelectric element associated with a key on a keyboard, a mechanical stress to create an electric charge at the piezoelectric element at block 1105. As described herein, the actuation of the key of the keyboard causes a mechanical stress to be placed on a piezoelectric material layer of the piezoelectric elements. The deformation of the piezoelectric material layer results from the application of this mechanical stress which results in the creation of the electrical charge. Mechanical stress causes deformation of the piezoelectric elements into a cavity disposed below at a support plate supporting the structures of the piezoelectric elements thereby compressing the piezoelectric material within the metal disk layer to which it is adhered. According to embodiments herein involving an extended action key, the electric charge created by the mechanical stress may be proportional to an amount of mechanical stress received at the piezoelectric element associate with the extended action key. Thus, the greater level of actuation force applied to actuate the extended action key, the increased level of electric charge created. In this way, an increased level of force applied to the extended action key or a deeper key press may result in a higher charge level or magnitude generated at the piezoelectric element.

The method 1100 may continue, at block 1110, with conducting, to a controller or processor, the electrical charge through a metal trace formed on a contact foil. The contact foil may be operatively coupled to the piezoelectric device such that the charge formed at the piezoelectric device of various charge levels may be allowed to conduct through at least one metal trace formed thereon as an actuation signal to the controller or processor. In the embodiments described herein, two conductors are connected to the piezoelectric material layer and the metal disk layer to detect the electric charge actuation signal.

The method 1100 may continue at block 1115 with determining with the controller or processor, that a first extended action key of the keyboard has been actuated. The controller or processor may execute the haptic feedback keyboard and touchpad control system and coordinate with the haptic smart typing assistance system according to several embodiments herein. The determination that a first extended action key has been actuated may be made based on the electrical charge signal that the processor receives from one or more specific metal traces formed on the contact foil associated with the extended action key. Alternative embodiments may be used to allow the processor to determine where and from which key on the keyboard the electrical charge is received from. Further, the charge level or magnitude of the actuation signal received at the controller or processor may be assessed as well. The extended key action detection may be used to execute smart typing assist functions of the haptic smart typing assistance system executing on the information handling system according to various embodiments described herein.

Proceeding to decision block 1120, the controller or processor may determine the level or magnitude of the received electric charge actuation signal from the piezoelectric element to compare with a plurality (N) threshold ranges of charge magnitude that correspond to levels of pressure applied during actuation of the extended action key. For example, N threshold ranges may be available to be compared to the level of the electric charge actuation signal received at the controller. In an example embodiment, the N threshold ranges may correspond to N functions or alphanumeric characters available and associated with the extended action key. Each N levels of actuation depth or actuation signal charge level may correspond to N functions or characters in embodiments herein. For example, if the electric charge actuation signal reaches a first threshold level, but less than a second threshold level, at the controller, flow may proceed to box 1125. If the electric charge actuation signal passes a second threshold level, but is less than a next threshold level (e.g., a third level), if any, then the flow may proceed to box 1135. This may proceed up to a final Nth threshold level. The plurality of threshold levels may be set at two or any higher number. At the highest threshold level assessed at decision box 1120, if the electric charge actuation level exceeds the final Nth threshold level, then flow may proceed to box 1145. Each of the plurality of N threshold levels for electric charge may require a level of keypress depth on the extended action key involving increased keypress force to deflect the piezoelectric element a greater amount. Further, the N threshold levels may be associated with N types of haptic feedback to assist identifying which level has been selected and the N threshold levels may be correlated with N functions or alphanumeric characters selectable by the extended action key.

At 1125, if the electric charge actuation signal exceeds the first threshold but not the next threshold electric charge level, the received electric charge actuation signal is associated with a first level function or alphanumeric character of the extended action key. The first level selected alphanumeric character may be registered by the keyboard driver with the operating application program in some embodiments. In other embodiments, the first level selected function selected via the extended action key may be executed by the information handling system processor. In some embodiments, the selected first level function or alphanumeric character selection may also appear on a display screen as a character in a program such as a word processing program or as a GUI indicating a selected function.

Proceeding to 1130, the controller may pass a first level haptic feedback control signal back to the actuated piezoelectric element via the metal trace of the contact foil to the first extended action key of the haptic keyboard according to embodiments herein. The first level of haptic feedback control signal may cause the upward or downward warping of the piezoelectric element to exhibit the first level associated type of haptic feedback. As described herein, the haptic feedback results from the haptic feedback control signal, at a determined voltage, current, or polarity being applied to the piezoelectric material layer. The response signal may be a sine wave, a square wave, pulsed signal, or otherwise varied and modulated to create a haptic event of a key press for the user. Application of the haptic feedback control signal to the piezoelectric material layer causes the piezoelectric material layer to stretch, compress, or return to its non-deformed state in some embodiments.

This first type of haptic feedback may be felt by a user at the actuated first extended action key and may indicate which level of the extend actions is selected. For example, types of haptic feedback may include the stretched or compressed state of the piezoelectric material layer may create a haptic bump to be felt by the user at the extended action key actuated on the keyboard when the piezoelectric element metal plate layer is warped in response to the haptic feedback signal. In another example embodiment, changing polarity and voltage levels in any portion of a haptic feedback signal may cause an expansion of the piezoelectric material causing it to stretch and warp the metal plate layer into the underlying cavity to feel like a mechanical key drop. This may bottom out and then may be followed by a haptic feedback signal of polarity and voltage level to compress of the piezoelectric material and warp the metal plate away from the cavity to feel like a key return. In this way, a haptic event may mimic a mechanical keystroke at the actuated key on as feedback to a user's finger and may be a first type of haptic feedback to indicate a first level selected. Any combination of the above changes to the piezoelectric material may be generated by the haptic feedback signal for causing the metal plate to warp and generate the intended haptic feedback event to indicate a first level selection. The user actuation of the key to haptic feedback creation, may occur within microseconds of receiving an actuation signal. At this point the method may end, however it may be repeated for each extended action key keypress and for any extended action key among the haptic keyboard keys Returning to decision box 1120, if the electric charge actuation signal exceeds a second threshold but not the next threshold electric charge level if there are more than two levels, flow may proceed to box 1135. At 1135, the received electric charge actuation signal is associated with a second level function or alphanumeric character of the extended action key. For example, a second level function may be a smart typing assistance function described with respect to various embodiments of the haptic smart typing assistance system of the present disclosure. The second level selected alphanumeric character may be registered by the keyboard driver with the operating application program in some embodiments. In other embodiments, the second level selected function selected via the extended action key may be executed by the information handling system processor. In some embodiments, the selected second level function or alphanumeric character selection may also appear on a display screen as a character in a program such as a word processing program or as a GUI indicating a selected function.

Proceeding to 1140, the controller may pass a second level haptic feedback control signal back to the actuated piezoelectric element via the metal trace of the contact foil to the first extended action key of the haptic keyboard according to embodiments herein. The second level of haptic feedback control signal may cause the upward or downward warping of the piezoelectric element to exhibit the first level associated type of haptic feedback. As described herein, the haptic feedback results from the haptic feedback control signal, at a determined voltage, current, or polarity being applied to the piezoelectric material layer. The response signal may be a sine wave, a square wave, pulsed signal, or otherwise varied and modulated to create a haptic event of a key press for the user. Application of the haptic feedback control signal to the piezoelectric material layer causes the piezoelectric material layer to stretch, compress, or return to its non-deformed state in some embodiments.

This second type of haptic feedback may be felt by a user at the actuated first extended action key and may indicate which level of the extend actions is selected. For example, types of haptic feedback may include the stretched or compressed state of the piezoelectric material layer may create plural haptic bumps to be felt by the user at the extended action key actuated on the keyboard to indicate a second level has been selected with the applied keypress pressure level. The second level haptic feedback may be generated when the piezoelectric element metal plate layer is warped in response to a second haptic feedback control signal. In another example embodiment, changing polarity and voltage levels in any portion of a haptic feedback signal may cause an expansion of the piezoelectric material causing it to stretch and warp the metal plate layer into the underlying cavity to feel like a modified mechanical key drop which may pause, bump, click or otherwise indicate passing through a stage before continuing with the feeling of a keydrop. If the second level is the last level, this keydrop haptic feedback sensation may bottom out. The second type of haptic feedback may further follow with by a haptic feedback control signal portion of polarity and voltage level to compress of the piezoelectric material and warp the metal plate away from the cavity to feel like a key return. In this way, a haptic event may mimic a modified mechanical keystroke at the actuated key on as feedback to a user's finger to feel like a staged, "deeper" mechanical key actuation. This type or haptic feedback or any portion or modification may serve as a second type of haptic feedback to indicate a second level is selected. Any combination of the above changes to the piezoelectric material may be generated by the haptic feedback signal for causing the metal plate to warp and generate the intended haptic feedback event to indicate a second level selection in various embodiments. The user actuation of the key to haptic feedback creation, may occur within microseconds of receiving an actuation signal. At this point the method may end, however the method of FIG. 11 may be repeated for each extended action key keypress and for any extended action key among the haptic keyboard keys as referenced above.

Returning again to decision box 1120, if there are N=X threshold levels and X is a final threshold level that is greater than to, flow may proceed to box 1145 if the received electric charge level of the actuation signal exceeds the final N=Xth threshold level. As described above, embodiments herein contemplate two levels or any number of levels greater than two for the extended action key operations described in embodiments herein. For example, the haptic feedback keyboard and touchpad control system may reference a lookup table to determine which function or character is associated with an Nth level selection from among a plurality of functions or characters available with actuation of the extended action key in embodiments herein. For example, a Nth level function may be yet another smart typing assistance function described with respect to various embodiments of the haptic smart typing assistance system of the present disclosure. This may occur for any threshold level, whether the first level or the last level of all available selection levels for the extended action key.

At box 1145, if the electric charge actuation signal exceeded the N=Xth final threshold, the received electric charge actuation signal is associated with a last level function or alphanumeric character of the extended action key. The last (Xth) level selected alphanumeric character may be registered by the keyboard driver with the operating application program in some embodiments. In other embodiments, the last (Xth) level selected function selected via the extended action key may be executed by the information handling system processor. In some embodiments, the selected last (Xth) level function or alphanumeric character selection may also appear on a display screen as a character in a program such as a word processing program or as a GUI indicating a selected function.

Proceeding to 1150, the controller may pass a last (Xth) level haptic feedback control signal back to the actuated piezoelectric element via the metal trace of the contact foil to the first extended action key of the haptic keyboard according to embodiments herein. The last (Xth) level of haptic feedback control signal may cause the upward or downward warping of the piezoelectric element to exhibit the yet final level associated type of haptic feedback. As described herein, the haptic feedback results from the haptic feedback control signal, at a determined voltage, current, or polarity being applied to the piezoelectric material layer. The response signal may be a sine wave, a square wave, pulsed signal, or otherwise varied and modulated to create a haptic event of a key press for the user. Application of the haptic feedback control signal to the piezoelectric material layer causes the piezoelectric material layer to stretch, compress, or return to its non-deformed state in some embodiments.

This last (Xth) type of haptic feedback may be felt by a user at the actuated first extended action key and may indicate which level of the extend actions is selected. For example, types of haptic feedback may include the stretched or compressed state of the piezoelectric material layer may create a bust of haptic bumps or a vibration for a period of time to be felt by the user at the extended action key actuated on the keyboard and different, in some embodiments from other types of haptic feedback, The last (Xth) type of haptic feedback may be generated when the piezoelectric element metal plate layer is warped in response to the last (Xth) haptic feedback control signal. In another example embodiment, changing polarity and voltage levels in any portion of a haptic feedback signal may cause an expansion of the piezoelectric material causing it to stretch and warp the metal plate layer into the underlying cavity to feel like a mechanical key drop. This key drop feeling may proceed through several pauses, clicks, bumps or other stages such as X stages before reaching a final level in an example embodiment. The haptic feedback may bottom out and then may be followed by a haptic feedback signal of polarity and voltage level to compress of the piezoelectric material and warp the metal plate away from the cavity to feel like a key return. In this way, a haptic event may mimic a mechanical keystroke at the actuated key on as feedback to a user's finger and indicated stages of depth of a keypress. Such an example type of haptic feedback or any portion of the same may be the last (Xth) type of haptic feedback to indicate a last level is selected. Any combination of the above changes to the piezoelectric material may be generated by the haptic feedback signal for causing the metal plate to warp and generate the intended haptic feedback event to indicate a last (Xth) level selection. The user actuation of the key to haptic feedback creation, may occur within microseconds of receiving an actuation signal. At this point the method may end, but as described herein the process may be repeated for each extended action key keypress and for any extended action key among the haptic keyboard keys.

Figure 12:
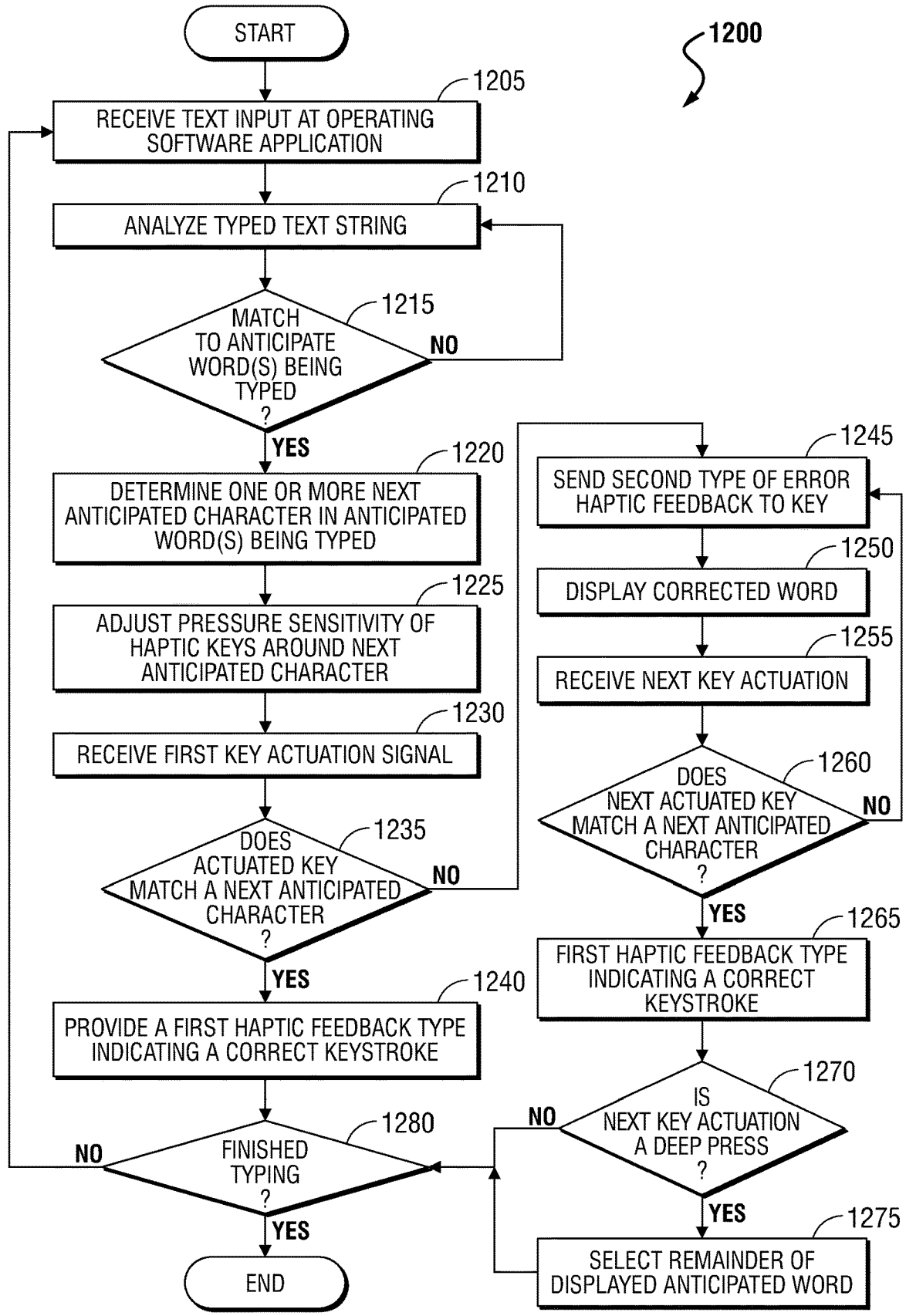
FIG. 12 is a flow diagram illustrating a method of operating a keyboard with haptic smart typing assistance system of an information handling system according to an embodiment of the present disclosure.

FIG. 12 is a flow diagram illustrating a method of operating a haptic keyboard and a haptic smart typing assistance system of an information handling system according to an embodiment of the present disclosure. The method may begin at block 1205, where, upon typing characters into an application software operating on the information handling system, the haptic smart typing assistance system may track the typing that occurs at the application software. For example, a user may be typing in a word processing software, in an email editing software, in a text editor software, on a web based application, inputting programming languages, conducting textual portions of a graphics program, filling in forms or form entries, or conducting other typing activity via the information handling system and the haptic keyboard of embodiments herein. The haptic smart typing assistance system may receive the currently typed text string for analysis of the sequence of letters or other characters.

At block 1210, the haptic smart typing assistance system may analyze and track the ongoing typing activity of the typed text string for context of phrase, for sequence of letters and words, and access text autofill algorithms or text editing and grammar correction algorithms for the language being typed. The haptic smart typing assistance system will determine errors that may occur in the typing of the text string in some embodiments. Those errors may be typographical or grammatical in various embodiments. In other embodiments, the context of the character string typed, or the context of the words typed in a phrase, may be used by text autofill algorithms or text editing and grammar correction algorithms to predict remaining characters of a word being typed if a match occurs with known words within a database of words used. The database of words used may also include likelihood levels of usage in typing in some embodiments. In other embodiments, the database of words may also be associated with phrase contexts in various embodiments of the text autofill algorithms or text editing and grammar correction algorithms used by the haptic smart typing assistance system.

Proceeding to block 1215, the text autofill algorithms and correction algorithms of the haptic smart typing assistance system determine if one or more words match the initial text string of the word being typed. These words provide a guide for anticipated next characters to be typed in the text string.

In other embodiments, the haptic smart typing assistance system may determine if a match of one or more next words in a currently typed text string occurs with the text autofill algorithms or text editing and grammar correction algorithms. In an example embodiment, a text string may include, "The quick brown foc." The text autofill algorithms or text editing and grammar correction algorithms of the haptic smart typing assistance system may determine if a match exists for the text string "foc" at block 1215. In further embodiments, a text string may include, "The quick brown fo_". The text autofill algorithms or text editing and grammar correction algorithms of the haptic smart typing assistance system may search for words that match a beginning of "fo" or may determine from context of the phrase prefix, "The quick brown . . . " whether one or more matching words to fill out "fo_ . . . " exists. Examples may include "fox," "foal," "food" or the like. Depending on context and common usage as a word or in context with the phrase, one or more of these words may be an anticipated word being typed. Plural suggestions of anticipated words are contemplated by the haptic smart typing assistance system. If no match to an anticipated word is made, the method may proceed back to block 1210 to continue monitoring the typed text string until more characters are entered which may provide a better indication of a word being typed. In some embodiments, a typographical or grammatical error may be identified with no match at block 1215 and, as discussed further with respect to FIG. 13 below, a user may be notified by haptic feedback response, visually, or otherwise of the potential typographical or grammatical error.

In other embodiments, such as with the example above, the method may identify one or more matching anticipated words in the typed text string at block 1215, and haptic smart typing assistance system may proceed to block 1220. At block 1220, the haptic smart typing assistance system may determine one or more anticipated next characters from the anticipated next word or words identified by a match at block 1215. In the example embodiments, if the text string includes "The quick brown fo_", the anticipated next words may be "fox" or "foal" where "food" may have been eliminated based on context. At block 1220, the haptic smart typing assistance system may identify one or more anticipated next characters to be typed as "x" or "a" in the example embodiment.

The method may proceed to block 1225, where the haptic smart typing assistance system may determine which letters are nearby the anticipated next character on the haptic keyboard layout. The haptic keyboard layout may be a QWERTY type keyboard in some example embodiments. In determining nearby letters, the haptic smart typing assistance system determines potential haptic keys that may be inadvertently actuated during typing to cause a typographical error. The haptic smart typing assistance system may anticipate potential typographical errors by sending an instruction or a set of parameters to adjust force requirements, sensitivity, or keystrike accuracy for the haptic keys nearby or adjacent to the key associated with the anticipated next character or characters identified at block 1220. This instruction may be sent to the haptic feedback keyboard and touchpad control system and the haptic keyboard controller. The haptic keyboard controller may adjust the force level required to actuate nearby keys in one example embodiment. In another embodiment, haptic keyboard controller may adjust the required location or zone of a keystrike to require a more central keystrike. Keystrike location may be detected on the piezo electric element for the actuated key of via levels of actuation of nearby piezoelectric elements to the piezoelectric element of the actuated key. In yet other embodiments, haptic keyboard controller may adjust the sensitivity of actuation of the nearby haptic keys to the key associated with the anticipated next character according to the instruction from the haptic smart typing assistance system. For example, the level of force required to actuate nearby keys may be increased so that an inadvertent keystroke may not generate enough force of an intentional keystroke to actuate the haptic key and its piezoelectric element and register the keystroke in an embodiment. In another embodiment, the location of a keystrike may be detected by the piezoelectric element the haptic keyboard controller requiring a more direct keystrike so that an inadvertent keystroke may not be direct enough to actuate the haptic key and its piezoelectric element to register the keystroke. Similarly, sensitivity of the nearby keys may be decreased by the haptic keyboard controller so inadvertent keystrokes are not as readily detected.

In the example embodiment where the anticipated next characters may be an "x", the keys for letters "z," "s," "d", and "c" may be modified to require increased force, a more direct keystrike, or have reduced sensitivity in embodiments herein. These keys may have their haptic operation modified since "foz_", "fos_", "fod_", and "foc_" may be unlikely anticipated next characters or the anticipated word being typed. From context, a word like "focus" or "foster" or others may have low probability of being the typed word, thus the haptic smart typing assistance system may instruct the haptic keyboard controller to modify operation of those keys. The haptic key associated with the character "a", however, may not have increased actuation force, require a more direct keystrike, or have reduced sensitivity in the example embodiment. This may be the case since the "a" character is a possible anticipated next character for the anticipated typed word "foal." Other haptic keys around the key for "a", such as "q" and "w" may have increased actuation force, more direct keystrike, or lower sensitivity according to the embodiments herein as well.

Proceeding to block 1230, the haptic keyboard controller may detect a first key actuation which corresponds to the next keystroke in the string of typed characters represented by the space (_) in "The quick brown fo_". The next character may be an "x", an "a", or another character not anticipated. The received first key actuation (of the next character _) may be forwarded to the haptic smart typing assistance system. The haptic smart typing assistance system may determine at block 1235 whether the actuated first key for the next character matches an anticipated next character. If it does, the method may proceed to block 1240.

At block 1240, the haptic keyboard controller may register the keystroke pursuant to instructions from the haptic smart typing assistance system or the word processing program or other software program. The haptic keyboard controller may also provide a regular haptic feedback indicating a normal keystroke has occurred. For example, a first type of haptic feedback may be provided by the haptic keyboard controller to indicate an actuation of the key was not in disagreement with an anticipated next character by the haptic smart typing assistance system. In an example embodiment, the first type of haptic feedback may mimic a mechanical keystroke when an expected key is actuated for an anticipated next character.

The method may proceed to block 1280 to determine if the typing has ended. Indications may include examples such as whether the software program receiving typing input has been shut down, the information handling system has been shut down, or the user has moved on to another task.

If typing has ended, the flow may end. If typing has not ended, the method may return to block 1205 for the haptic smart typing assistance system to continue receiving text input and analyzing the typed text string. Upon returning to block 1205, the method may proceed as described above.

Returning to block 1235, if the haptic smart typing assistance system determines that the actuated first key for the next character does not match an anticipated next character, the method may proceed to block 1245. At block 1245, the haptic keyboard controller may send a haptic feedback control signal to the piezoelectric element for the actuated key so that it generates a second or different type of haptic feedback. The second type of haptic feedback may be a haptic tactile feedback that indicates that key selected is associated with a character that was not an anticipated next character. Example feedback may include a buzz, one or more clicks in the mimicked mechanical actuation feedback, or similar haptic tactile feedback indicating a potential error and that a selected character that was not anticipated. For example, if a key for the letter "c" was actuated instead of a key for an "x" or an "a".

The method may proceed to block 1250 where the haptic smart typing assistance system may display a corrected word that was the anticipated typed word. The display may occur in the word processing or other software that is receiving typed text in some embodiments. In other embodiments, the suggested correction may be displayed via a graphical user interface of the haptic smart typing assistance system. The method may proceed to block 1255 where the user has been suggested a next letter by the display of the corrected or anticipated word to be typed via the haptic smart typing assistance system. At block 1255, the user may actuate another key. For example, in the embodiment described, if the initial actuation was of a haptic key for the letter "c" and the haptic key for the character "c" was provided a second type of haptic feedback indicating a non-agreement with the anticipated next character and a possible error, the user may then actuate a next haptic key.

With this next key actuation, the haptic smart typing assistance system may proceed to 1260 to determine whether the next actuated key matches the anticipated next character previously identified. In some embodiments, the next actuated key may cause the haptic smart typing assistance system to determine a new anticipated next character, if another character is applicable. In an example embodiment, the haptic smart typing assistance system may determine to see if the next haptic key actuated is associated with the letter "x" or an "a" or another new anticipated next character such as an "l" for "foal."

If the next key actuation does not match a next anticipated character at 1260, flow may return to block 1245 to further indicate a potential error with haptic feedback to the second actuated key. The haptic smart typing assistance system at some point may determine after consecutive non-matching characters are typed and detected at blocks 1255 and 1260, that the user intends to write an unknown word. In such a circumstance, the method returns to block 1205 instead of block 1245. Returning to block 1205, the haptic smart typing assistance system may continue to monitor future text strings typed as input by the haptic keyboard.

If, however, the next key actuation does match a next anticipated character at 1260, method may proceed to block 1265 to generate a first type of haptic feedback to the next key actuated to indicate a normal or correct keystroke has occurred in agreement with the anticipated next character. For example, if the next key actuated at block 1255 is the haptic key associated with "x" or "a", the haptic keyboard controller will provide a normal keystroke haptic response indicating a key has been selected in agreement with the anticipated next character.

In some optional embodiments, the actuated key at block 1255 does match a next anticipated character at 1260, the method may also utilize extended action function of the haptic keys at block 1270. At block 1270, the haptic smart typing assistance system may detect a deep press above a threshold force level on the next key actuated at block 1255. If no deep press of the next actuated "correct" key that was matched at block 1260 occurs at block 1270, then flow may proceed to block 1280. No deep press detected at block 1270 may mean no intention to correct the error is meant or that the deep press functionality was not used or available.

If a deep press is detected at block 1270, this may indicate an intention to correct the error of the first key actuation. The method may proceed to block 1275. At block 1275, an extended action key function of the haptic smart typing assistance system may be executed. In one embodiment, the haptic smart typing assistance system may implement a correction of the mistyped character of the first key actuation from block 1230 and replace the character with the matching anticipated next character actuated by the next key actuation at block 1255. This extended action function may permit the user to correct the error without backspacing, deleting, or using a mouse with the haptic smart typing assistance system of embodiments herein.

In the example embodiment, the selection of an "x" with a deep press on an "x" haptic key may replace the errantly selected character "c" with an "x" without having to delete, backspace, use a mouse, or perform another action. In a further embodiment at block 1275, the haptic smart typing assistance system may implement an extended action key function to select and utilize the remainder of the anticipated word suggested by the haptic smart typing assistance system. The deep press may be a single deep press force threshold level or may require a deeper press than a first level which may be used to just to replace the errantly typed letter with a corrected letter in various embodiments. In one example embodiment, the deep press selection of a character "a" at a haptic key may replace the errantly selected character "c" with not only the character "a" but also the remainder of the anticipated word being typed "-al" of "foal." In another embodiment, a first level of deep press may replace the errant "c" with the letter "a" without requiring backspacing or deleting, while a second level of deep press may select the remainder of the word "foal." Upon execution of the extended action key function via the deep press of the next actuated key for the "correct" character, flow may proceed to block 1280.

At block 1280, the method may determine if the typing has ended. Indications of whether the typing has ended may include examples such as whether the software program receiving typing input has been shut down, the information handling system has been shut down, or the user has moved on to another task. If typing has ended, the flow may end. If typing has not ended, the method may return to block 1205 for the haptic smart typing assistance system to continue receiving text input. Upon returning to block 1205, the haptic smart typing assistance system may continue to monitor and analyze typed text strings and proceed as described above with respect to the embodiments of FIG. 12.

Figure 13:
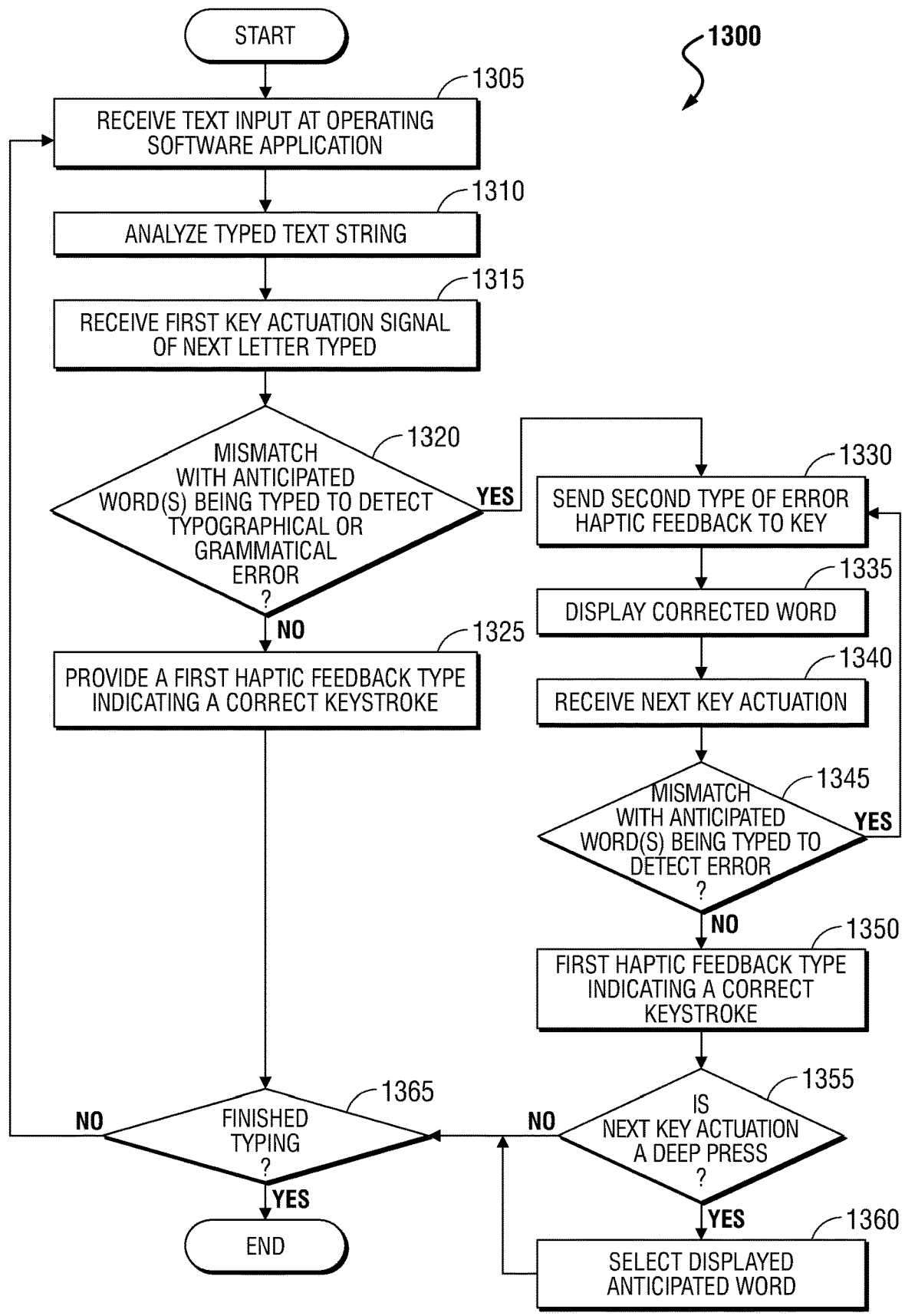
FIG. 13 is a flow diagram illustrating a method of operating a keyboard with haptic smart typing assistance system of an information handling system according to another embodiment of the present disclosure; and The use of the same reference symbols in different drawings may indicate similar or identical items.

FIG. 13 is a flow diagram illustrating a method of operating a haptic keyboard and a haptic smart typing assistance system of an information handling system according to an embodiment of the present disclosure. The method may begin at block 1305, where upon typing characters into an application software operating on the information handling system, the haptic smart typing assistance system may track the typing that occurs at the application software. As described, typing may be received into any software application accepting typed input. For example, a user may be typing in a word processing software, in an email editing software, in a text editor software, on a web based application, inputting programming languages, conducting textual portions of a graphics program, filling in forms or form entries, or conducting other typing activity via the information handling system and the haptic keyboard of embodiments herein. The haptic smart typing assistance system may receive the currently typed text string for analysis of the sequence of letters or other characters.

At block 1310, the haptic smart typing assistance system may analyze and track the ongoing typing activity of the typed text string for context of a phrase, for sequence of letters and words and other patterns. The haptic smart typing assistance system may utilize one or more text autofill algorithms or text editing and grammar correction algorithms for the language being typed. The haptic smart typing assistance system will determine errors that may occur in the typing of the text string that may be typographical or grammatical errors in some embodiments. In other embodiments, the context of the character string typed, or the context of the words typed in a phrase, may be used by text autofill algorithms or text editing and grammar correction algorithms to predict remaining characters of a word being typed if a match occurs with known words within a database of words used. The database of words used may also include likelihood levels of usage in typing in some embodiments. Additionally, the database of words may relate the words to phrase contexts in various embodiments of the text autofill algorithms or text editing and grammar correction algorithms that are used by the haptic smart typing assistance system in some embodiments.

Proceeding to block 1315, the haptic keyboard controller may detect a first key actuation which corresponds to the next keystroke in the string of typed characters. As described, the haptic smart typing assistance system may monitor the string of typed characters with the text autofill algorithms or text editing and grammar correction algorithms. The haptic smart typing assistance system may then determine one or more anticipated next words which may include an anticipated next character in some embodiments. For example, as a typed text string develops, the haptic smart typing assistance system may determine one or more anticipated words are being typed. In an example embodiment, the text string typed may be "The quick brown fo_" where the typed actuation of the next key (the first key actuation) is to fill the space (_). As with previous examples, in "The quick brown fo_", the next character may be an "x", an "a", or another character. The received first key actuation of the next character typed may be forwarded to the haptic smart typing assistance system at block 1320.

The haptic smart typing assistance system may determine at block 1320 whether the actuated first key for the next character matches or mismatches an anticipated next character or the anticipated word being typed. If a mismatch exists, the method may proceed to block 1330. If the word matches an anticipated next character or word, such as an "x" is actuated and the word "fox" is a match to the anticipated word being typed, the method may proceed to block 1325.

At block 1325, the haptic keyboard controller, pursuant to instructions from the haptic smart typing assistance system or the word processing program or other software program, may register the keystroke. The haptic controller may also provide a regular haptic feedback to the actuated key indicating a normal keystroke has occurred. For example, a first type of haptic feedback may be provided by the haptic keyboard controller to indicate a normal actuation of the key that is not in disagreement with the anticipated word being typed. In an example embodiment, the first type of haptic feedback may mimic a mechanical keystroke when an expected key is actuated for an anticipated next character.

The method may proceed to block 1365 to determine if the typing has ended. For example, the typing may have ended with indications such as whether the software program receiving typing input has been shut down, the information handling system has been shut down, or the user has moved on to another task. If typing has ended, the flow may end. If typing has not ended, the method may return to block 1305 for the haptic smart typing assistance system to continue receiving text input and analyzing the typed text string and proceed as described with respect to the embodiment of FIG. 13 herein.

Returning to block 1320, if the haptic smart typing assistance system determines that the actuated first key for the next character does not match an anticipated next character or the word does not match the anticipated word being typed, the method may proceed to block 1330. At block 1330, the haptic keyboard controller may send a haptic feedback control signal to the piezoelectric element for the actuated key that is generates a second or different type of haptic feedback at the actuated key. The second type of haptic feedback may be a haptic tactile feedback that indicates that key was suggested with a character that was not an anticipated next character. Example feedback may include a buzz, one or more clicks in the mimicked mechanical actuation feedback, or similar haptic tactile feedback indicating a potential error and that the selected character was not anticipated by the haptic smart typing assistance system.

For example, if a key for the letter "c" was actuated instead of an "x" or an "a". In such an example embodiment, the text autofill algorithms and correction algorithms of the haptic smart typing assistance system determine if one or more words anticipated match the word being typed. These words provide a guide for anticipated next letters to be typed in the text string. In an example embodiment, a text string may include, "The quick brown foc." The text autofill algorithms or text editing and grammar correction algorithms of the haptic smart typing assistance system may determine if a match exists for the text string "foc" at block 1320. If it does not, the text autofill algorithms or text editing and grammar correction algorithms of the haptic smart typing assistance may search for words that match a beginning of "fo" in an embodiment. Further, the haptic smart typing assistance system may determine from context of the phrase prefix, "The quick brown . . . " whether one or more matching words to fill out "fo_ . . . " exists in some embodiments. Examples may include "fox," "foal," "food" or the like. Depending on context and common usage as a word or in context with the phrase, one or more of these words may be an anticipated word being typed. Plural suggested or expected words are contemplated by the haptic smart typing assistance system. In some embodiments, a typographical or grammatical error may be identified with no match at block 1320 and, as discussed, the second type of haptic feedback may be provided at block 1330. The second type of haptic feedback may indicate a typographical or grammatical error to the user via haptic feedback at the actuated first key which was detected at block 1315. In such a way, the user may be notified by haptic tactile feedback response. The user may also be notified visually, by sound, or otherwise of the potential typographical or grammatical error.

The method may proceed to block 1335 where the haptic smart typing assistance system may display the corrected word that was the anticipated word to be typed. The display may occur in the word processing or other software that is receiving typed text in some embodiments. In other embodiments, the corrected word may be displayed in a graphical user interface of the haptic smart typing assistance system. For example, the haptic smart typing assistance system may display "fox" or "foal" as options for a correct word in place of "foc" in the examples above. The method may proceed to block 1340 where the user has been suggested a next letter via the display of the corrected or anticipated word to be typed. At block 1340, the user may actuate another key for a next key actuation. In the presently described example, this would be the second key actuation. For example, in the embodiment described, if the initial actuation was of a haptic key for the letter "c" and the haptic key for the character "c" was provided a second type of haptic feedback indicating a non-agreement with the anticipated next character and a possible error, the user may then actuate a next haptic key.

With this next key actuation, the haptic smart typing assistance system may proceed to 1345 to determine whether the next key matches the anticipated next character previously identified, or a new anticipated next character if applicable. The anticipated next character is selected by the haptic smart typing assistance system to meet one or more of the anticipated typed words expected in the received typed character string. In the example embodiment, the haptic smart typing assistance system may determine to see if the next haptic key actuated is associated with the letter "x" or "a" for the words "fox" or "foal" or another newly identified anticipated next character, such as "l" for the anticipated word to be typed as "foal".

If the next key actuation does not match a next anticipated character at 1345, flow may return to block 1330 to further indicate a potential error is detected with a second type of haptic feedback to the actuated key. However, at some point the haptic smart typing assistance system may determine that the user intends to write an unknown word. In such a circumstance, the haptic smart typing assistance system may return to block 1305, instead of block 1330, to monitor future text strings typed as input by the haptic keyboard.

If, however, the next key actuation does match a next anticipated character at 1345, the method may proceed to block 1350 to generate a first type of haptic feedback to the next key actuated to indicate a normal or correct keystroke has occurred. The first type of haptic feedback indicates that the selected key and character are in agreement with the anticipated word being typed. For example, if the next key actuated at block 1340 is the haptic key associated with "x" or "a", the haptic keyboard controller will provide a normal keystroke haptic response indicating a key has been selected in agreement with either of the anticipated words being typed as determined by the haptic smart typing assistance system.

In some optional embodiments, where the actuated key at block 1340 does match a next anticipated character of the anticipated word being typed at block 1345, the method may proceed to block 1355. At block 1355, the method may also utilize extended action function of the haptic keys of the haptic keyboard according to embodiments herein. At block 1355, the haptic smart typing assistance system may detect a deep press above a threshold force level on the key actuated at block 1340.

If no deep press of the next actuated "correct" key occurs at block 1355, then flow may proceed to block 1365. No deep press detected at block 1355 may mean no intention to correct the error is meant, or that the deep press functionality was not used or was not available.

If a deep press is detected at block 1355, this may indicate an intention to correct the error of the first key actuation of block 1315. The method may proceed to block 1360. At block 1360, an extended action key function of the haptic smart typing assistance system may be executed. In one embodiment, the haptic smart typing assistance system may implement a correction of the mistyped character of the first key actuation at block 1315 and replace the character with the matching anticipated next character actuated by the corrected next key actuation at block 1340. This haptic smart typing assistance system extended action function may permit the user to correct the error without backspacing, deleting, or using a mouse. In the example embodiment, the selection of an "x" with a deep press may replace the errantly selected character "c" with the "x" without having to delete, backspace, use a mouse or perform another action. In a further embodiment at block 1360, the haptic smart typing assistance system may implement an extended action key function to select and utilize the suggestion of the anticipated word by the haptic smart typing assistance system. For example, the word "foc" may be replaced with "fox." The deep press may be a single deep press force threshold level or may require a deeper press. With a deeper press, the haptic smart typing assistance system may do more than just to replace the errantly typed letter with a corrected letter in various embodiments. In the example embodiment, the deep press selection of a character "a" at a haptic key may replace the errantly selected letter "c" forming the typographical error word "foc" with not only the character "a" but the suggested corrected word "foal." In another embodiment, a first level of deep press may replace the errant "c" with the corrected letter without requiring backspacing or deleting, and a second level of deep press may select from among a list of corrected words such as "fox" and "foal." Upon execution of the extended action key function via the deep press of the next actuated key for the corrected word or character, flow may proceed to block 1365.

At block 1365, the method may determine if the typing has ended such as whether the software program receiving typing input has been shut down, the information handling system has been shut down, or the user has moved on to another task. If typing has ended, the flow may end. If typing has not ended, the method may return to block 1305 for the haptic smart typing assistance system to continue receiving text input and analyzing the typed text string and proceed as described above with respect to the embodiments of FIG. 13.

The blocks of the flow diagrams of FIGS. 11, 12, and 13 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another may communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A haptic keyboard of an information handling system, comprising:
    a coversheet to identify keys of the haptic keyboard;
    a support layer;
    a contact foil placed between the coversheet and support layer;
    a piezoelectric element placed between the contact foil and support layer to receive an applied mechanical stress at a first key of the coversheet, and to generate a haptic feedback signal from the piezoelectric element on the contact foil;
    a processor to register a letter associated with the first key;
    the processor executing instructions of a haptic smart typing assistance system to detect and anticipate an anticipated next letter of a word being typed in a software application; and
    a controller of the information handling system operatively coupled to the contact foil to receive an instruction from the haptic smart typing assistance system of the anticipated next letter and increasing force required to actuate at least one adjacent key adjacent to the key for the anticipated next letter on the haptic keyboard.

2. The keyboard of claim 1, wherein the haptic feedback signal from the piezoelectric element generates a first haptic feedback if the first key actuated is of the anticipated next letter.

3. The keyboard of claim 2, wherein the haptic feedback signal from the piezoelectric element generates a second haptic feedback if the first key actuated is not of the anticipated next letter to indicate error.

4. The keyboard of claim 1 further comprising:
    the first key is an extended action key having a plurality of function levels and is configured to receive a hard press of the first key to select a remaining set of suggested letters of an anticipated word being typed if the first key actuated is associated with the anticipated next letter.

5. The keyboard of claim 1 further comprising:
    the first key is an extended action key having a plurality of function levels and is configured to receive a hard press of the first key to select an anticipated next word in a phrase being typed anticipated by the haptic smart typing assistance system when the first key actuated is of the first letter of the anticipated next word, wherein the haptic smart typing assistance system anticipates the anticipated next word in a phrase.

6. The keyboard of claim 1, wherein the anticipated next letter is one of a plurality of anticipated next letters of a plurality of anticipated typed words determined by the haptic smart typing assistance system.

7. The keyboard of claim 1 further comprising:
    the first key is an extended action key having a plurality of function levels and is configured to receive a hard press of the first key to select among a plurality of an anticipated next words being typed anticipated by the haptic smart typing assistance system when the first key actuated is one of a plurality anticipated next letters.

8. The keyboard of claim 1, wherein receiving the instruction from a haptic smart typing assistance system of the anticipated next letter includes an instruction to increase force required to actuate a plurality of nearby keys for letters surrounding the anticipated next letter on the haptic keyboard.

9. A haptic keyboard of an information handling system comprising:
    a coversheet to identify keys of the haptic keyboard;
    a support layer;
    a contact foil placed between the coversheet and support layer;
    a piezoelectric element placed between the contact foil and support layer configured to receive an applied mechanical stress at a first key of the coversheet as a first key actuation and to generate a first haptic feedback signal;
    a processor executing instructions of a haptic smart typing assistance system to detect a typographical error of a word being typed in a software application;
    a controller of the information handling system operatively coupled to the contact foil and configured to register the actuation of a second key;
    a processor to register a letter associated with the second key; and
    the controller to receive an instruction from the haptic smart typing assistance system when the detected typographical error has occurred at actuation of the second key and configured to send a second response haptic feedback signal to the piezoelectric element to cause the piezoelectric element to generate a second, error haptic feedback at the second key when the typographical error has occurred.

10. The keyboard of claim 9, wherein the controller sends the first haptic feedback control signal to the piezoelectric element to cause the piezoelectric element to generate a first haptic feedback at the second key when no detected typographical error has occurred in the typed letter.

11. The keyboard of claim 9, wherein the haptic smart typing assistance system is configured to detect a grammatical error of the word being typed in the software application and the controller generating a third haptic feedback signal to generate a third, error haptic feedback at the second key when the grammatical error has occurred.

12. The keyboard of claim 9, wherein the haptic smart typing assistance system is configured to detect a grammatical error of the word being typed in the software application and the controller generating the second haptic feedback signal to generate the second, error haptic feedback at the second key when the grammatical error has occurred.

13. The keyboard of claim 9, wherein a plurality of the keys of the haptic keyboard are extended action keys having a plurality of function levels and a hard press of the second key for a letter is configured to select to correct the typographical error and generates a third haptic feedback at the second key indicating correction of the typographical error has occurred with the typed letter.

14. The keyboard of claim 9, wherein a plurality of the keys of the haptic keyboard are extended action keys having a plurality of function levels and a hard press of a third key that is a correct, anticipated next letter of the typed word selects remaining suggested letters of an anticipated word being typed.

15. The keyboard of claim 9, wherein a plurality of the keys of the haptic keyboard are extended action keys having a plurality of function levels and a hard press of a third key that is a correct, anticipated next letter of an anticipated typed word is configured to correct the typographical error of the actuation of the second key that generated the typographical error.

16. A haptic keyboard of an information handling system, comprising:
- a coversheet to identify keys of the haptic keyboard;
- a support layer;
- a contact foil placed between the coversheet and support layer;
- a piezoelectric element placed between the contact foil and support layer to receive an applied mechanical stress at a first key of the coversheet as an actuation of the first key;
- a processor to register a letter associated with actuation of the first key;
- the processor executing instructions of a haptic smart typing assistance system to detect and anticipate a next letter of a word being typed in a software application and to detect a typographical error of a word being typed in a software application;
- a controller of the information handling system operatively coupled to the contact foil to receive an instruction from the haptic smart typing assistance system of the anticipated next letter and increasing force required actuate at least one key for a letter adjacent to the anticipated next letter on the haptic keyboard; and
- the controller to generate a response haptic feedback signal to the piezoelectric element to cause the piezoelectric element to first generate haptic feedback at the first key when the anticipated next letter of the word being typed is correctly selected with actuation of the first key, and to generate a second haptic feedback that is an error haptic feedback when the typographical error is detected with actuation of the first key.

17. The haptic keyboard of claim 16, further comprising:
a plurality of keys of the haptic keyboard are extended action keys where a hard press of the first key selects the remaining letters of an anticipated word being typed if the first key correctly represents the next anticipated letter of the word being typed.

18. The haptic keyboard of claim 16, further comprising:
a plurality of keys of the haptic keyboard are extended action keys where a hard press of a second key corrects the typographical error of an anticipated word being typed when actuation of the second key represents the next anticipated letter after actuation of the first key generated the typographical error.

19. The haptic keyboard of claim 16, further comprising:
a plurality of keys of the haptic keyboard are extended action keys where a hard press of the first key selects a letter that is not the next anticipated letter when the typographical error is detected with actuation of the first key, where the hard press is configured to overcome the increased force required to actuate keys for the plurality of letters surrounding the anticipated next letter.

20. The haptic keyboard of claim 16, further comprising:
a second key is actuated that is the next anticipated letter of an anticipated word being typed when the typographical error is detected with actuation of the first key;
a third key is actuated that is another anticipated letter of the anticipated word being typed; and
a plurality of keys of the haptic keyboard are extended action keys where a hard press of the third key corrects the typographical error of the anticipated word being typed.

* * * * *